(12) United States Patent
Lin et al.

(10) Patent No.: US 10,643,993 B2
(45) Date of Patent: May 5, 2020

(54) COMPOUND SEMICONDUCTOR MONOLITHIC INTEGRATED CIRCUIT DEVICE WITH TRANSISTORS AND DIODES

(71) Applicant: WIN Semiconductors Corp., Tao Yuan (TW)

(72) Inventors: Hsi-Tsung Lin, Tao Yuan (TW); Yan-Cheng Lin, Tao Yuan (TW); Sheng-Hsien Liu, Tao Yuan (TW)

(73) Assignee: Win Semiconductors Corp., Guishan District, Tao Yuan (TW)

( * ) Notice: Subject to any disclaimer, the term of this patent is extended or adjusted under 35 U.S.C. 154(b) by 0 days.

(21) Appl. No.: 16/291,572

(22) Filed: Mar. 4, 2019

(65) Prior Publication Data

US 2020/0013774 A1    Jan. 9, 2020

(30) Foreign Application Priority Data

Jul. 4, 2018 (TW) .............................. 107123181 A

(51) Int. Cl.
| | |
|---|---|
| *H01L 27/07* | (2006.01) |
| *H01L 29/872* | (2006.01) |
| *H01L 29/778* | (2006.01) |
| *H01L 29/20* | (2006.01) |
| *H01L 29/868* | (2006.01) |

(52) U.S. Cl.
CPC .......... *H01L 27/0727* (2013.01); *H01L 29/20* (2013.01); *H01L 29/778* (2013.01); *H01L 29/868* (2013.01); *H01L 29/872* (2013.01)

(58) Field of Classification Search
CPC ......... H01L 29/66431; H01L 29/66462; H01L 29/778–7789; H01L 2924/13064; H01L 29/20; H01L 29/2003; H01L 29/201; H01L 29/205; H01L 21/0254; H01L 21/8252; H01L 21/8258; H01L 27/0605; H01L 27/0727; H01L 27/0629;
(Continued)

(56) References Cited

U.S. PATENT DOCUMENTS

| | | | |
|---|---|---|---|
| 7,989,277 B1* | 8/2011 | Luh | ..................... H01L 21/8252 |
| | | | 257/E21.047 |
| 2001/0016377 A1* | 8/2001 | Mizutani | ............. H01L 21/8252 |
| | | | 438/167 |

(Continued)

*Primary Examiner* — Younes Boulghassoul
(74) *Attorney, Agent, or Firm* — Muncy, Geissler, Olds & Lowe, P.C.

(57) ABSTRACT

A compound semiconductor monolithically integrated circuit device with transistors and diodes comprises a compound semiconductor substrate, a transistor epitaxial structure, a transistor upper structure, a first diode, and a second diode. The transistor epitaxial structure forms on the compound semiconductor substrate. The first diode, the second diode, and the transistor upper structure form on a first part, a second part, and a third part of the transistor epitaxial structure, respectively. The transistor upper structure and the third part of the transistor epitaxial structure form a transistor. The first diode comprises a first part of an n-type doped epitaxial layer, a first part of a first intrinsic epitaxial layer, a first electrode, and a second electrode. The second diode comprises a second part of the n-type doped epitaxial layer, a second part of the first intrinsic epitaxial layer, a first electrode, and a second electrode.

25 Claims, 27 Drawing Sheets

(58) Field of Classification Search
CPC .......................... H01L 29/6609–66159; H01L 29/66204–66219; H01L 29/861–885; H01L 27/0255

See application file for complete search history.

(56) References Cited

U.S. PATENT DOCUMENTS

| | | | |
|---|---|---|---|
| 2010/0019279 A1* | 1/2010 | Chen | H01L 27/0605 257/194 |
| 2015/0028391 A1* | 1/2015 | Takahashi | H01L 29/205 257/195 |
| 2015/0155273 A1* | 6/2015 | Nakajima | H01L 29/41725 257/76 |
| 2016/0181240 A1* | 6/2016 | Mauder | H01L 27/0629 257/77 |
| 2017/0005086 A1* | 1/2017 | Twynam | H01L 29/872 |
| 2017/0271327 A1* | 9/2017 | Jiang | H01L 21/8236 |
| 2017/0358495 A1* | 12/2017 | Jiang | H01L 29/0684 |
| 2018/0350933 A1* | 12/2018 | Huang | H01L 27/0883 |
| 2019/0393210 A1* | 12/2019 | Then | H01L 21/26586 |
| 2020/0006322 A1* | 1/2020 | Then | H01L 27/0629 |

* cited by examiner

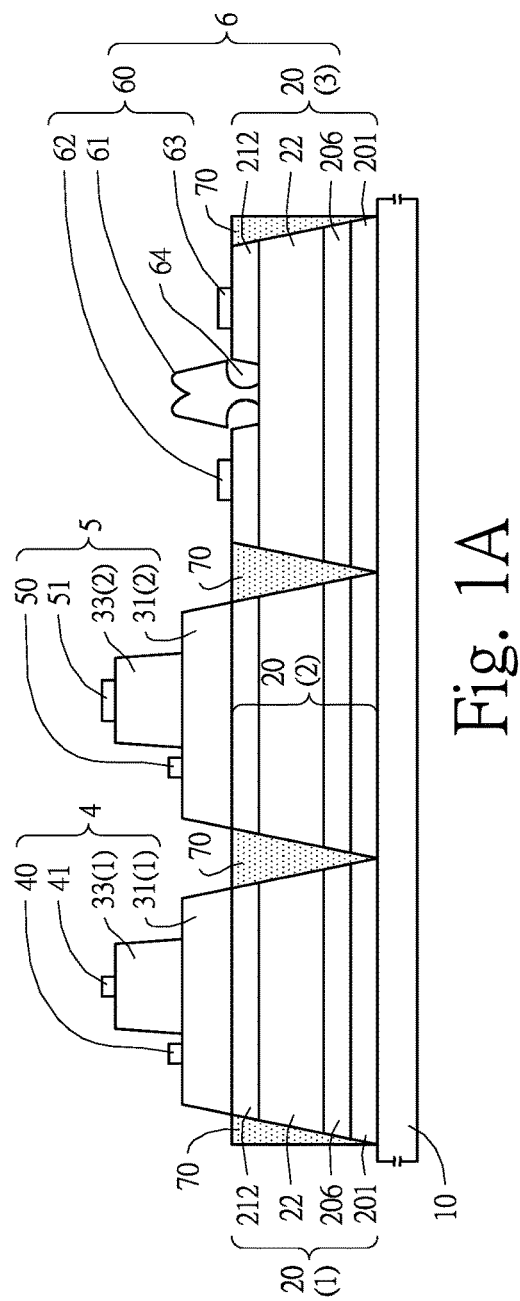
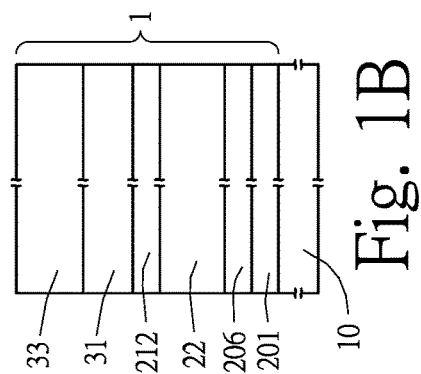
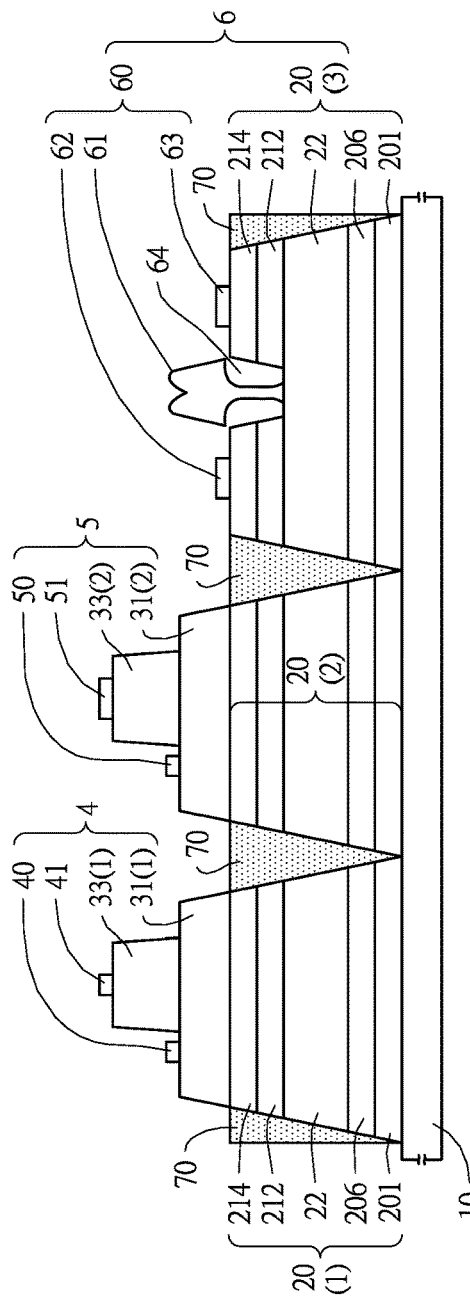
Fig. 1A
Fig. 1B
Fig. 1C

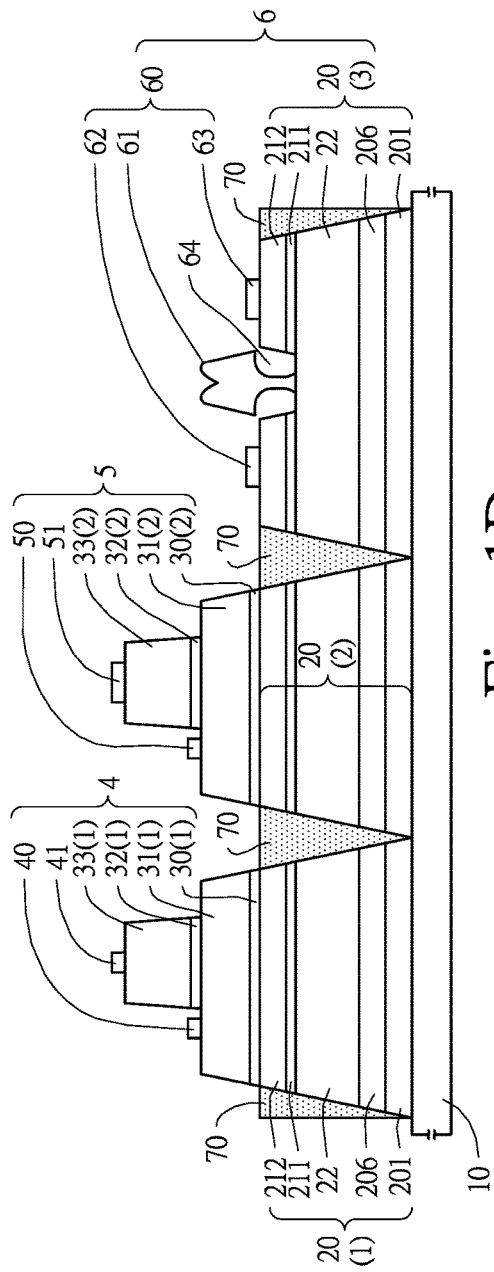
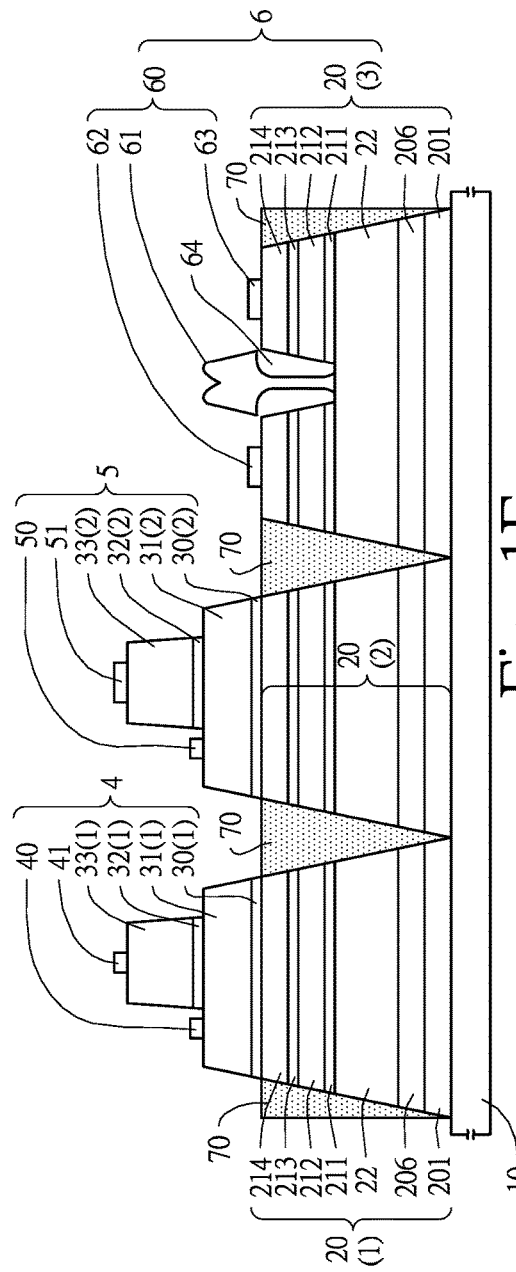
Fig. 1D
Fig. 1E

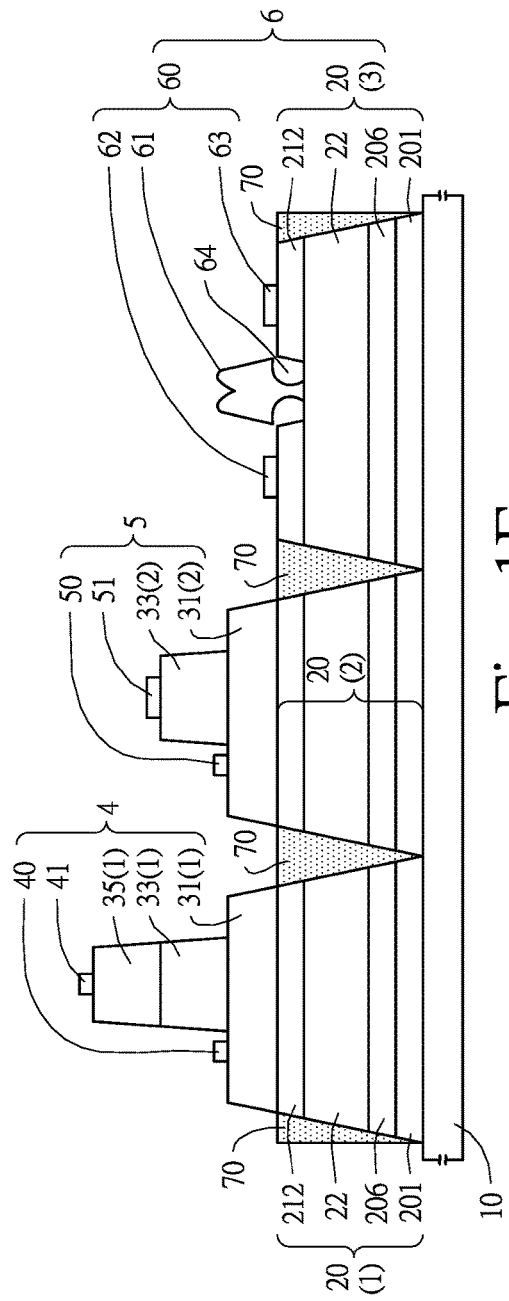
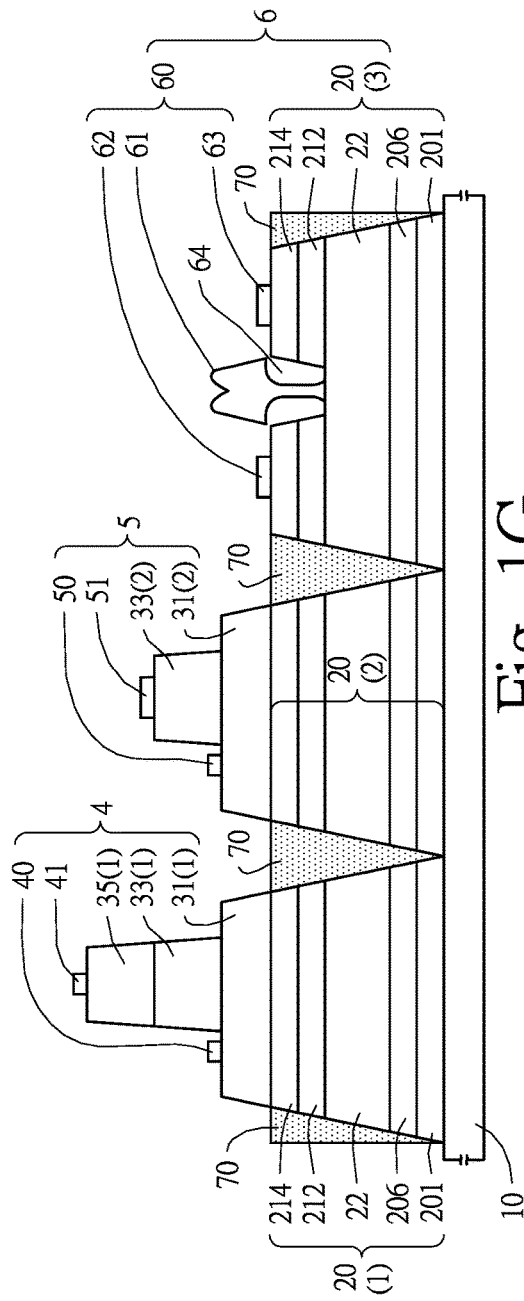
Fig. 1F
Fig. 1G

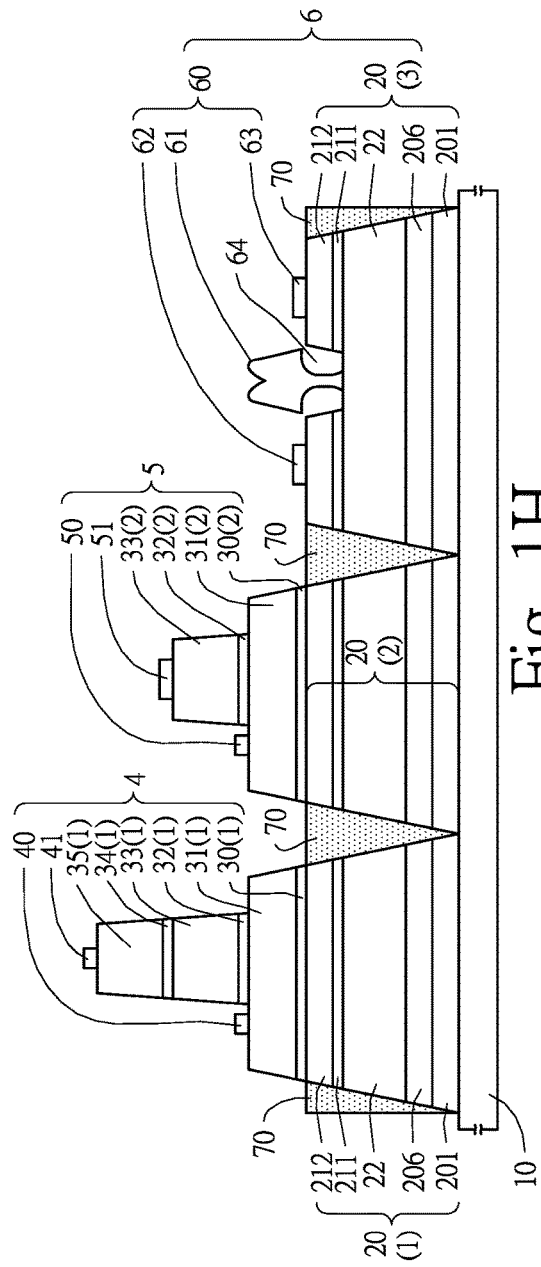
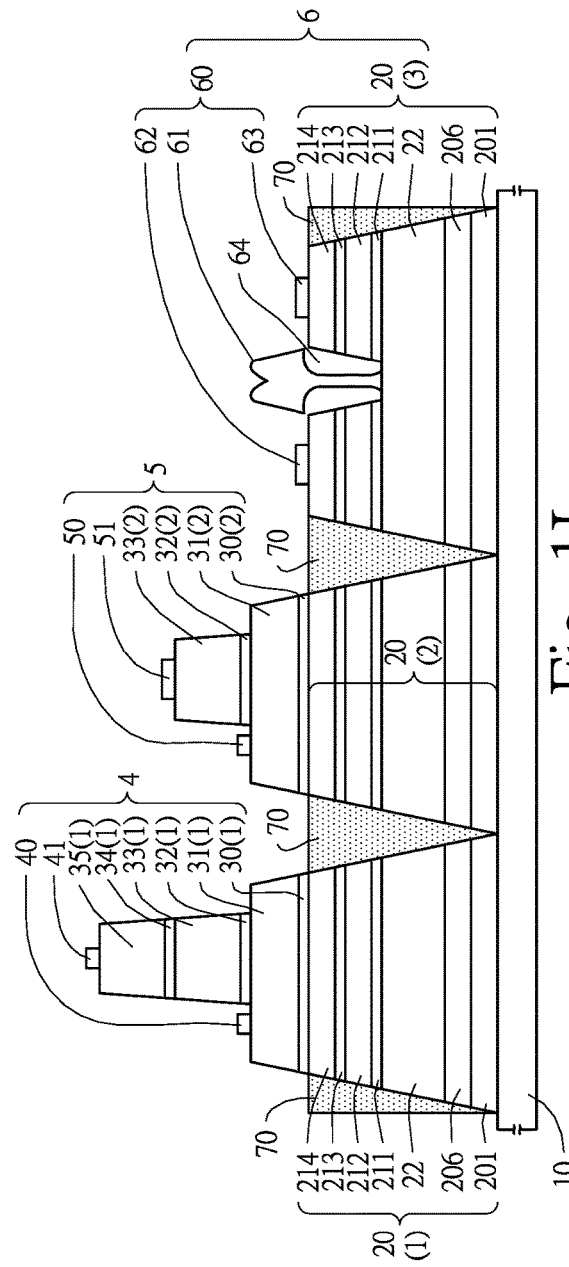

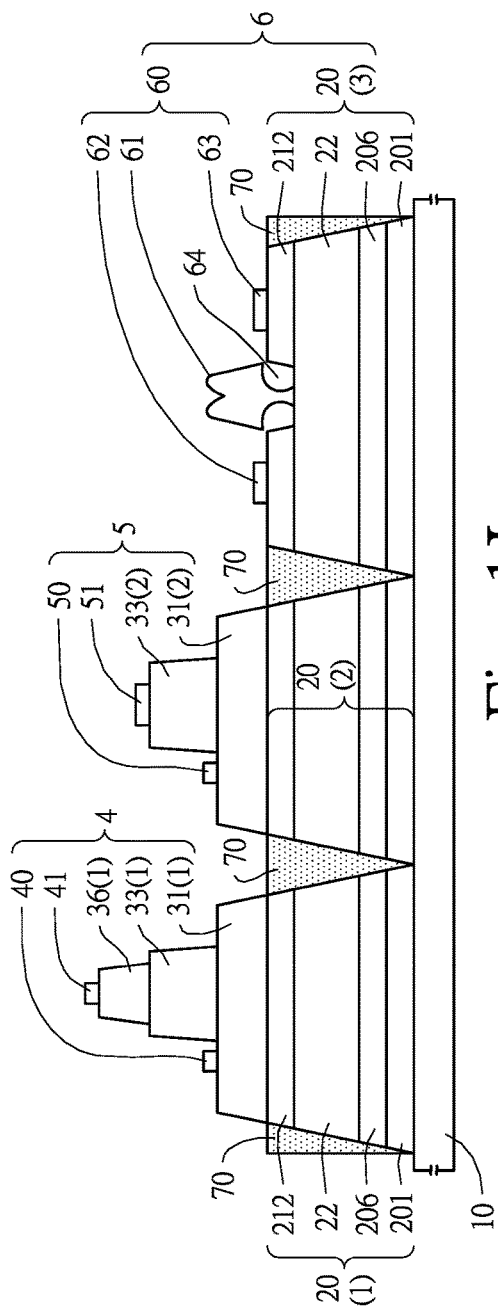
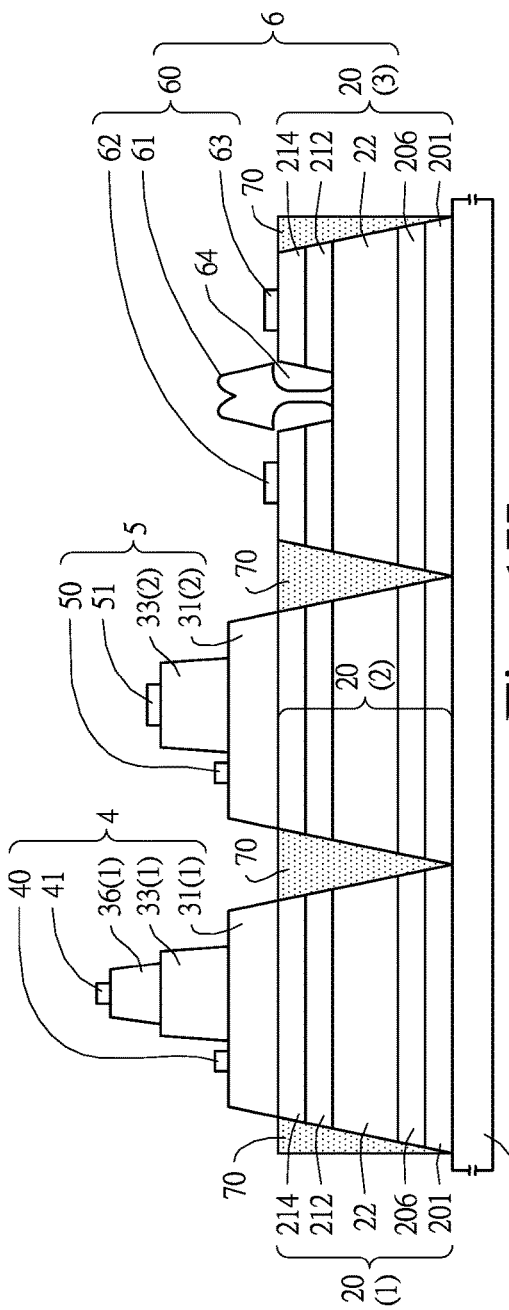

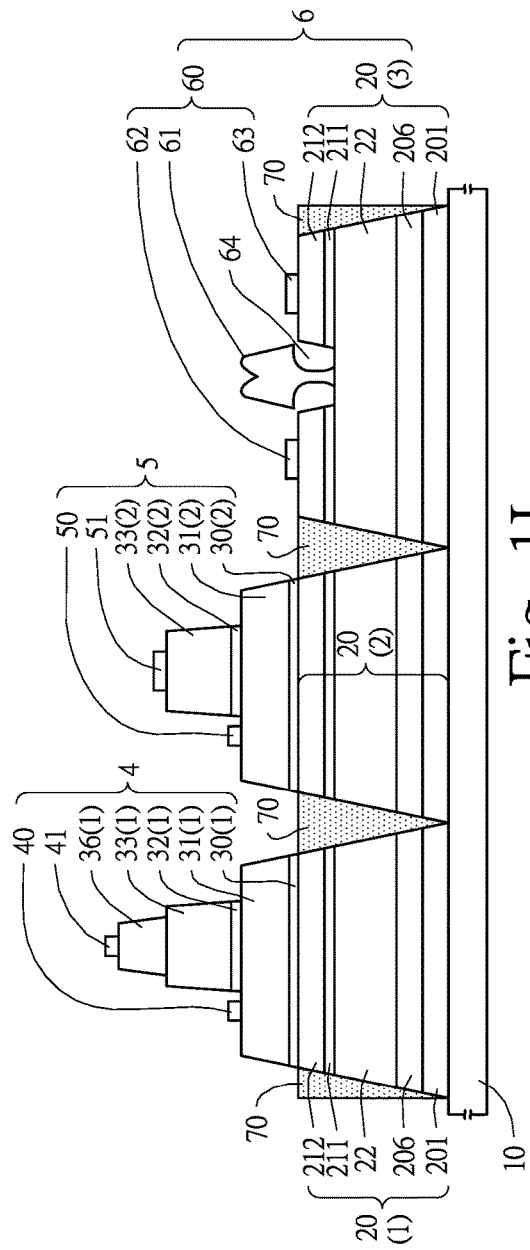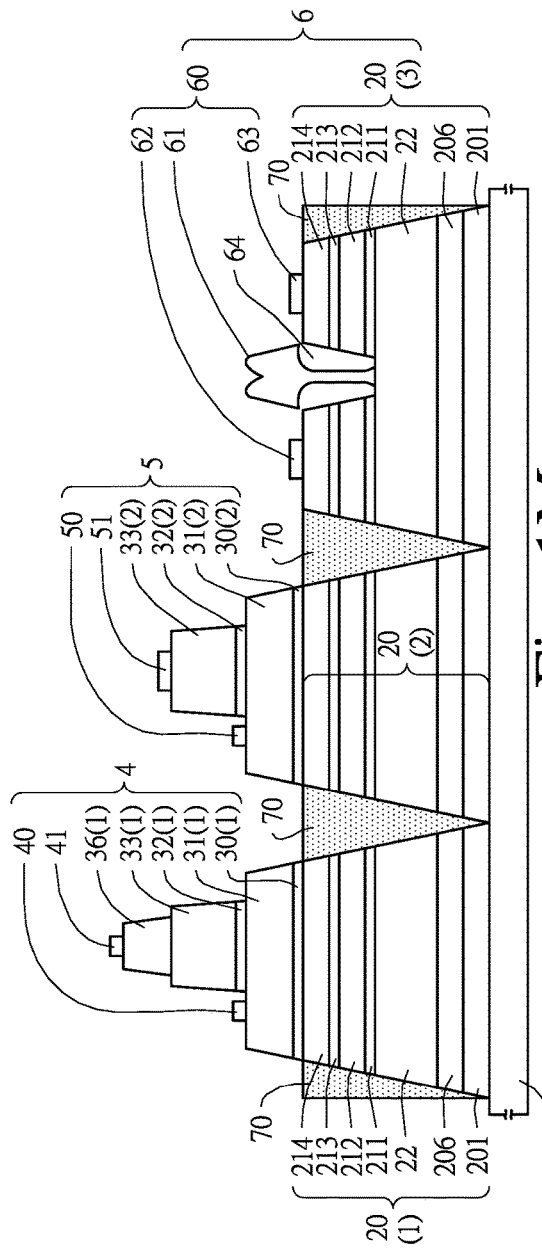

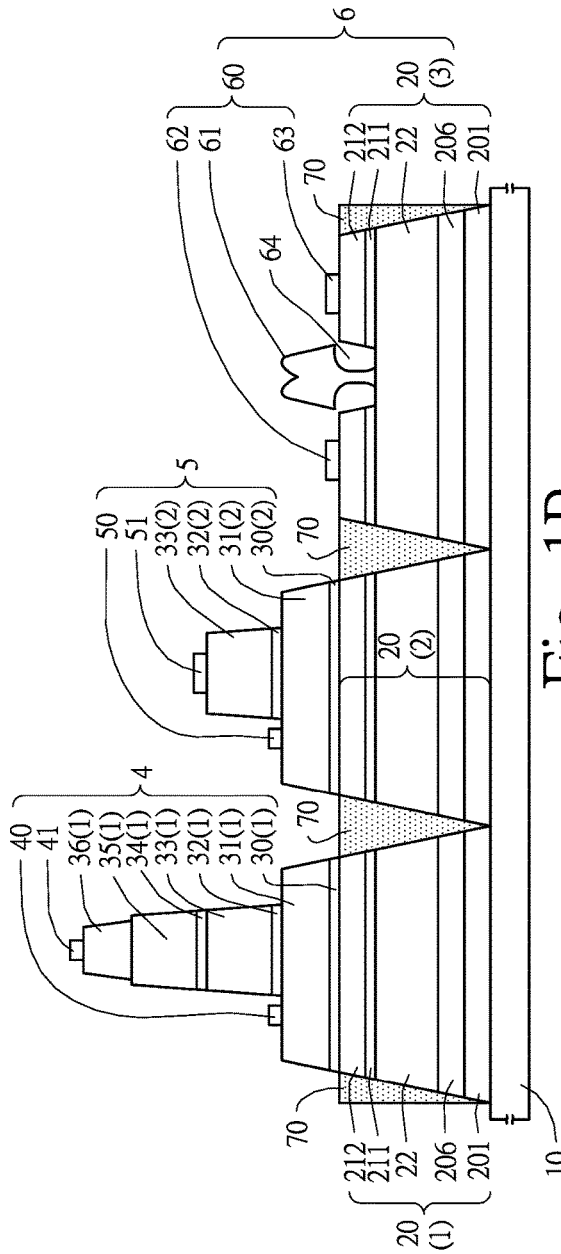
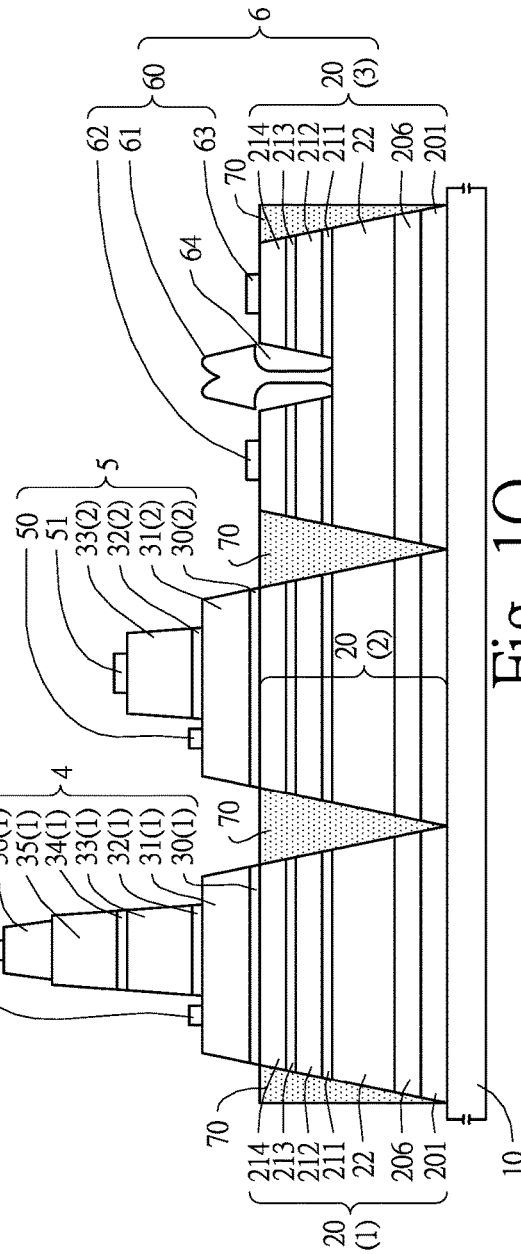

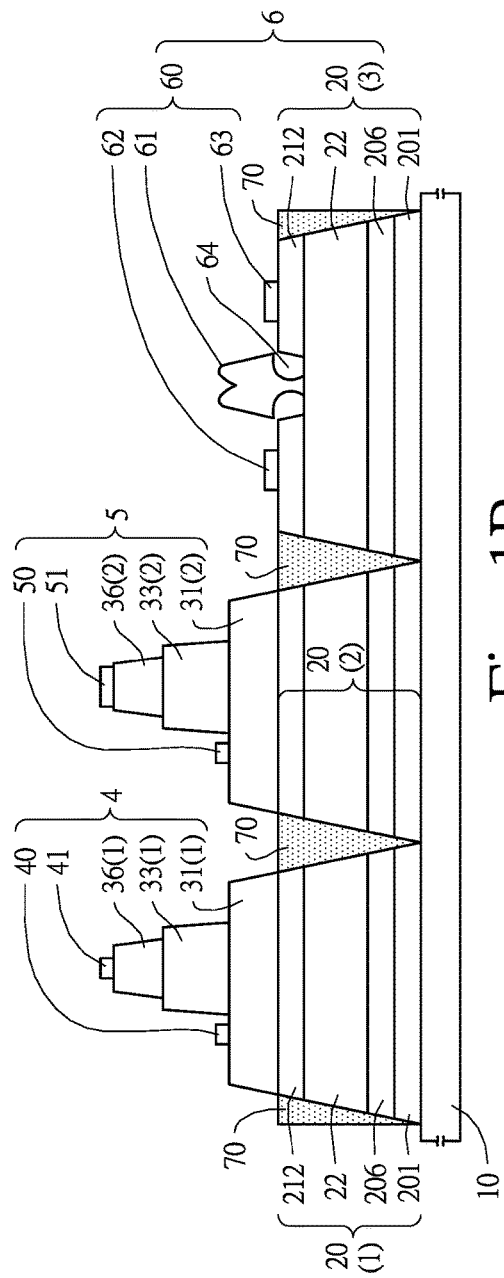
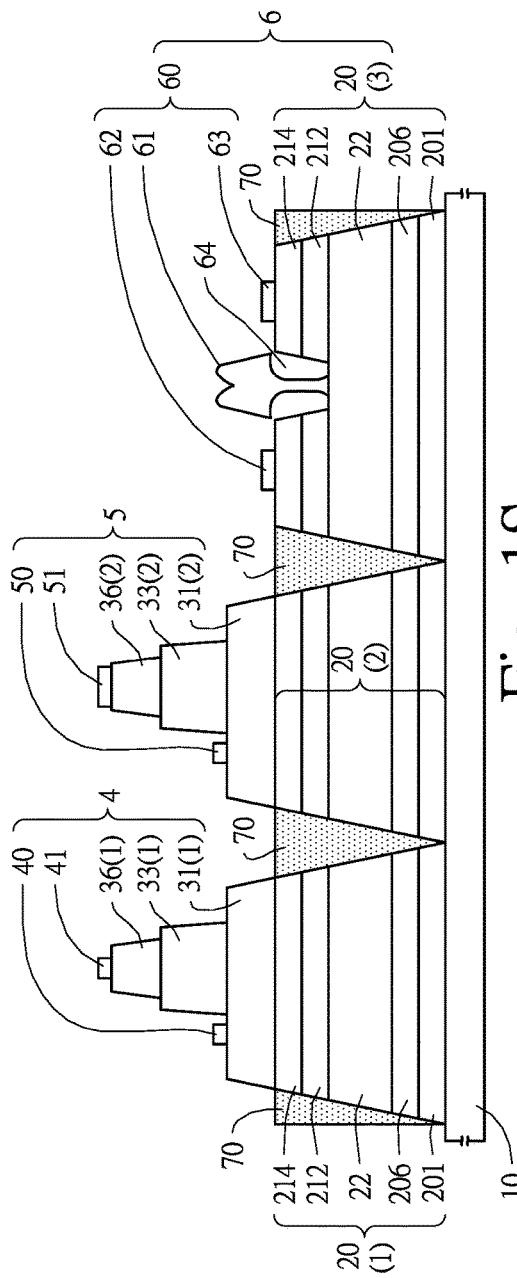
Fig. 1R
Fig. 1S

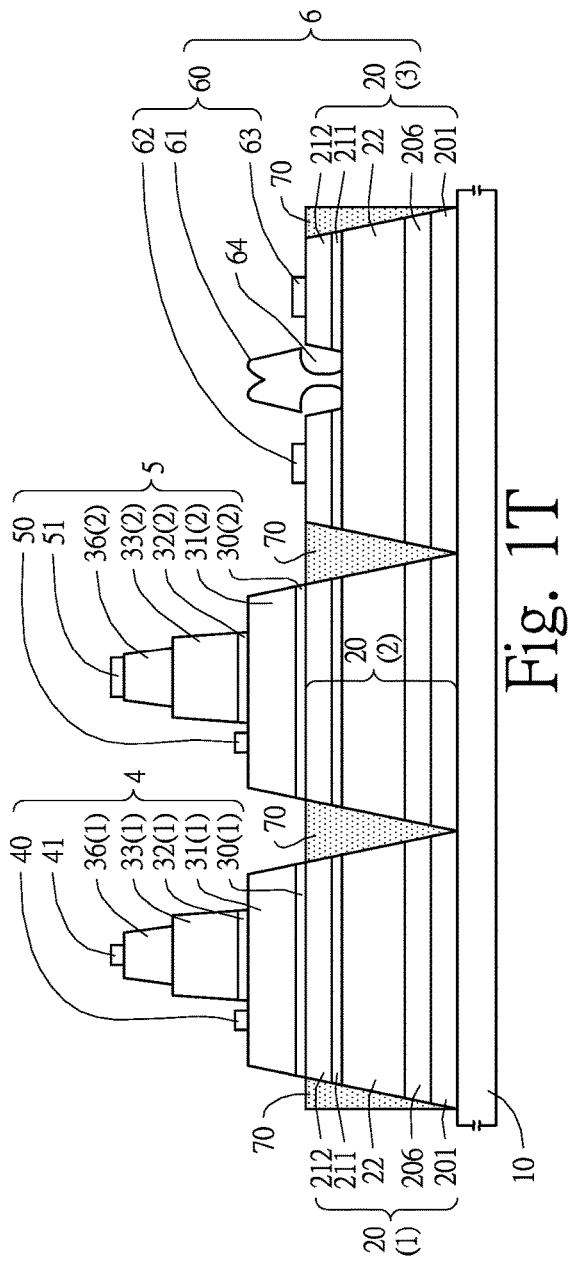
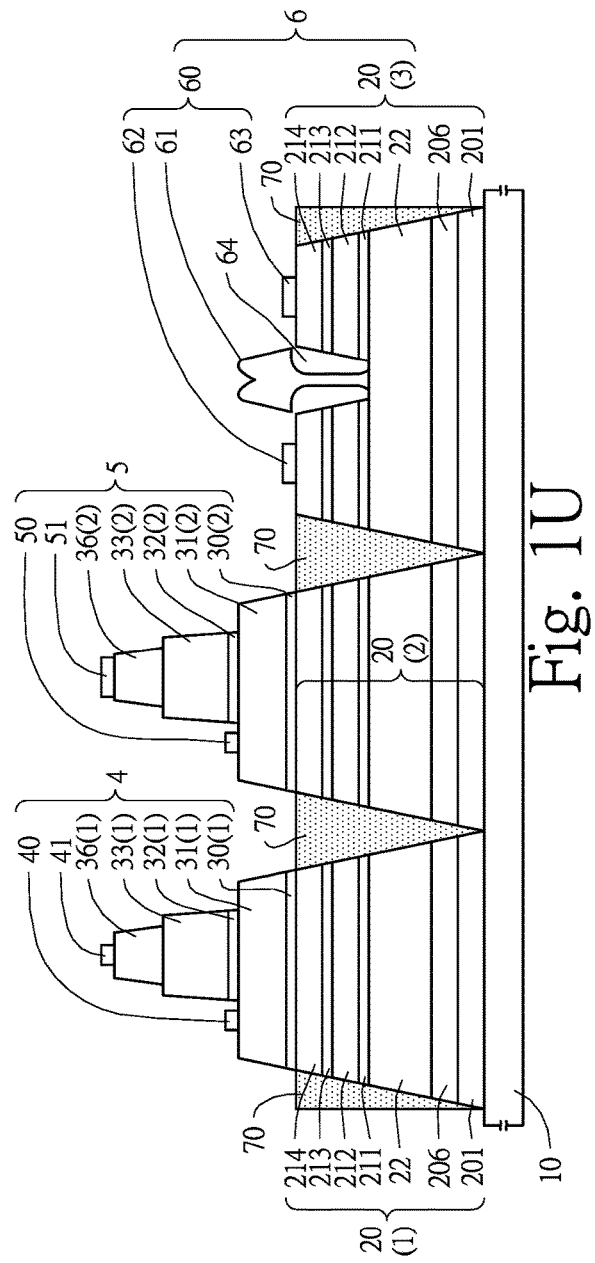

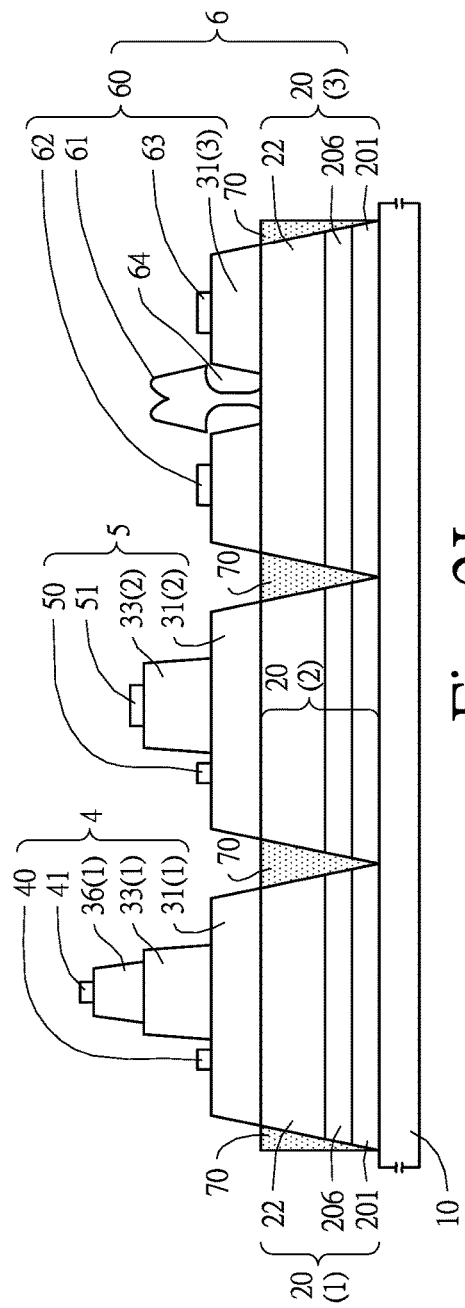
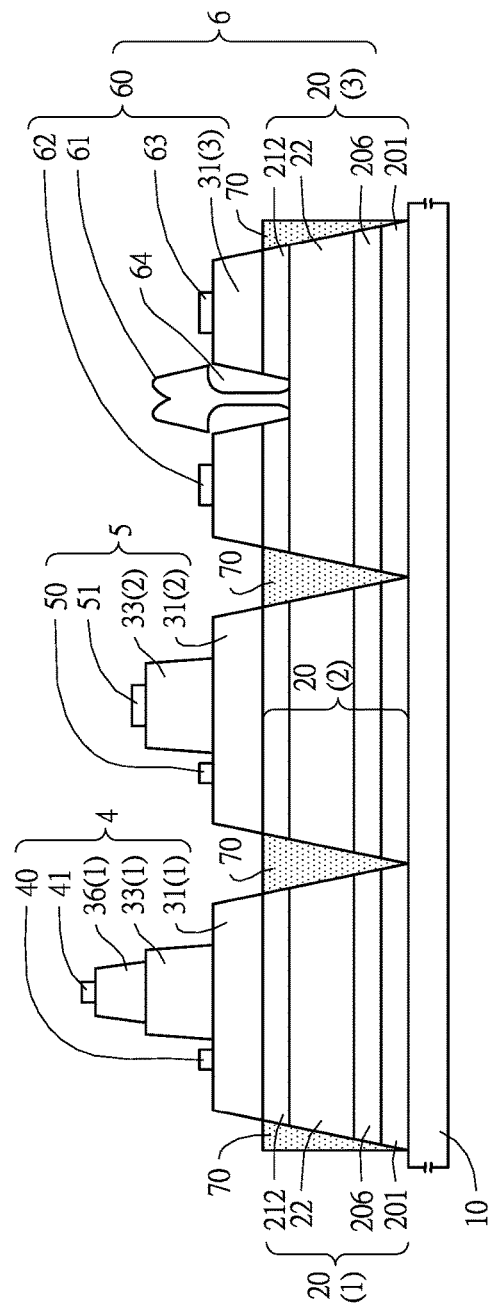
Fig. 2J
Fig. 2K

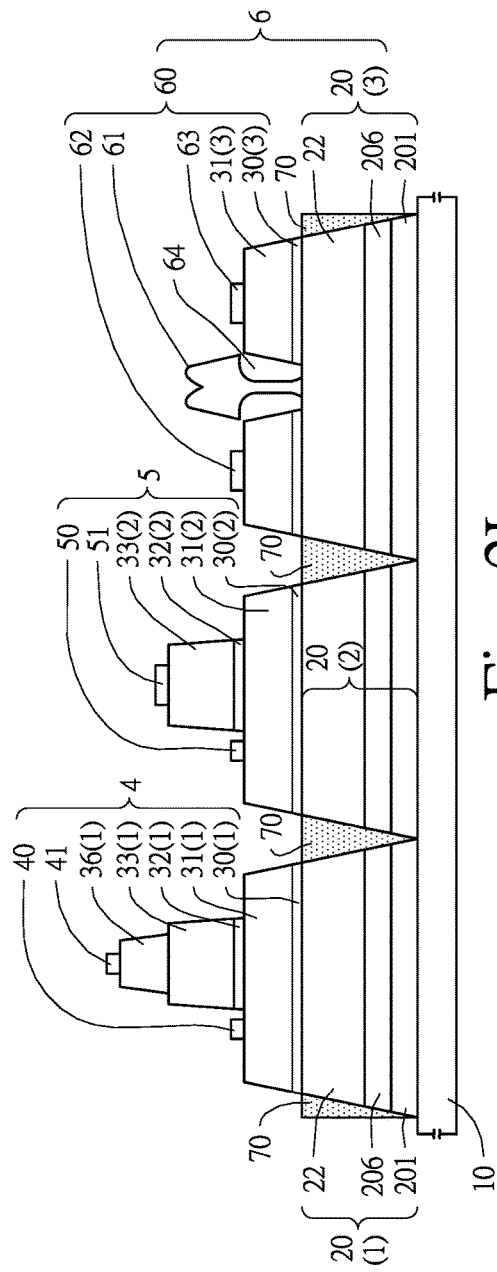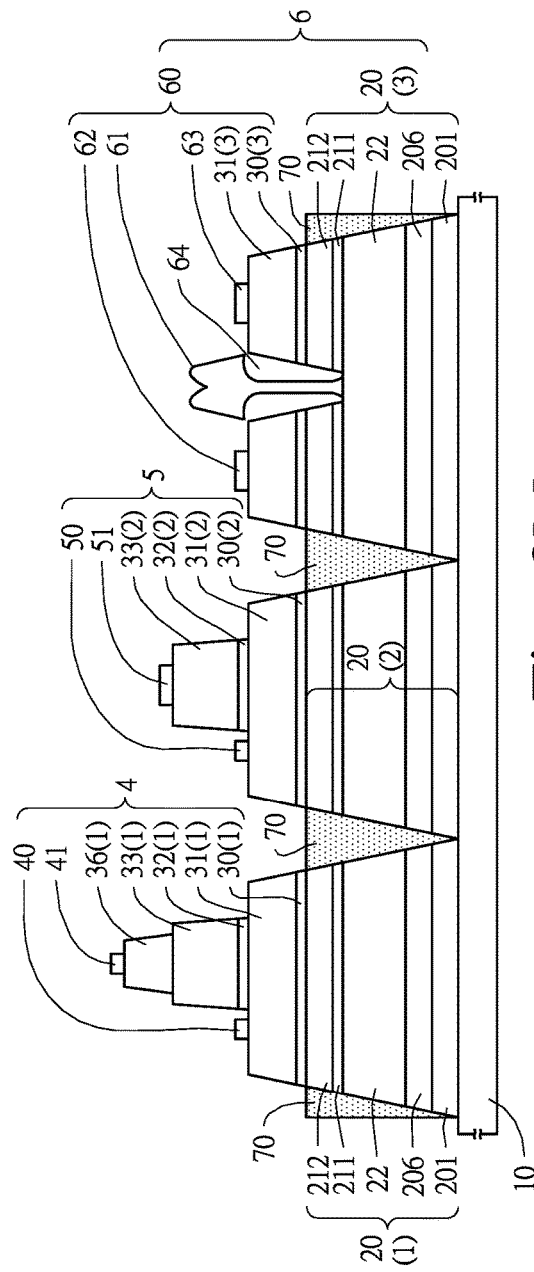

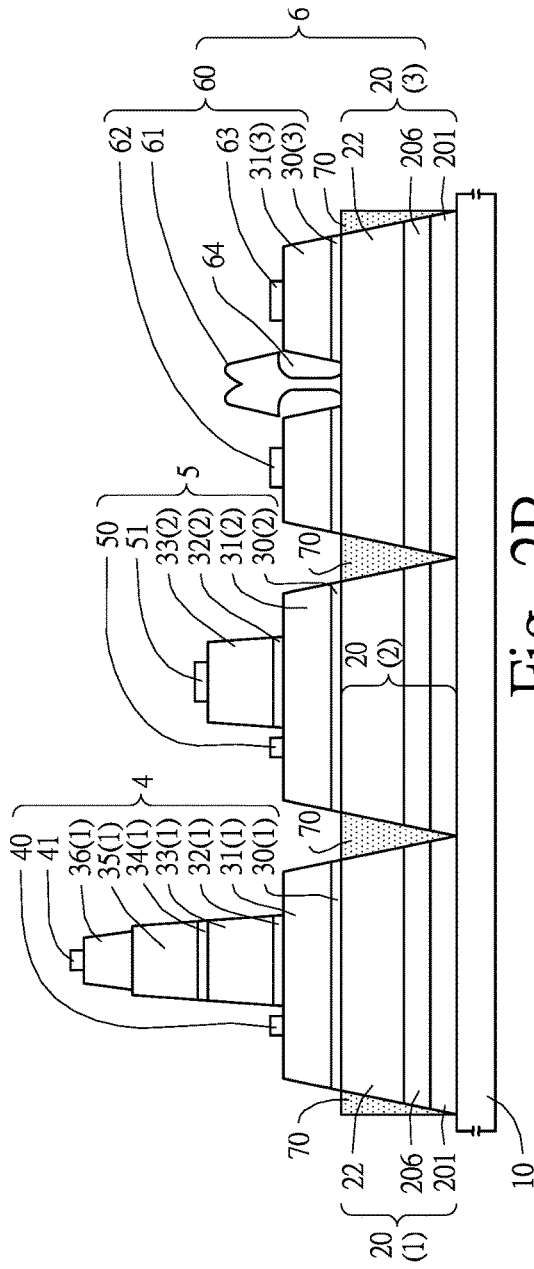
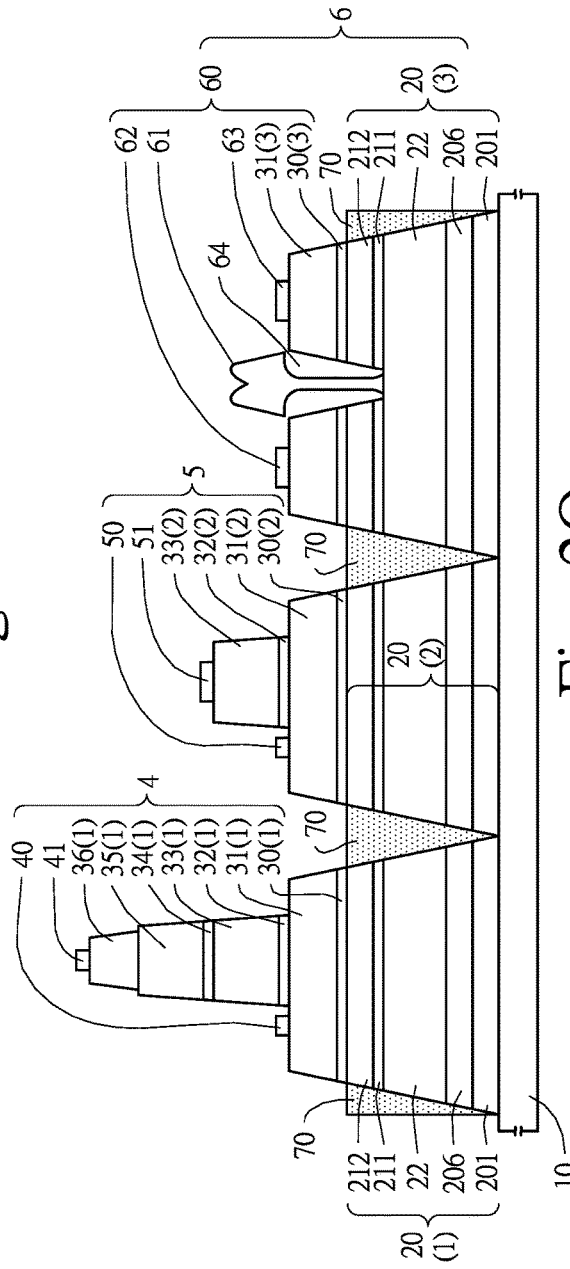
Fig. 2P
Fig. 2Q

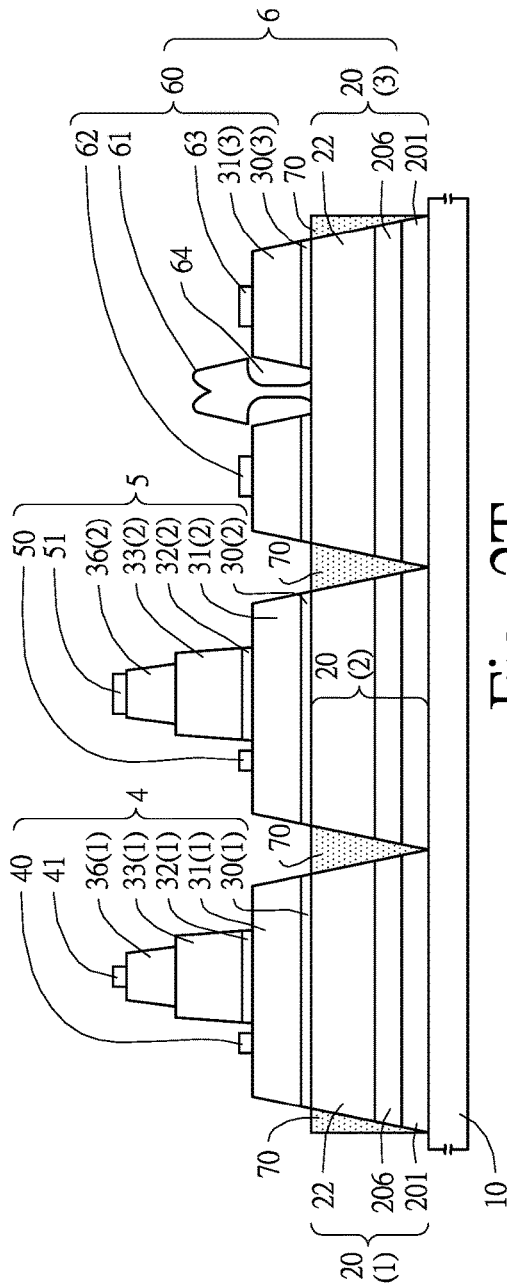
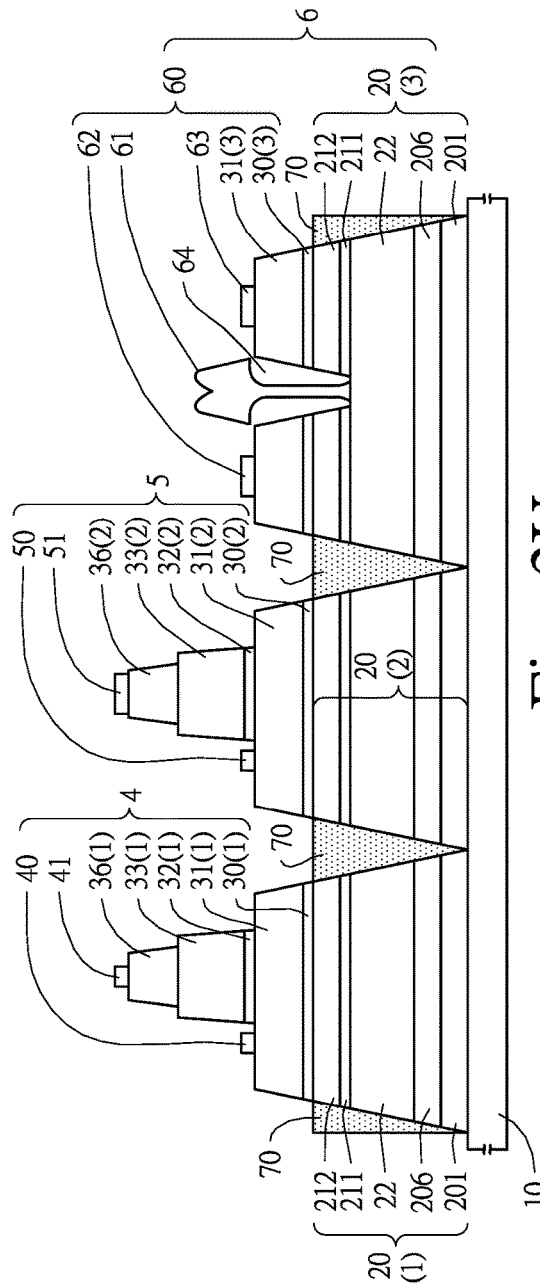
Fig. 2T
Fig. 2U

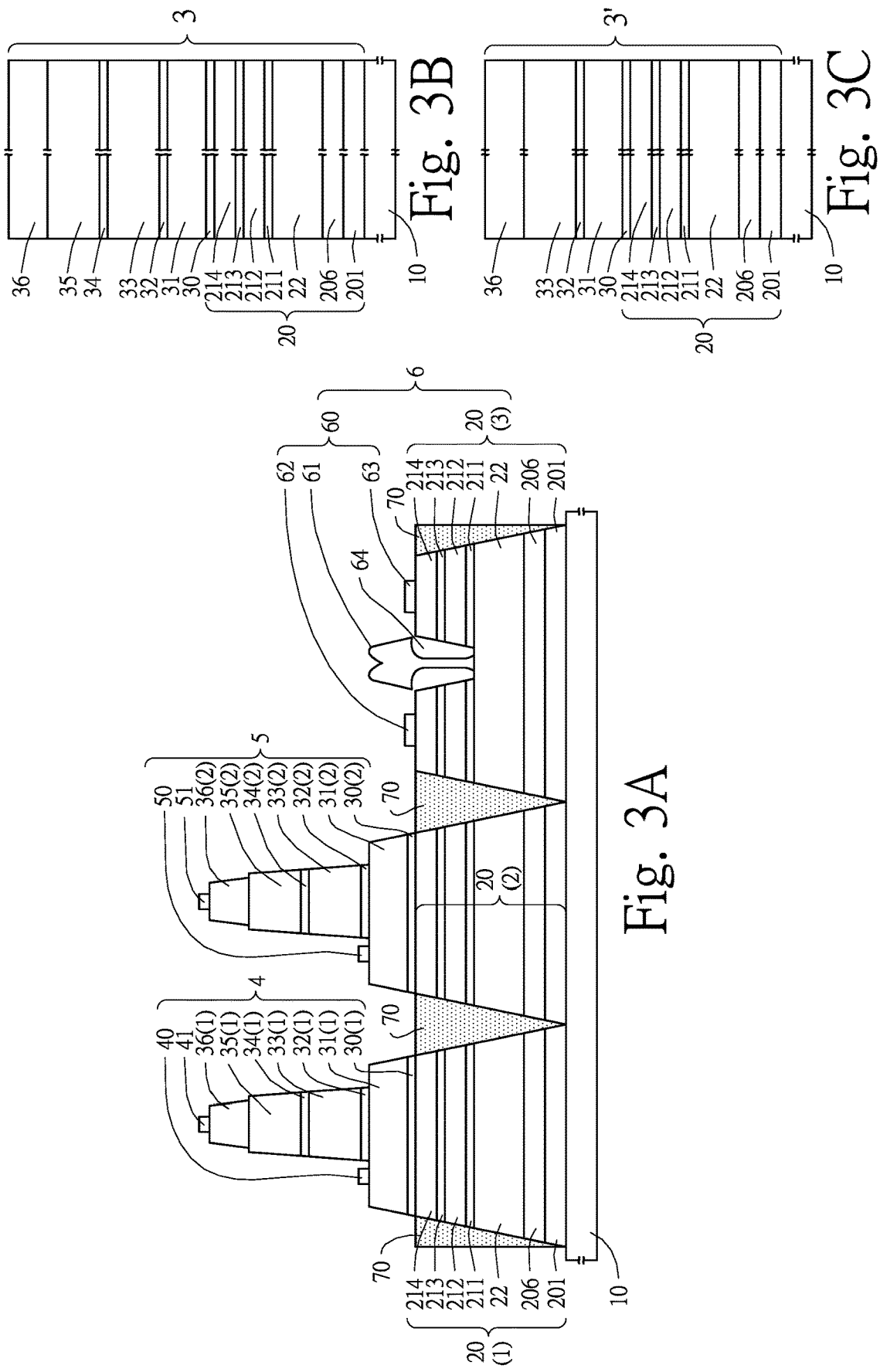

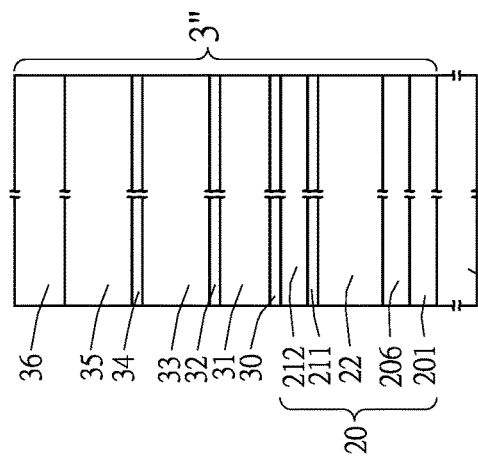
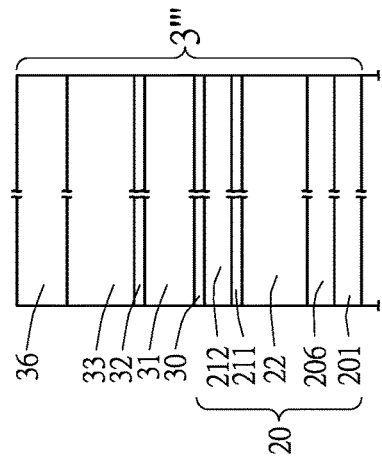
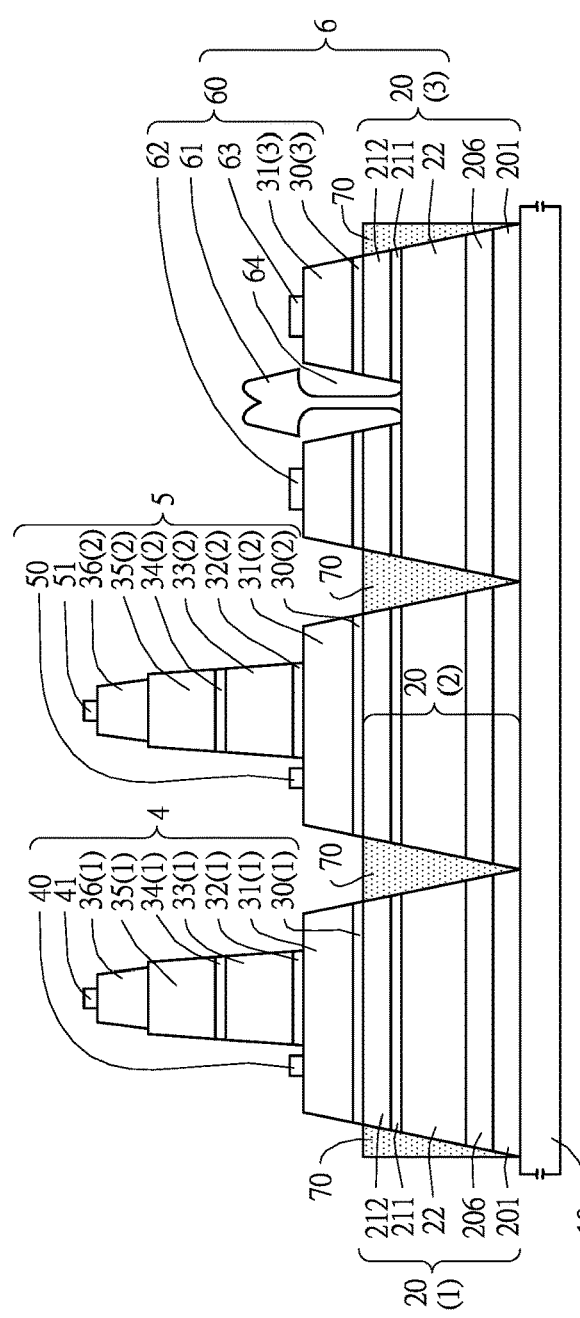

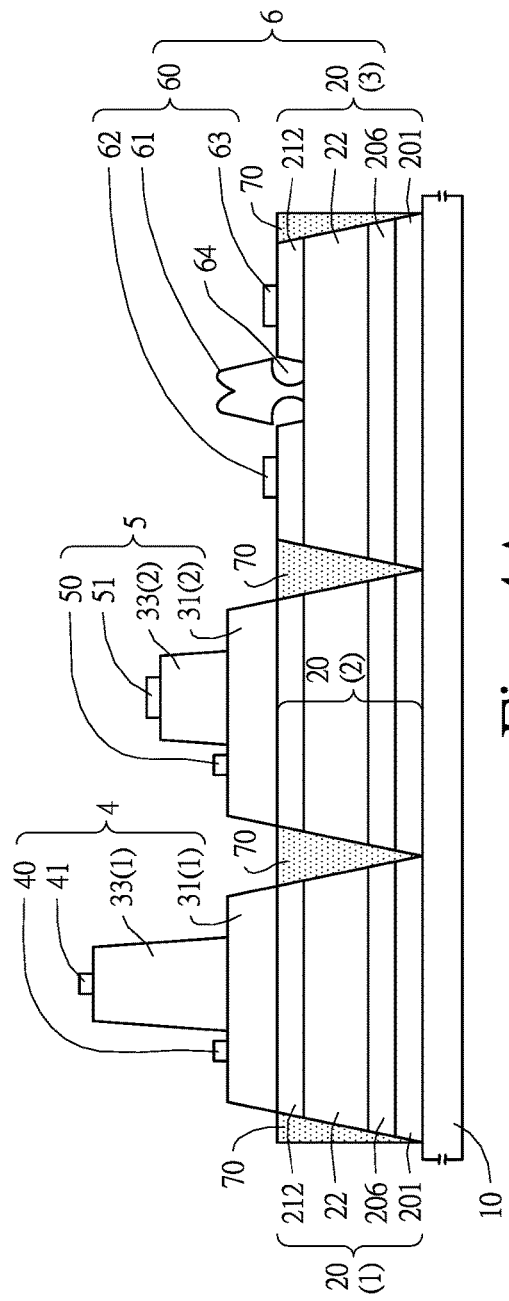
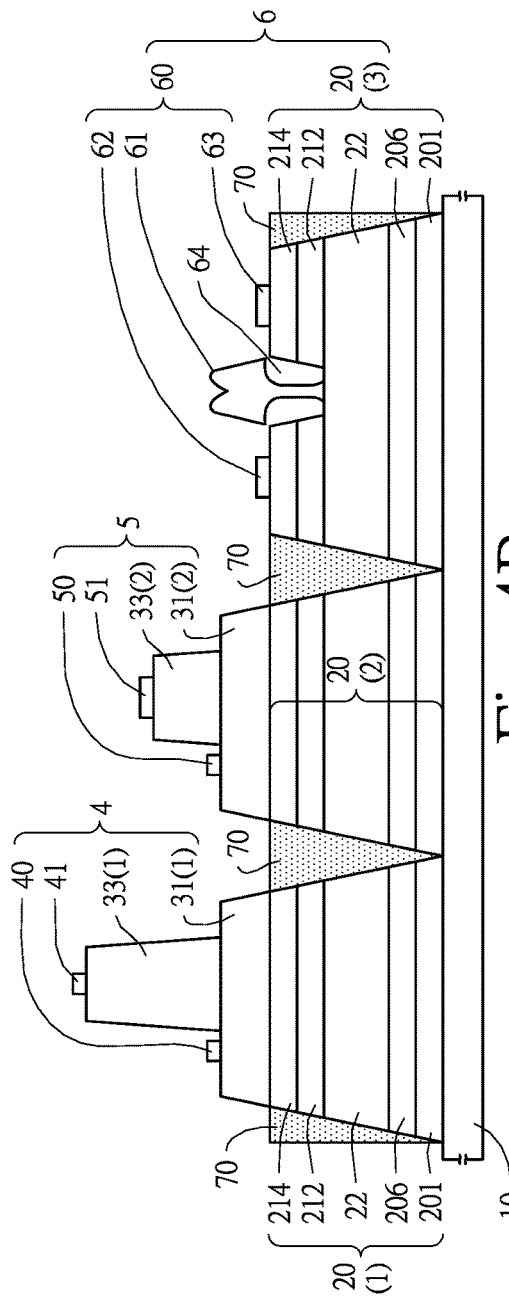

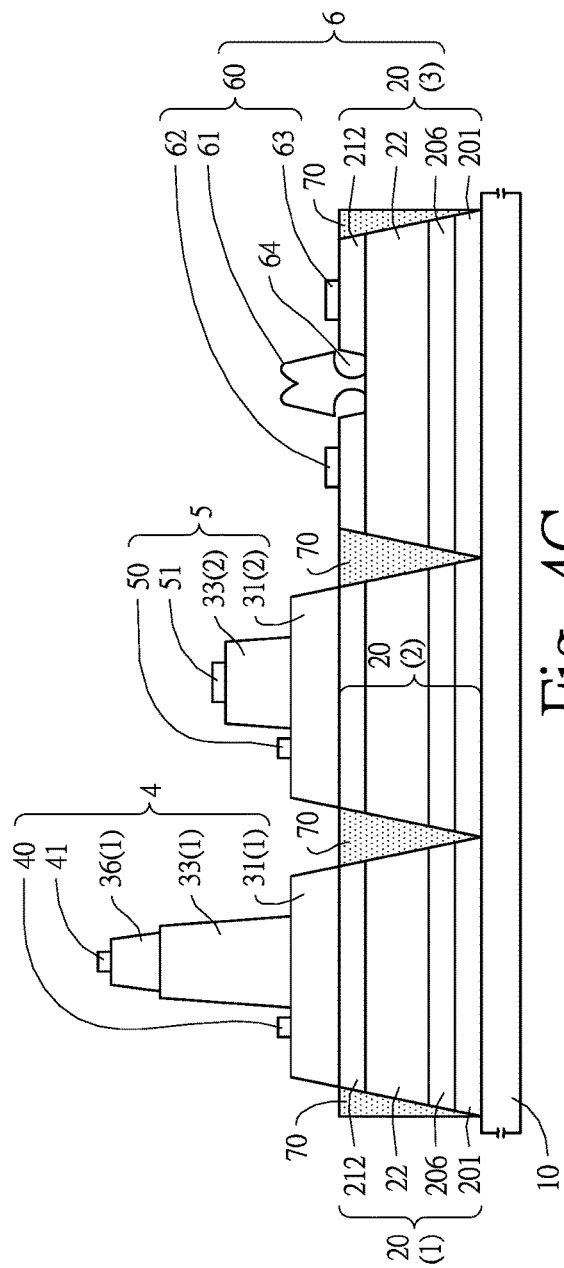
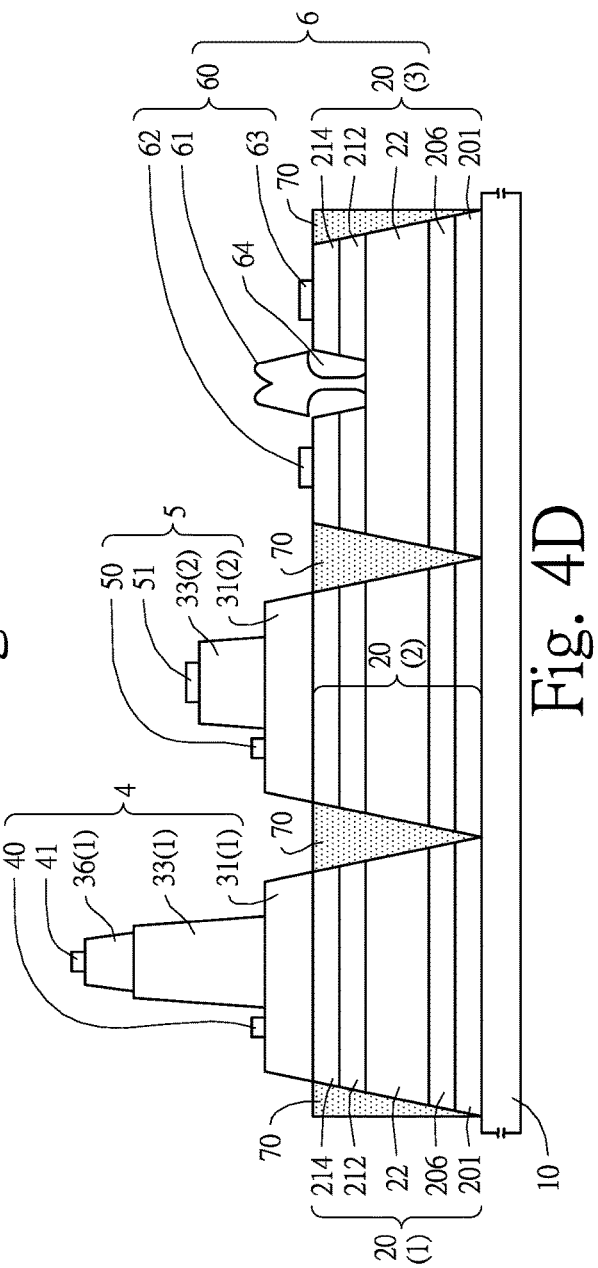
Fig. 4C
Fig. 4D

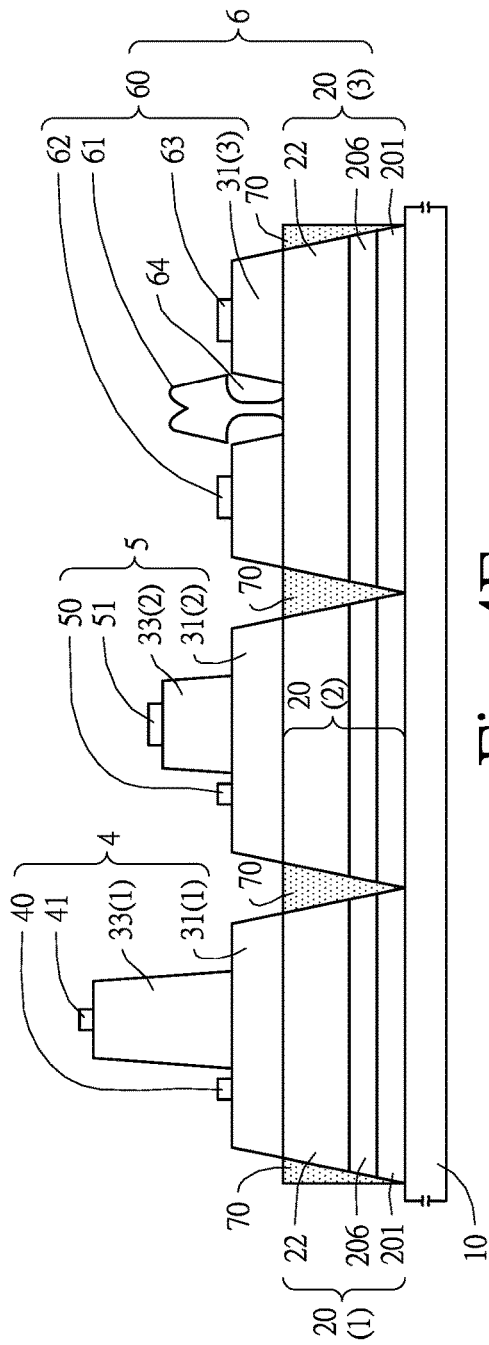
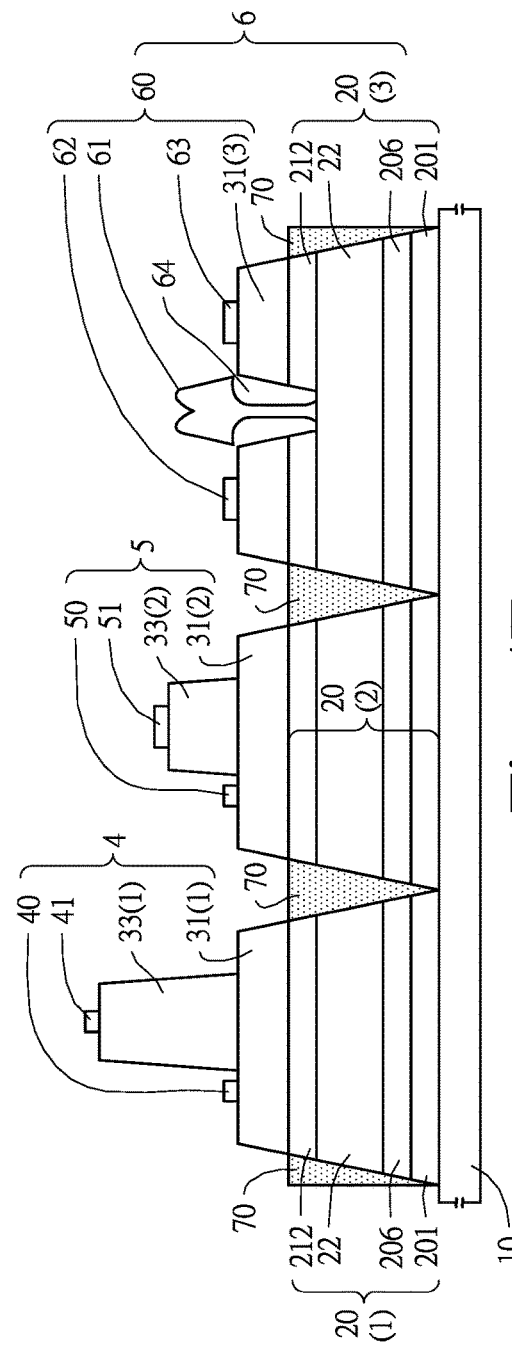
Fig. 4E
Fig. 4F

COMPOUND SEMICONDUCTOR MONOLITHIC INTEGRATED CIRCUIT DEVICE WITH TRANSISTORS AND DIODES

FIELD OF THE INVENTION

The present invention relates to III-V compound semiconductor integrated circuit devices, in particular, to a III-V compound semiconductor monolithically integrated circuit device with transistors and diodes.

BACKGROUND OF THE INVENTION

Radio frequency integrated circuit (RFIC) and monolithic microwave integrated circuit (MIMIC) technology provides the core components for many microwave and millimeter-wave (mmWave) communication, radar, and sensing systems. The transmit/receive module of a mobile communication or a phased-array radar system in the form of a single MIMIC is often most sought after for designers. Massive multiple-input/multiple-output (MIMO) technology utilizing hundreds of antenna elements has drawn attention as a key antenna configuration for beamforming applications. Realizing the massive MIMO concept of active phased-array antennas will require small-size, low-power-consumption, and highly accurate phase control over the wide-band frequency range, which poses significant challenges for the RF front end. The MIMIC compatibility which provides the solution to reduce the parasitic elements for operating efficiently at high frequencies is a must for a compact RF front end module. Accordingly, strong demand has arisen for a monolithic semiconductor integrated circuit in which high-speed field effect transistors (FETs), PIN diodes, and Schottky diodes form on a single chip. These microwave diodes can be incorporated into circuits of multiple functions, such as switches, limiters, mixers, phase shifters, attenuators, modulators, detectors, electrostatic protectors, etc. Moreover, monolithically integrating FETs and diodes on the same chip can essentially eliminate additional transition losses.

FIG. 5 discloses a conventional integrated circuit device that includes a PIN photodiode 90 that is monolithically integrated with a high electron mobility transistor (HEMT) 91 that is monolithically integrated with a heterojunction bipolar transistor (HBT) 92 on an InP substrate 901 in a multi-layer structure. The PIN photodiode 90 comprises a PIN photodiode epitaxial structure mesa 93, a first electrode 912, and a second electrode 911. The HEMT 91 comprises a HEMT epitaxial structure mesa 94, a gate electrode 914, a source electrode 913, and a drain electrode 915. The HBT 92 comprises a HBT epitaxial structure mesa 95, a collector electrode 918, a base electrode 917, and an emitter electrode 916. Fabricating the structure of the embodiment FIG. 5 needs the following steps: (1) forming an n-type doped GaInAs (n-GaInAs) layer 902 on an InP substrate 901; (2) forming an intrinsic GaInAs (i-GaInAs) layer 903 on the n-GaInAs layer 902; (3) forming a p-type doped GaInAs (p-GaInAs) layer 904 on the i-GaInAs layer 903; (4) defining the respective etching areas (not shown) of the p-GaInAs layer 904, the i-GaInAs layer 903, and the n-GaInAs layer 902; and etching sequentially the p-GaInAs layer 904, i-GaInAs layer 903, and n-GaInAs layer 902, forming a PIN photodiode epitaxial structure mesa 93 shown in FIG. 5; (5) forming a selective growth mask (not shown) on the PIN photodiode epitaxial structure mesa 93 and the InP substrate 901; (6) removing the selective growth mask (except the selective growth mask covering the PIN photodiode epitaxial structure mesa 93; not shown) such that the InP substrate 901 is exposed; (7) forming an i-GaInAs layer 905 on the exposed InP substrate 901; (8) forming an n-AlInAs layer 906 on the i-GaInAs layer 905; (9) defining the respective etching areas (not shown) of the n-AlInAs layer 906 and the i-GaInAs layer 905; and etching sequentially the n-AlInAs layer 906 and i-GaInAs layer 905, forming a HEMT epitaxial structure mesa 94 shown in FIG. 5; (10) forming a selective growth mask (not shown) on the PIN photodiode epitaxial structure mesa 93, the HEMT epitaxial structure mesa 94, and the InP substrate 901; (11) removing the selective growth mask (except the selective growth mask covering the PIN photodiode epitaxial structure mesa 93 and the HEMT epitaxial structure mesa 94; not shown) such that the InP substrate 901 is exposed; (12) forming an $n^+$-type doped GaInAs ($n^+$-GaInAs) layer 907 on the exposed InP substrate 901; (13) forming an n-GaInAs layer 908 on the $n^+$-GaInAs layer 907; (14) forming a p-GaInAs layer 909 on the n-GaInAs layer 908; (15) forming an n-type doped InP (n-InP) layer 910 on the p-GaInAs layer 909; (16) defining the respective etching areas (not shown) of the n-InP layer 910, the p-GaInAs layer 909, the n-GaInAs layer 908, and the $n^+$-GaInAs layer 907; and etching sequentially the n-InP layer 910, p-GaInAs layer 909, n-GaInAs layer 908, and $n^+$-GaInAs layer 907, forming a HBT epitaxial structure mesa 95 shown in FIG. 5; (17) removing the selective growth mask covering the PIN photodiode epitaxial structure mesa 93 and the HEMT epitaxial structure mesa 94 (not shown); (18) forming a first electrode 912 and a second electrode 911 on the n-GaInAs layer 902 and the p-GaInAs layer 904, respectively, completing a PIN photodiode 90; (19) forming a source electrode 913 and a drain electrode 915 on the n-AlInAs layer 906; and forming a gate electrode 914 on the n-AlInAs layer 906 between the source electrode 913 and the drain electrode 915, completing a HEMT 91; and (20) forming a collector electrode 918, a base electrode 917, and an emitter electrode 916 on the $n^+$-GaInAs layer 907, the p-GaInAs layer 909, and the n-InP layer 910, respectively, completing a HBT 92. Demonstrations of III-V compound semiconductor monolithically integrated circuit device with transistors and diodes reported in the prior art shown in FIG. 5 employ complex processes involving multiple epitaxial growths and regrowths. This regrowth of material requires additional processing steps and sophisticated cleaning procedures that lead to low yield and high cost fabrication. As a result, the aforementioned epitaxial layer regrowing process is problematic and unsatisfactory for mass production of mmWave communication, radar, and sensing systems.

Accordingly, a new approach to achieving a monolithically integrated circuit device with transistors and diodes is desirable.

SUMMARY OF THE INVENTION

The main technical problem that the present invention is keen to solve is a new design toward a compound semiconductor monolithic integrated circuit device with transistors and diodes, enabling the realization of the circuit devices with improved yield and performance as well as reduced cost and size.

In order to solve the above mentioned problem and to achieve the expected effect, the present invention provides a compound semiconductor monolithic integrated circuit device with transistors and diodes, which comprises a compound semiconductor substrate, a transistor epitaxial structure, a first diode, a second diode, and a transistor upper structure. The transistor epitaxial structure forms on the compound semiconductor substrate. The transistor epitaxial structure comprises a first part, a second part, and a third part of the transistor epitaxial structure. The first diode forms on the first part of the transistor epitaxial structure. The first diode comprises a first part of an n-type doped epitaxial layer, a first part of a first intrinsic epitaxial layer, a first electrode of the first diode, and a second electrode of the first diode. The n-type doped epitaxial layer comprises the first part of the n-type doped epitaxial layer and a second part of the n-type doped epitaxial layer. The first part of the n-type doped epitaxial layer forms on the first part of the transistor epitaxial structure. The first intrinsic epitaxial layer comprises the first part of the first intrinsic epitaxial layer and a second part of the first intrinsic epitaxial layer. The first part of the first intrinsic epitaxial layer forms on one portion of the first part of the n-type doped epitaxial layer; while the first electrode of the first diode forms on the other portion of the first part of the n-type doped epitaxial layer. The second electrode of the first diode forms on the first part of the first intrinsic epitaxial layer. The second diode forms on the second part of the transistor epitaxial structure. The second diode comprises the second part of the n-type doped epitaxial layer, the second part of the first intrinsic epitaxial layer, a first electrode of the second diode, and a second electrode of the second diode. The second part of the n-type doped epitaxial layer forms on the second part of the transistor epitaxial structure. The second part of the first intrinsic epitaxial layer forms on one portion of the second part of the n-type doped epitaxial layer; while the first electrode of the second diode forms on the other portion of the second part of the n-type doped epitaxial layer. The second electrode of the second diode forms on the second part of the first intrinsic epitaxial layer. The transistor upper structure forms on the third part of the transistor epitaxial structure. The transistor upper structure and the third part of the transistor epitaxial structure form a transistor, wherein the transistor is an FET. The design of the compound semiconductor monolithic integrated circuit device with transistors and diodes in the present invention integrates the transistor, the first diode, and the second diode on the compound semiconductor substrate. This invention only needs a single structure in a single growth run and a simplified process without complex cleaning procedures and epitaxial regrowths, rendering the realization of the monolithically integrated FET-Diode circuit devices with greatly reduced process steps, cost, size, and highly improved performance.

In one embodiment, the first diode forms a Schottky diode.

In one embodiment, the first diode further comprises a second intrinsic epitaxial layer, wherein the second intrinsic epitaxial layer forms on the first part of the first intrinsic epitaxial layer, and the second electrode of the first diode forms on the second intrinsic epitaxial layer.

In one embodiment, the first diode further comprises a second etch stop layer, wherein the second etch stop layer forms on the first part of the first intrinsic epitaxial layer, and the second intrinsic epitaxial layer forms on the second etch stop layer.

In one embodiment, the thickness of the first part of the first intrinsic epitaxial layer of the first diode is greater than the thickness of the second part of the first intrinsic epitaxial layer of the second diode.

In one embodiment, the first diode further comprises a first part of a p-type doped epitaxial layer, wherein the first part of the p-type doped epitaxial layer forms on the first part of the first intrinsic epitaxial layer, and the second electrode of the first diode forms on the first part of the p-type doped epitaxial layer, wherein the first diode forms a PIN diode.

In one embodiment, the second diode further comprises a second part of the p-type doped epitaxial layer, wherein the second part of the p-type doped epitaxial layer forms on the second part of the first intrinsic epitaxial layer, and the second electrode of the second diode forms on the second part of the p-type doped epitaxial layer, wherein the second diode forms a PIN diode.

In one embodiment, the first diode further comprises a second intrinsic epitaxial layer, wherein the second intrinsic epitaxial layer forms on the first part of the first intrinsic epitaxial layer, and the first part of the p-type doped epitaxial layer forms on the second intrinsic epitaxial layer.

In one embodiment, the first diode further comprises a second etch stop layer, wherein the second etch stop layer forms on the first part of the first intrinsic epitaxial layer, and the second intrinsic epitaxial layer forms on the second etch stop layer.

In one embodiment, the second diode forms a Schottky diode.

In one embodiment, the first diode further comprises a first part of a first etch stop layer and the second diode further comprises a second part of the first etch stop layer, wherein the first part of the first etch stop layer forms on the first part of the n-type doped epitaxial layer, and the first part of the first intrinsic epitaxial layer forms on the first part of the first etch stop layer, wherein the second part of the first etch stop layer forms on the second part of the n-type doped epitaxial layer, and the second part of the first intrinsic epitaxial layer forms on the second part of the first etch stop layer.

In one embodiment, the first diode further comprises a first part of a bottom etch stop layer and the second diode further comprises a second part of the bottom etch stop layer, wherein the first part of the bottom etch stop layer forms on the first part of the transistor epitaxial structure, and the first part of the n-type doped epitaxial layer forms on the first part of the bottom etch stop layer, wherein the second part of the bottom etch stop layer forms on the second part of the transistor epitaxial structure, and the second part of the n-type doped epitaxial layer forms on the second part of the bottom etch stop layer.

In one embodiment, the n-type doped epitaxial layer further comprises a third part of the n-type doped epitaxial layer, wherein the transistor epitaxial structure comprises a buffer layer, a channel layer, and a Schottky barrier layer; wherein the buffer layer forms on the compound semiconductor substrate, the channel layer forms on the buffer layer, the Schottky barrier layer forms on the channel layer, the transistor upper structure forms on the Schottky barrier layer; wherein the transistor upper structure comprises the third part of the n-type doped epitaxial layer, a gate electrode, a source electrode, and a drain electrode; wherein the third part of the n-type doped epitaxial layer forms on the Schottky barrier layer; wherein the source electrode forms on one portion of the third part of the n-type doped epitaxial layer; while the drain electrode forms on the other portion of the third part of the n-type doped epitaxial layer; wherein the transistor further comprises a gate recess located between the source electrode and the drain electrode; wherein a bottom of the gate recess is defined by the Schottky barrier layer, a surrounding of the gate recess is defined by the third part of the n-type doped epitaxial layer; wherein the gate electrode forms on the Schottky barrier layer within the gate recess.

In one embodiment, the first diode further comprises a first part of a bottom etch stop layer, the second diode further comprises a second part of the bottom etch stop layer, and the transistor upper structure further comprises a third part of the bottom etch stop layer, wherein the first part of the bottom etch stop layer, the second part of the bottom etch stop layer, and the third part of the bottom etch stop layer form on the Schottky barrier layer, and the first part of the n-type doped epitaxial layer forms on the first part of the bottom etch stop layer, the second part of the n-type doped epitaxial layer forms on the second part of the bottom etch stop layer, the third part of the n-type doped epitaxial layer forms on the third part of the bottom etch stop layer.

In one embodiment, the n-type doped epitaxial layer further comprises a third part of the n-type doped epitaxial layer; wherein the transistor epitaxial structure comprises a buffer layer, a channel layer, a Schottky barrier layer, and a first cap layer; wherein the buffer layer forms on the compound semiconductor substrate, the channel layer forms on the buffer layer, the Schottky barrier layer forms on the channel layer, the first cap layer forms on the Schottky barrier layer, the transistor upper structure forms on the first cap layer; wherein the transistor upper structure comprises the third part of the n-type doped epitaxial layer, a gate electrode, a source electrode, and a drain electrode; wherein the third part of the n-type doped epitaxial layer forms on the first cap layer; wherein the source electrode forms on one portion of the third part of the n-type doped epitaxial layer; while the drain electrode forms on the other portion of the third part of the n-type doped epitaxial layer; wherein the transistor further comprises a gate recess located between the source electrode and the drain electrode; wherein a bottom of the gate recess is defined by the Schottky barrier layer, a surrounding of the gate recess is defined by the third part of the n-type doped epitaxial layer and the first cap layer; wherein the gate electrode forms on the Schottky barrier layer within the gate recess.

In one embodiment, the first diode further comprises a first part of a bottom etch stop layer, the second diode further comprises a second part of the bottom etch stop layer, and the transistor upper structure further comprises a third part of the bottom etch stop layer, wherein the first part of the bottom etch stop layer, the second part of the bottom etch stop layer, and the third part of the bottom etch stop layer form on the first cap layer, and the first part of the n-type doped epitaxial layer forms on the first part of the bottom etch stop layer, the second part of the n-type doped epitaxial layer forms on the second part of the bottom etch stop layer, the third part of the n-type doped epitaxial layer forms on the third part of the bottom etch stop layer.

In one embodiment, the transistor epitaxial structure further comprises a first cap etch stop layer, wherein the first cap etch stop layer forms on the Schottky barrier layer, and the first cap layer forms on the first cap etch stop layer.

In one embodiment, the transistor epitaxial structure further comprises a buffer layer, a channel layer, a Schottky barrier layer, and a first cap layer; wherein the buffer layer forms on the compound semiconductor substrate, the channel layer forms on the buffer layer, the Schottky barrier layer forms on the channel layer, the first cap layer forms on the Schottky barrier layer, the transistor upper structure forms on the first cap layer; wherein the transistor upper structure comprises a gate electrode, a source electrode, and a drain electrode; wherein the source electrode forms on one portion of the first cap layer; while the drain electrode forms on the other portion of the first cap layer; wherein the transistor further comprises a gate recess located between the source electrode and the drain electrode; wherein a bottom of the gate recess is defined by the Schottky barrier layer, a surrounding of the gate recess is defined by the first cap layer; wherein the gate electrode forms on the Schottky barrier layer within the gate recess.

In one embodiment, the transistor epitaxial structure further comprises a first cap etch stop layer, wherein the first cap etch stop layer forms on the Schottky barrier layer, and the first cap layer forms on the first cap etch stop layer.

In one embodiment, the transistor epitaxial structure further comprises a second cap layer, wherein the second cap layer forms on the first cap layer, wherein the transistor upper structure forms on the second cap layer, wherein the surrounding of the gate recess is defined by the second cap layer and the first cap layer, wherein the source electrode and the drain electrode form on the second cap layer.

In one embodiment, the transistor epitaxial structure further comprises a second cap etch stop layer, wherein the second cap etch stop layer forms on the first cap layer, and the second cap layer forms on the second cap etch stop layer.

In one embodiment, the compound semiconductor substrate is GaAs or InP.

These and other aspects of the present invention may be better understood by reference to the following detailed description of the exemplary embodiments, when read in conjunction with the accompanying drawings thereof.

BRIEF DESCRIPTION OF DRAWINGS

FIGS. 3A-3F are simplified cross-sectional side views of embodiments of a monolithically integrated circuit device with transistor and diodes in accordance with the present invention.

FIGS. 4A-4H are simplified cross-sectional side views of embodiments of a monolithically integrated circuit device with transistor and diodes in accordance with the present invention.

DETAILED DESCRIPTIONS OF PREFERRED EMBODIMENTS

Figure 1N:
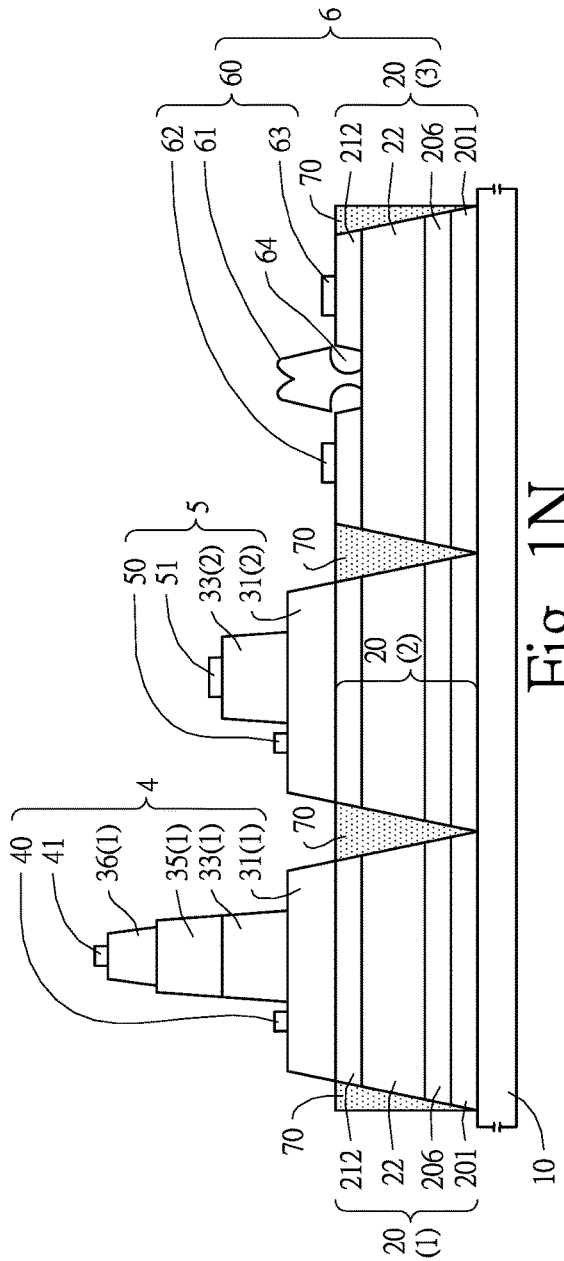
FIGS. 1A-1U are simplified cross-sectional side views of embodiments of a monolithically integrated circuit device with transistor and diodes in accordance with the present invention.

FIG. 1A illustrates an embodiment of a monolithically integrated circuit device with transistor and diodes in accordance with the present invention. In this particular example, the monolithically integrated circuit device with transistor and diodes comprises a compound semiconductor substrate 10, a transistor epitaxial structure 20, a first diode 4, a second diode 5, and a transistor upper structure 60. The transistor epitaxial structure 20 forms on the compound semiconductor substrate 10, wherein the transistor epitaxial structure 20 comprises a buffer layer 201, a channel layer 206, a Schottky barrier layer 22, and a first cap layer 212. The buffer layer 201 forms on the compound semiconductor substrate 10; the channel layer 206 forms on the buffer layer 201; the Schottky barrier layer 22 forms on the channel layer 206; the first cap layer 212 forms on the Schottky barrier layer 22.

The transistor epitaxial structure 20 comprises a first part 20(1), a second part 20(2), and a third part 20(3). The isolation regions 70 surround the transistor epitaxial structures 20(1), 20(2), and 20(3). The first diode 4, the second diode 5, and the transistor upper structure 60 form on the first transistor epitaxial structure 20(1), the second transistor epitaxial structure 20(2), and the third transistor epitaxial structure 20(3), respectively. The transistor upper structure 60 comprises a gate electrode 61, a source electrode 62, and a drain electrode 63; wherein the transistor upper structure 60 and the third part 20(3) of the transistor epitaxial structure 20 form a transistor 6. In current embodiment, the transistor 6 is an FET. The source electrode 62 forms on one portion of the first cap layer 212; while the drain electrode 63 forms on the other portion of the first cap layer 212. The transistor 6 further comprises a gate recess 64 locating between the source electrode 62 and the drain electrode 63, wherein a bottom of the gate recess 64 is defined by the Schottky barrier layer 22, a surrounding of the gate recess 64 is defined by the first cap layer 212. The gate electrode 61 forms on the Schottky barrier layer 22 within the gate recess 64. An n-type doped epitaxial layer 31 forms on the transistor epitaxial structure 20, wherein the n-type doped epitaxial layer 31 comprises a first part 31(1) and a second part 31(2), wherein the first part 31(1) forms on the transistor epitaxial structure 20(1), wherein the second part 31(2) forms on the transistor epitaxial structure 20(2). A first intrinsic epitaxial layer 33 forms on the n-type doped epitaxial layer 31, wherein the first intrinsic epitaxial layer 33 comprises a first part 33(1) and a second part 33(2). The first diode 4 comprises the n-type doped epitaxial layer 31(1), the first intrinsic epitaxial layer 33(1), a first electrode 40, and a second electrode 41. The first intrinsic epitaxial layer 33(1) forms on one portion of the n-type doped epitaxial layer 31(1); while the first electrode 40 forms on the other portion of the n-type doped epitaxial layer 31(1). The second electrode 41 forms on the first intrinsic epitaxial layer 33(1), forming a Schottky contact so that the first diode 4 forms a Schottky diode. The second diode 5 comprises the second part 31(2) of the n-type doped epitaxial layer 31, the second part 33(2) of the first intrinsic epitaxial layer 33, a first electrode 50, and a second electrode 51. The first intrinsic epitaxial layer 33(2) forms on one portion of the n-type doped epitaxial layer 31(2); while the first electrode 50 forms on the other portion of the n-type doped epitaxial layer 31(2). The second electrode 51 forms on the first intrinsic epitaxial layer 33(2), forming a Schottky contact so that the second diode 5 forms a Schottky diode. The embodiment FIG. 1A integrates two Schottky diodes having the same intrinsic layer thickness (first intrinsic epitaxial layers 33(1) and 33(2)) and an FET (transistor 6) on the compound semiconductor substrate 10. FIG. 1B shows a cross-sectional side view of an epitaxial structure of the present embodiment. A compound semiconductor epitaxial structure 1 forms on a compound semiconductor substrate 10, wherein the compound semiconductor epitaxial structure 1 comprises a transistor epitaxial structure 20, an n-type doped epitaxial layer 31, and a first intrinsic epitaxial layer 33. The transistor epitaxial structure 20 comprises a buffer layer 201, a channel layer 206, a Schottky barrier layer 22, and a first cap layer 212. The buffer layer 201 forms on the compound semiconductor substrate 10; the channel layer 206 forms on the buffer layer 201; the Schottky barrier layer 22 forms on the channel layer 206; the first cap layer 212 forms on the Schottky barrier layer 22; the n-type doped epitaxial layer 31 forms on the first cap layer 212; the first intrinsic epitaxial layer 33 forms on the n-type doped epitaxial layer 31. The embodiment FIG. 1A of the present invention can be fabricated using the compound semiconductor epitaxial structure 1 shown in FIG. 1B. This invention only needs a single structure in a single growth run and a simplified process without complex cleaning procedures and epitaxial regrowths, rendering the realization of the monolithically integrated FET-Diode circuit devices with greatly reduced process steps, cost, size, and highly improved performance.

In some embodiments, the compound semiconductor substrate 10 may be GaAs or InP, for example. In some preferable embodiments, the compound semiconductor substrate 10 is GaAs; the buffer layer 201 is composed of GaAs and AlGaAs; the channel layer 206 is intrinsic InGaAs (i-InGaAs); the Schottky barrier layer 22 is intrinsic AlGaAs (i-AlGaAs) or n-type doped AlGaAs (n-AlGaAs); the first cap layer 212 is n-type doped GaAs (n-GaAs); the n-type doped epitaxial layer 31 is n-type doped GaAs (n-GaAs); the first intrinsic epitaxial layer 33 is intrinsic GaAs (i-GaAs). In some embodiments, the transistor 6 is a pseudomorphic high electron mobility transistor (pHEMT).

FIG. 1C illustrates an embodiment of a monolithically integrated circuit device with transistor and diodes in accordance with the present invention. The main structure of the embodiment FIG. 1C is basically the same with that of the embodiment FIG. 1A, except that the transistor epitaxial structure 20 further comprises a second cap layer 214. The second cap layer 214 forms on the first cap layer 212; the n-type doped epitaxial layer 31 (including 31(1) and 31(2)) forms on the second cap layer 214. The bottom of the gate recess 64 is defined by the Schottky barrier layer 22; the surrounding of the gate recess 64 is defined by the first cap layer 212 and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the widths of the gate recess 64 defined by the first cap layer 212 and the second cap layer 214 may be similar or different (not shown).

FIG. 1D illustrates an embodiment of a monolithically integrated circuit device with transistor and diodes in accordance with the present invention. The main structure of the embodiment FIG. 1D is basically the same with that of the embodiment of FIG. 1A, except that the transistor epitaxial structure 20 further comprises a first cap etch stop layer 211; the first diode 4 further comprises a first part 30(1) of a bottom etch stop layer 30 and a first part 32(1) of a first etch stop layer 32; and the second diode 5 further comprises a second part 30(2) of the bottom etch stop layer 30 and a second part 32(2) of the first etch stop layer 32. The first cap etch stop layer 211 forms on the Schottky barrier layer 22; the first cap layer 212 forms on the first cap etch stop layer 211. The bottom of the gate recess 64 is defined by the Schottky barrier layer 22; the surrounding of the gate recess 64 is defined by the first cap layer 212 and the first cap etch stop layer 211. The bottom etch stop layers 30(1) and 30(2) form on the transistor epitaxial structures 20(1) and 20(2), respectively. The n-type doped epitaxial layers 31(1) and 31(2) form on the bottom etch stop layers 30(1) and 30(2), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. In some embodiments, the first cap etch stop layer 211, the bottom etch stop layer 30, and the first etch stop layer 32 may be AlAs, AlGaAs, or InGaP, for example.

FIG. 1E illustrates an embodiment of a monolithically integrated circuit device with transistor and diodes in accordance with the present invention. The main structure of the embodiment FIG. 1E is basically the same with that of the embodiment FIG. 1D, except that the transistor epitaxial structure 20 further comprises a second cap layer 214 and a second cap etch stop layer 213. The second cap etch stop layer 213 forms on the first cap layer 212; the second cap layer 214 forms on the second cap etch stop layer 213; the bottom etch stop layer 30 (including 30(1) and 30(2)) forms on the second cap layer 214. The bottom of the gate recess 64 is defined by the Schottky barrier layer 22; the surrounding of the gate recess 64 is defined by the first cap etch stop layer 211, the first cap layer 212, the second cap etch stop layer 213, and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the second cap etch stop layer 213 may be AlAs, AlGaAs, or InGaP, for example. In some embodiments, the widths of the gate recess 64 defined by the first cap layer 212 and the second cap layer 214 may be similar or different (not shown). The embodiments FIGS. 1A, 1C, 1D, and 1E integrate two Schottky diodes having the same intrinsic layer thickness (first intrinsic epitaxial layers 33(1) and 33(2)) and an FET (transistor 6) on the compound semiconductor substrate 10.

FIG. 1F illustrates an embodiment of a monolithically integrated circuit device with transistor and diodes in accordance with the present invention. The main structure of the embodiment FIG. 1F is basically the same with that of the embodiment FIG. 1A, except that the first diode 4 further comprises a first part 35(1) of a second intrinsic epitaxial layer 35. The second intrinsic epitaxial layer 35(1) forms on the first intrinsic epitaxial layer 33(1); the second electrode 41 forms on the second intrinsic epitaxial layer 35(1), forming a Schottky contact so that the first diode 4 forms a Schottky diode. In some preferable embodiments, the second intrinsic epitaxial layer 35 is intrinsic GaAs (i-GaAs). The embodiment FIG. 1F integrates a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

FIG. 1G illustrates an embodiment of a monolithically integrated circuit device with transistor and diodes in accordance with the present invention. The main structure of the embodiment FIG. 1G is basically the same with that of the embodiment FIG. 1F, except that the transistor epitaxial structure 20 further comprises a second cap layer 214. The second cap layer 214 forms on the first cap layer 212; the n-type doped epitaxial layer 31 (including 31(1) and 31(2)) forms on the second cap layer 214. The bottom of the gate recess 64 is defined by the Schottky barrier layer 22; the surrounding of the gate recess 64 is defined by the first cap layer 212 and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the widths of the gate recess 64 defined by the first cap layer 212 and the second cap layer 214 may be similar or different (not shown).

FIG. 1H illustrates an embodiment of a monolithically integrated circuit device with transistor and diodes in accordance with the present invention. The main structure of the embodiment FIG. 1H is basically the same with that of the embodiment FIG. 1F, except that the transistor epitaxial structure 20 further comprises a first cap etch stop layer 211; the first diode 4 further comprises a first part 30(1) of the bottom etch stop layer 30, a first part 32(1) of the first etch stop layer 32, and a first part 34(1) of the second etch stop layer 34; and the second diode 5 further comprises a second part 30(2) of the bottom etch stop layer 30 and a second part 32(2) of the first etch stop layer 32. The first cap etch stop layer 211 forms on the Schottky barrier layer 22; the first cap layer 212 forms on the first cap etch stop layer 211. The bottom of the gate recess 64 is defined by the Schottky barrier layer 22; the surrounding of the gate recess 64 is defined by the first cap layer 212 and the first cap etch stop layer 211. The bottom etch stop layers 30(1) and 30(2) form on the transistor epitaxial structures 20(1) and 20(2), respectively. The n-type doped epitaxial layers 31(1) and 31(2) form on the bottom etch stop layers 30(1) and 30(2), respectively. The first etch stop layers 32(1) and 32(2) form on one portion of the n-type doped epitaxial layers 31(1) and 31(2), respectively. The first intrinsic epitaxial layers 33(1) and the 33(2) form on the first etch stop layers 32(1) and 32(2), respectively. The second etch stop layer 34(1) forms on the first intrinsic epitaxial layer 33(1); the second intrinsic epitaxial layer 35(1) forms on the second etch stop layer 34(1). In some embodiments, the first cap etch stop layer 211, the bottom etch stop layer 30, the first etch stop layer 32, and the second etch stop layer 34 may be AlAs, AlGaAs, or InGaP, for example.

FIG. 1I illustrates an embodiment of a monolithically integrated circuit device with transistor and diodes in accordance with the present invention. The main structure of the embodiment FIG. 1I is basically the same with that of the embodiment FIG. 1H, except that the transistor epitaxial structure 20 further comprises a second cap layer 214 and a second cap etch stop layer 213. The second cap etch stop layer 213 forms on the first cap layer 212; the second cap layer 214 forms on the second cap etch stop layer 213; the bottom etch stop layer 30 (including 30(1) and 30(2)) form on the second cap layer 214. The bottom of the gate recess 64 is defined by the Schottky barrier layer 22; the surrounding of the gate recess 64 is defined by the first cap etch stop layer 211, the first cap layer 212, the second cap etch stop layer 213, and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the second cap etch stop layer 213 may be AlAs, AlGaAs, or InGaP, for example. In some embodiments, the widths of the gate recess 64 defined by the first cap layer 212 and the second cap layer 214 may be similar or different (not shown). The embodiments FIGS. 1F, 1G, 1H, and 1I integrate a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

FIG. 1J illustrates an embodiment of a monolithically integrated circuit device with transistor and diodes in accordance with the present invention. The main structure of the embodiment FIG. 1J is basically the same with that of the embodiment FIG. 1A, except that the first diode 4 further comprises a first part 36(1) of a p-type doped epitaxial layer 36. The p-type doped epitaxial layer 36(1) forms on the first intrinsic epitaxial layer 33(1); the second electrode 41 forms on the p-type doped epitaxial layer 36(1) so that the first diode 4 forms a PIN diode. In some embodiments, the p-type doped epitaxial layer 36 is p-type doped GaAs (p-GaAs). The embodiment FIG. 1J integrates a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness.

FIG. 1K illustrates an embodiment of a monolithically integrated circuit device with transistor and diodes in accordance with the present invention. The main structure of the embodiment FIG. 1K is basically the same with that of the embodiment FIG. 1J, except that the transistor epitaxial structure 20 further comprises a second cap layer 214. The second cap layer 214 forms on the first cap layer 212; the n-type doped epitaxial layer 31 (including 31(1) and 31(2)) forms on the second cap layer 214. The bottom of the gate recess 64 is defined by the Schottky barrier layer 22; the surrounding of the gate recess 64 is defined by the first cap layer 212 and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the widths of the gate recess 64 defined by the first cap layer 212 and the second cap layer 214 may be similar or different (not shown).

FIG. 1L illustrates an embodiment of a monolithically integrated circuit device with transistor and diodes in accordance with the present invention. The main structure of the embodiment FIG. 1L is basically the same with that of the embodiment FIG. 1J, except that the transistor epitaxial structure 20 further comprises a first cap etch stop layer 211; the first diode 4 further comprises a first part 30(1) of a bottom etch stop layer 30 and a first part 32(1) of a first etch stop layer 32; and the second diode 5 further comprises a second part 30(2) of the bottom etch stop layer 30 and a second part 32(2) of the first etch stop layer 32. The first cap etch stop layer 211 forms on the Schottky barrier layer 22; the first cap layer 212 forms on the first cap etch stop layer 211. The bottom of the gate recess 64 is defined by the Schottky barrier layer 22; the surrounding of the gate recess 64 is defined by the first cap layer 212 and the first cap etch stop layer 211. The bottom etch stop layers 30(1) and 30(2) form on the transistor epitaxial structures 20(1) and 20(2), respectively. The n-type doped epitaxial layers 31(1) and 31(2) form on the bottom etch stop layers 30(1) and 30(2), respectively. The first etch stop layers 32(1) and 32(2) form on one portion of the n-type doped epitaxial layer 31(1) and 31(2), respectively. The first intrinsic epitaxial layers 33(1) and 33(2) form on the first etch stop layers 32(1) and 32(2), respectively. In some embodiments, the first cap etch stop layer 211, the bottom etch stop layer 30, and the first etch stop layer 32 may be AlAs, AlGaAs, or InGaP, for example.

FIG. 1M illustrates an embodiment of a monolithically integrated circuit device with transistor and diodes in accordance with the present invention. The main structure of the embodiment FIG. 1M is basically the same with that of the embodiment FIG. 1L, except that the transistor epitaxial structure 20 further comprises a second cap layer 214 and a second cap etch stop layer 213. The second cap etch stop layer 213 forms on the first cap layer 212; the second cap layer 214 forms on the second cap etch stop layer 213; the bottom etch stop layer 30 (including 30(1) and 30(2)) forms on the second cap layer 214. The bottom of the gate recess 64 is defined by the Schottky barrier layer 22; the surrounding of the gate recess 64 is defined by the first cap etch stop layer 211, the first cap layer 212, the second cap etch stop layer 213, and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the second cap etch stop layer 213 may be AlAs, AlGaAs, or InGaP, for example. In some embodiments, the widths of the gate recess 64 defined by the first cap layer 212 and the second cap layer 214 may be similar or different (not shown). The embodiments FIGS. 1J, 1K, 1L, and 1M integrate a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness.

FIG. 1N illustrates an embodiment of a monolithically integrated circuit device with transistor and diodes in accordance with the present invention. The main structure of the embodiment FIG. 1N is basically the same with that of the embodiment FIG. 1J, except that the first diode 4 further comprises a first part 35(1) of a second intrinsic epitaxial layer 35. The second intrinsic epitaxial layer 35(1) forms on the first intrinsic epitaxial layer 33(1); the p-type doped epitaxial layer 36(1) forms on the second intrinsic epitaxial layer 35(1). In some preferable embodiments, the second intrinsic epitaxial layer 35 is intrinsic GaAs (i-GaAs). The embodiment FIG. 1N integrates a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

Figure 1O:
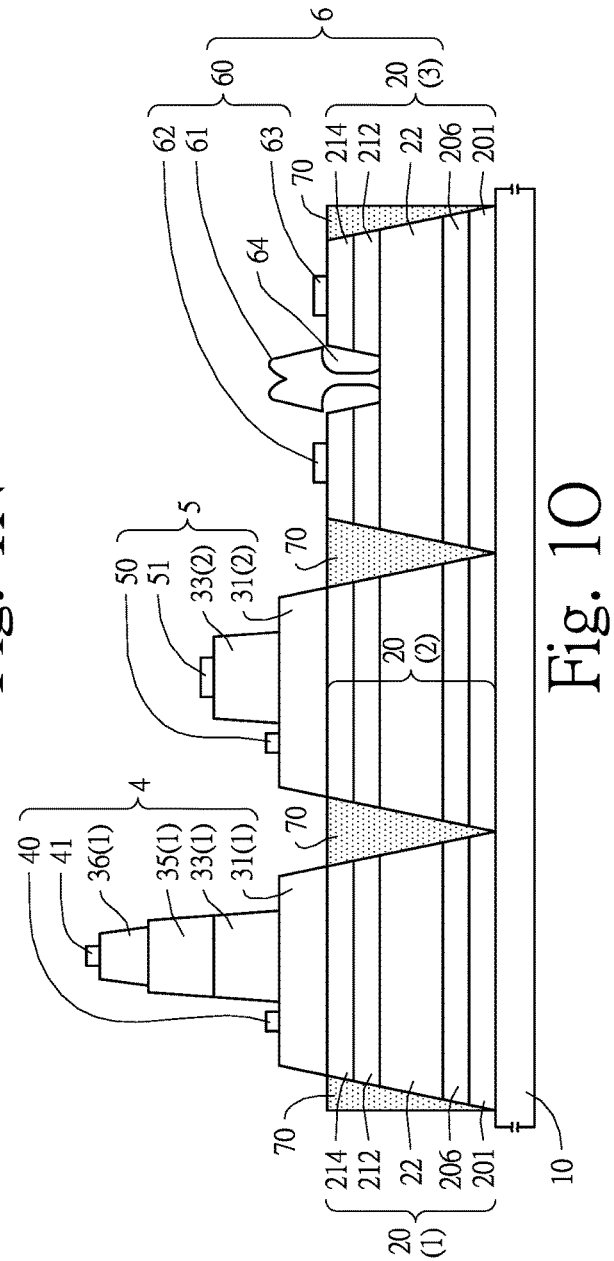

FIG. 1O illustrates an embodiment of a monolithically integrated circuit device with transistor and diodes in accordance with the present invention. The main structure of the embodiment FIG. 1O is basically the same with that of the embodiment FIG. 1N, except that the transistor epitaxial structure 20 further comprises a second cap layer 214. The second cap layer 214 forms on the first cap layer 212; the n-type doped epitaxial layer 31 (including 31(1) and 31(2)) forms on the second cap layer 214. The bottom of the gate recess 64 is defined by the Schottky barrier layer 22; the surrounding of the gate recess 64 is defined by the first cap layer 212 and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the widths of the gate recess 64 defined by the first cap layer 212 and the second cap layer 214 may be similar or different (not shown).

FIG. 1P illustrates an embodiment of a monolithically integrated circuit device with transistor and diodes in accordance with the present invention. The main structure of the embodiment FIG. 1P is basically the same with that of the embodiment FIG. 1N, except that the transistor epitaxial structure 20 further comprises a first cap etch stop layer 211; the first diode 4 further comprises a first part 30(1) of the bottom etch stop layer 30, a first part 32(1) of the first etch stop layer 32, and a first part 34(1) of the second etch stop layer 34; and the second diode 5 further comprises a second part 30(2) of the bottom etch stop layer 30 and a second part 32(2) of the first etch stop layer 32. The first cap etch stop layer 211 forms on the Schottky barrier layer 22; the first cap layer 212 forms on the first cap etch stop layer 211. The bottom of the gate recess 64 is defined by the Schottky barrier layer 22; the surrounding of the gate recess 64 is defined by the first cap layer 212 and the first cap etch stop layer 211. The bottom etch stop layers 30(1) and 30(2) form on the transistor epitaxial structures 20(1) and 20(2), respectively. The n-type doped epitaxial layers 31(1) and 31(2) form on the bottom etch stop layers 30(1) and 30(2), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. The second etch stop layer 34(1) forms on the first intrinsic epitaxial layer 33(1); the second intrinsic epitaxial layer 35(1) forms on the second etch stop layer 34(1). In some embodiments, the first cap etch stop layer 211, the bottom etch stop layer 30, the first etch stop layer 32, and the second etch stop layer 34 may be AlAs, AlGaAs, or InGaP, for example.

FIG. 1Q illustrates an embodiment of a monolithically integrated circuit device with transistor and diodes in accordance with the present invention. The main structure of the embodiment FIG. 1Q is basically the same with that of the embodiment FIG. 1P, except that the transistor epitaxial structure 20 further comprises a second cap layer 214 and a second cap etch stop layer 213. The second cap etch stop layer 213 forms on the first cap layer 212; the second cap layer 214 forms on the second cap etch stop layer 213; the bottom etch stop layer 30 (including 30(1) and 30(2)) forms on the second cap layer 214. The bottom of the gate recess 64 is defined by the Schottky barrier layer 22; the surrounding of the gate recess 64 is defined by the first cap etch stop layer 211, the first cap layer 212, the second cap etch stop layer 213, and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the second cap etch stop layer 213 may be AlAs, AlGaAs, or InGaP, for example. In some embodiments, the widths of the gate recess 64 defined by the first cap layer 212 and the second cap layer 214 may be similar or different (not shown). The embodiments FIGS. 1N, 1O, 1P, and 1Q integrate a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

FIG. 1R illustrates an embodiment of a monolithically integrated circuit device with transistor and diodes in accordance with the present invention. The main structure of the embodiment FIG. 1R is basically the same with that of the embodiment FIG. 1J, except that the second diode 5 further comprises a second part 36(2) of the p-type doped epitaxial layer 36. The p-type doped epitaxial layer 36(2) forms on the first intrinsic epitaxial layer 33(2); the second electrode 51 forms on the p-type doped epitaxial layer 36(2) so that the second diode 5 forms a PIN diode. The embodiment FIG. 1R integrates two PIN diodes having the same intrinsic layer thickness (first intrinsic epitaxial layers 33(1) and 33(2)) and an FET (transistor 6) on the compound semiconductor substrate 10.

FIG. 1S illustrates an embodiment of a monolithically integrated circuit device with transistor and diodes in accordance with the present invention. The main structure of the embodiment FIG. 1S is basically the same with that of the embodiment FIG. 1R, except that the transistor epitaxial structure 20 further comprises a second cap layer 214. The second cap layer 214 forms on the first cap layer 212; the n-type doped epitaxial layer 31 (including 31(1) and 31(2)) forms on the second cap layer 214. The bottom of the gate recess 64 is defined by the Schottky barrier layer 22; the surrounding of the gate recess 64 is defined by the first cap layer 212 and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the widths of the gate recess 64 defined by the first cap layer 212 and the second cap layer 214 may be similar or different (not shown).

FIG. 1T illustrates an embodiment of a monolithically integrated circuit device with transistor and diodes in accordance with the present invention. The main structure of the embodiment FIG. 1T is basically the same with that of the embodiment FIG. 1R, except that the transistor epitaxial structure 20 further comprises a first cap etch stop layer 211; the first diode 4 further comprises a first part 30(1) of a bottom etch stop layer 30 and a first part 32(1) of a first etch stop layer 32; and the second diode 5 further comprises a second part 30(2) of the bottom etch stop layer 30 and a second part 32(2) of the first etch stop layer 32. The first cap etch stop layer 211 forms on the Schottky barrier layer 22; the first cap layer 212 forms on the first cap etch stop layer 211. The bottom of the gate recess 64 is defined by the Schottky barrier layer 22; the surrounding of the gate recess 64 is defined by the first cap layer 212 and the first cap etch stop layer 211. The bottom etch stop layers 30(1) and 30(2) form on the transistor epitaxial structures 20(1) and 20(2), respectively. The n-type doped epitaxial layers 31(1) and 31(2) form on the bottom etch stop layers 30(1) and 30(2), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. In some embodiments, the first cap etch stop layer 211, the bottom etch stop layer 30, and the first etch stop layer 32 may be made of AlAs, AlGaAs, or InGaP, for example.

FIG. 1U illustrates an embodiment of a monolithically integrated circuit device with transistor and diodes in accordance with the present invention. The main structure of the embodiment FIG. 1U is basically the same with that of the embodiment FIG. 1T, except that the transistor epitaxial structure 20 further comprises a second cap layer 214 and a second cap etch stop layer 213. The second cap etch stop layer 213 forms on the first cap layer 212; the second cap layer 214 forms on the second cap etch stop layer 213; the bottom etch stop layer 30 (including 30(1) and 30(2)) forms on the second cap layer 214. The bottom of the gate recess 64 is defined by the Schottky barrier layer 22; the surrounding of the gate recess 64 is defined by the first cap etch stop layer 211, the first cap layer 212, the second cap etch stop layer 213, and the second cap layer 214. The source electrode 62 and the drain electrode 63 form on the second cap layer 214. The gate electrode 61 forms on the Schottky barrier layer 22 within the gate recess 64. In some embodiments, the second cap layer 214 is n-type doped GaAs (n-GaAs). In some embodiments, the second cap etch stop layer 213 may be AlAs, AlGaAs, or InGaP, for example.

In some embodiments, the widths of the gate recess 64 defined by the first cap layer 212 and the second cap layer 214 may be similar or different (not shown). The embodiments FIGS. 1R, 1S, 1T, and 1U integrate two PIN diodes having the same intrinsic layer thickness (first intrinsic epitaxial layers 33(1) and 33(2)) and an FET (transistor 6) on the compound semiconductor substrate 10.

In the embodiments of FIGS. 1D, 1L, and 1T, the transistor epitaxial structure 20 includes the first cap etch stop layer 211; the first diode 4 includes the first part 30(1) of the bottom etch stop layer 30 and the first part 32(1) of the first etch stop layer 32; and the second diode 5 includes the second part 30(2) of the bottom etch stop layer 30 and the second part 32(2) of the first etch stop layer 32. In some other embodiments (not shown), the main structure is similar to the structure of one of the embodiments FIGS. 1D, 1L, and 1T, except that the transistor epitaxial structure 20 does not include the first cap etch stop layer 211. In some other embodiments (not shown), the main structure is similar to the structure of one of the embodiments FIGS. 1D, 1L, and 1T, except that the first diode 4 does not include the bottom etch stop layer 30(1); and the second diode 5 does not include the bottom etch stop layer 30(2). In some other embodiments (not shown), the main structure is similar to the structure of one of the embodiments FIGS. 1D, 1L, and 1T, except that the first diode 4 does not include the first etch stop layer 32(1); and the second diode 5 does not include the first etch stop layer 32(2). In some other embodiments (not shown), the main structure is similar to the structure of one of the embodiments FIGS. 1D, 1L, and 1T, except that the transistor epitaxial structure 20 does not include the first cap etch stop layer 211; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1D, 1L, and 1T, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 1D, 1L, and 1T, except that the first diode 4 does not include the bottom etch stop layer 30(1) and the first etch stop layer 32(1); and the second diode 5 does not include the bottom etch stop layer 30(2) and the first etch stop layer 32(2).

In the embodiments of FIGS. 1E, 1M, and 1U, the transistor epitaxial structure 20 includes the first cap etch stop layer 211 and the second cap etch stop layer 213; the first diode 4 includes the first part 30(1) of the bottom etch stop layer 30 and the first part 32(1) of the first etch stop layer 32; and the second diode 5 includes the second part 30(2) of the bottom etch stop layer 30 and the second part 32(2) of the first etch stop layer 32. In some other embodiments (not shown), the main structure is similar to the structure of one of the embodiments FIGS. 1E, 1M, and 1U, except that the transistor epitaxial structure 20 does not include the first cap etch stop layer 211. In some other embodiments (not shown), the main structure is similar to the structure of one of the embodiments FIGS. 1E, 1M, and 1U, except that the transistor epitaxial structure 20 does not include the second cap etch stop layer 213. In some other embodiments (not shown), the main structure is similar to the structure of one of the embodiments FIGS. 1E, 1M, and 1U, except that the first diode 4 does not include the bottom etch stop layer 30(1); and the second diode 5 does not include the bottom etch stop layer 30(2). In some other embodiments (not shown), the main structure is similar to the structure of one of the embodiments FIGS. 1E, 1M, and 1U, except that the first diode 4 does not include the first etch stop layer 32(1); and the second diode 5 does not include the first etch stop layer 32(2). In some other embodiments (not shown), the main structure is similar to the structure of one of the embodiments FIGS. 1E, 1M, and 1U, except that the transistor epitaxial structure 20 does not include the first cap etch stop layer 211 and the second cap etch stop layer 213. In some other embodiments (not shown), the main structure is similar to the structure of one of the embodiments FIGS. 1E, 1M, and 1U, except that the transistor epitaxial structure 20 does not include the first cap etch stop layer 211; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1E, 1M, and 1U, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 1E, 1M, and 1U, except that the transistor epitaxial structure 20 does not include the second cap etch stop layer 213; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1E, 1M, and 1U, except that the transistor epitaxial structure 20 does not include the second cap etch stop layer 213; the first diode 4 does not include the first etch stop layer 32(1); and the second diode 5 does not include the first etch stop layer 32(2). In some other embodiments (not shown), the main structure is similar to the structure of one of the embodiments FIGS. 1E, 1M, and 1U, except that the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1E, 1M, and 1U, except that the transistor epitaxial structure 20 does not include the first cap etch stop layer 211 and the second cap etch stop layer 213; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1E, 1M, and 1U, except that the transistor epitaxial structure 20 does not include the first cap etch stop layer 211 and the second cap etch stop layer 213; the first diode 4 does not include the first etch stop layer 32(1); and the second diode 5 does not include the first etch stop layer 32(2). In some other embodiments (not shown), the main structure is similar to the structure of one of the embodiments FIGS. 1E, 1M, and 1U, except that the transistor epitaxial structure 20 does not include the first cap etch stop layer 211; the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1E, 1M, and 1U, except that the transistor epitaxial structure 20 does not include the second cap etch stop layer 213; the first diode 4 does not include the bottom etch stop layer 30(1) and the first etch stop layer 32(1); and the second diode 5 does not include the bottom etch stop layer 30(2) and the first etch stop layer 32(2).

In the embodiments of FIGS. 1H and 1P, the transistor epitaxial structure 20 includes the first cap etch stop layer 211; the first diode 4 includes the first part 30(1) of the bottom etch stop layer 30, the first part 32(1) of the first etch stop layer 32, and the first part 34(1) of the second etch stop layer 34; and the second diode 5 includes the second part 30(2) of the bottom etch stop layer 30 and the second part 32(2) of the first etch stop layer 32. In some other embodiments (not shown), the main structure is similar to the structure of one of the embodiments FIGS. 1H and 1P, except that the transistor epitaxial structure 20 does not include the first cap etch stop layer 211. In some other embodiments (not shown), the main structure is similar to the structure of one of the embodiments FIGS. 1H and 1P, except that the first diode 4 does not include the bottom etch stop layer 30(1); and the second diode 5 does not include the bottom etch stop layer 30(2). In some other embodiments (not shown), the main structure is similar to the structure of one of the embodiments FIGS. 1H and 1P, except that the first diode 4 does not include the first etch stop layer 32(1); and the second diode 5 does not include the first etch stop layer 32(2). In some other embodiments (not shown), the main structure is similar to the structure of one of the embodiments FIGS. 1H and 1P, except that the first diode 4 does not include the second etch stop layer 34(1). In some other embodiments (not shown), the main structure is similar to the structure of one of the embodiments FIGS. 1H and 1P, except that the transistor epitaxial structure 20 does not include the first cap etch stop layer 211; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1H and 1P, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 1H and 1P, except that the transistor epitaxial structure 20 does not include the first cap etch stop layer 211; the first diode 4 does not include the second etch stop layer 34(1). In some other embodiments (not shown), the main structure is similar to the structure of one of the embodiments FIGS. 1H and 1P, except that the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1H and 1P, except that the first diode 4 does not include the bottom etch stop layer 30(1) and the second etch stop layer 34(1); and the second diode 5 does not include the bottom etch stop layer 30(2). In some other embodiments (not shown), the main structure is similar to the structure of one of the embodiments FIGS. 1H and 1P, except that the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 1H and 1P, except that the transistor epitaxial structure 20 does not include the first cap etch stop layer 211; the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1H and 1P, except that the transistor epitaxial structure 20 does not include the first cap etch stop layer 211; the first diode 4 does not include the bottom etch stop layer 30(1) and the second etch stop layer 34(1); and the second diode 5 does not include the bottom etch stop layer 30(2). In some other embodiments (not shown), the main structure is similar to the structure of one of the embodiments FIGS. 1H and 1P, except that the transistor epitaxial structure 20 does not include the first cap etch stop layer 211; the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 1H and 1P, except that the first diode 4 does not include the bottom etch stop layer 30(1), the first etch stop layer 32(1), and the second etch stop layer 34(1); and the second diode 5 does not include the bottom etch stop layer 30(2) and the first etch stop layer 32(2).

In the embodiments of FIGS. 1I and 1Q, the transistor epitaxial structure 20 includes the first cap etch stop layer 211 and the second cap etch stop layer 213; the first diode 4 includes the first part 30(1) of the bottom etch stop layer 30, the first part 32(1) of the first etch stop layer 32, and the first part 34(1) of the second etch stop layer 34; and the second diode 5 includes the second part 30(2) of the bottom etch stop layer 30 and the second part 32(2) of the first etch stop layer 32. In some other embodiments (not shown), the main structure is similar to the structure of one of the embodiments FIGS. 1I and 1Q, except that the transistor epitaxial structure 20 does not include the first cap etch stop layer 211. In some other embodiments (not shown), the main structure is similar to the structure of one of the embodiments FIGS. 1I and 1Q, except that the transistor epitaxial structure 20 does not include the second cap etch stop layer 213. In some other embodiments (not shown), the main structure is similar to the structure of one of the embodiments FIGS. 1I and 1Q, except that the first diode 4 does not include the bottom etch stop layer 30(1); and the second diode 5 does not include the bottom etch stop layer 30(2). In some other embodiments (not shown), the main structure is similar to the structure of one of the embodiments FIGS. 1I and 1Q, except that the first diode 4 does not include the first etch stop layer 32(1); and the second diode 5 does not include the first etch stop layer 32(2). In some other embodiments (not shown), the main structure is similar to the structure of one of the embodiments FIGS. 1I and 1Q, except that the first diode 4 does not include the second etch stop layer 34(1). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213. In some other embodiments (not shown), the main structure is similar to the structure of one of the embodiments FIGS. 1I and 1Q, except that the transistor epitaxial structure 20 does not include the first cap etch stop layer 211; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 1I and 1Q, except that the transistor epitaxial structure 20 does not include the first cap etch stop layer 211; the first diode 4 does not include the second etch stop layer 34(1). In some other embodiments (not shown), the main structure is similar to the structure of one of the embodiments FIGS. 1I and 1Q, except that the transistor epitaxial structure 20 does not include the second cap etch stop layer 213; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the second cap etch stop layer 213; the first diode 4 does not include the first etch stop layer 32(1); and the second diode 5 does not include the first etch stop layer 32(2). In some other embodiments (not shown), the main structure is similar to the structure of one of the embodiments FIGS. 1I and 1Q, except that the transistor epitaxial structure 20 does not include the second cap etch stop layer 213; the first diode 4 does not include the second etch stop layer 34(1). In some other embodiments (not shown), the main structure is similar to the structure of one of the embodiments FIGS. 1I and 1Q, except that the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the first diode 4 does not include the bottom etch stop layer 30(1) and the second etch stop layer 34(1); and the second diode 5 does not include the bottom etch stop layer 30(2). In some other embodiments (not shown), the main structure is similar to the structure of one of the embodiments FIGS. 1I and 1Q, except that the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213; the first diode 4 does not include the bottom etch stop layer 30(1); and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213; the first diode 4 does not include the first etch stop layer 32(1); and the second diode 5 does not include the first etch stop layer 32(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213; the first diode 4 does not include the second etch stop layer 34(1). In some other embodiments, the main structure is similar to the structure of one of the embodiments FIGS. 1I and 1Q, except that the transistor epitaxial structure 20 does not include the first cap etch stop layer 211; the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the transistor epitaxial structure 20 does not include the first cap etch stop layer 211; the first diode 4 does not include the bottom etch stop layer 30(1) and the second etch stop layer 34(1);

and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the first cap etch stop layer 211; the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 1I and 1Q, except that the transistor epitaxial structure 20 does not include the second cap etch stop layer 213; the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the transistor epitaxial structure 20 does not include the second cap etch stop layer 213; the first diode 4 does not include the bottom etch stop layer 30(1) and the second etch stop layer 34(1); and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the second cap etch stop layer 213; the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 1I and 1Q, except that the first diode 4 does not include the bottom etch stop layer 30(1), the first etch stop layer 32(1), and the second etch stop layer 34(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213; the first diode 4 does not include the bottom etch stop layer 30(1) and the first etch stop layer 32(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213; the first diode 4 does not include the bottom etch stop layer 30(1) and the second etch stop layer 34(1); and the second diode 5 does not include the bottom etch stop layer 30(2). In some other embodiments (not shown), the main structure is similar to the structure of one of the embodiments FIGS. 1I and 1Q, except that the transistor epitaxial structure 20 does not include the first cap etch stop layer 211 and the second cap etch stop layer 213;

the first diode 4 does not include the first etch stop layer 32(1) and the second etch stop layer 34(1); and the second diode 5 does not include the first etch stop layer 32(1). In some other embodiments (not shown), the main structure is similar to the structure of one of the embodiments FIGS. 1I and 1Q, except that the transistor epitaxial structure 20 does not include the second cap etch stop layer 213; the first diode 4 does not include the bottom etch stop layer 30(1), the first etch stop layer 32(1), and the second etch stop layer 34(1); and the second diode 5 does not include the bottom etch stop layer 30(2) and the first etch stop layer 32(2). In some other embodiments (not shown), the main structure is similar to the structure of one of the embodiments FIGS. 1I and 1Q, except that the transistor epitaxial structure 20 does not include the first cap etch stop layer 211; the first diode 4 does not include the bottom etch stop layer 30(1), the first etch stop layer 32(1), and the second etch stop layer 34(1); and the second diode 5 does not include the bottom etch stop layer 30(2) and the first etch stop layer 32(2).

Figure 2B:
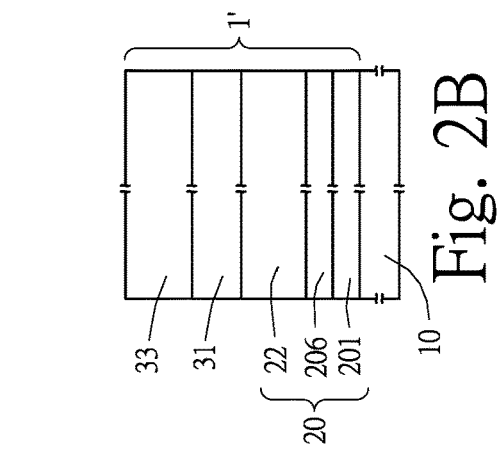
FIGS. 2A-2U are simplified cross-sectional side views of embodiments of a monolithically integrated circuit device with transistor and diodes in accordance with the present invention.
Figure 2A:
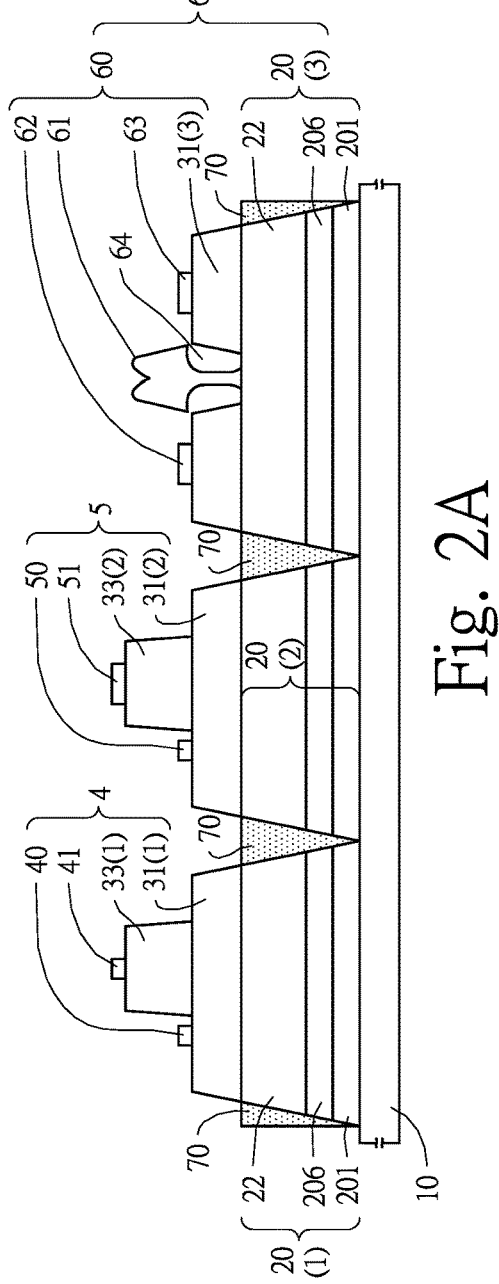

FIG. 2A illustrates an embodiment of a monolithically integrated circuit device with transistor and diodes in accordance with the present invention. In this particular example, the monolithically integrated circuit device with transistor and diodes comprises a compound semiconductor substrate 10, a transistor epitaxial structure 20, a first diode 4, a second diode 5, and a transistor upper structure 60. The transistor epitaxial structure 20 forms on the compound semiconductor substrate 10, wherein the transistor epitaxial structure 20 comprises a buffer layer 201, a channel layer 206, and a Schottky barrier layer 22. The buffer layer 201 forms on the compound semiconductor substrate 10; the channel layer 206 forms on the buffer layer 201; the Schottky barrier layer 22 forms on the channel layer 206. The transistor epitaxial structure 20 comprises a first part 20(1), a second part 20(2), and a third part 20(3). The isolation regions 70 surround the transistor epitaxial structures 20(1), 20(2), and 20(3). The first diode 4, the second diode 5, and the transistor upper structure 60 form on the first transistor epitaxial structure 20(1), the second transistor epitaxial structure 20(2), and the third transistor epitaxial structure 20(3), respectively. An n-type doped epitaxial layer 31 forms on the transistor epitaxial structure 20, wherein the n-type doped epitaxial layer 31 comprises a first part 31(1), a second part 31(2), and a third part 31(3); wherein the n-type doped epitaxial layers 31(1), 31(2), and 31(3) form on the transistor epitaxial structure 20(1), 20(2), and 20(3), respectively. A first intrinsic epitaxial layer 33 forms on the n-type doped epitaxial layer 31, wherein the first intrinsic epitaxial layer 33 comprises a first part 33(1) and a second part 33(2). The first diode 4 comprises the n-type doped epitaxial layer 31(1), the first intrinsic epitaxial layer 33(1), a first electrode 40, and a second electrode 41. The first intrinsic epitaxial layer 33(1) forms on one portion of the n-type doped epitaxial layer 31(1); while the first electrode 40 forms on the other portion of the n-type doped epitaxial layer 31(1). The second electrode 41 forms on the first intrinsic epitaxial layer 33(1), forming a Schottky contact so that the first diode 4 forms a Schottky diode. The second diode 5 comprises the n-type doped epitaxial layer 31(2), the first intrinsic epitaxial layer 33(2), a first electrode 50, and a second electrode 51. The first intrinsic epitaxial layer 33(2) forms on one portion of the n-type doped epitaxial layer 31(2); while the first electrode 50 forms on the other portion of the n-type doped epitaxial layer 31(2). The second electrode 51 forms on the first intrinsic epitaxial layer 33(2), forming a Schottky contact so that the second diode 5 forms a Schottky diode. In current embodiment, the transistor upper structure 60 comprises the third part 31(3) of the n-type doped epitaxial layer 31, a gate electrode 61, a source electrode 62, and a drain electrode 63; wherein the transistor upper structure 60 and the third part 20(3) of the transistor epitaxial structure 20 form a transistor 6. In current embodiment, the transistor 6 is an FET. The source electrode 62 forms on one portion of the n-type doped epitaxial layer 31(3), while the drain electrode 63 forms on the other portion of the n-type doped epitaxial layer 31(3). The transistor 6 further comprises a gate recess 64 locating between the source electrode 62 and the drain electrode 63, wherein a bottom of the gate recess 64 is defined by the Schottky barrier layer 22, a surrounding of the gate recess 64 is defined by the n-type doped epitaxial layer 31(3). The gate electrode 61 forms on the Schottky barrier layer 22 within the gate recess 64. In current embodiment, the third part 31(3) of the n-type doped epitaxial layer 31 of the transistor 6 may act as a cap layer in the transistor 6. The embodiment FIG. 2A integrates two Schottky diodes having the same intrinsic layer thickness (first intrinsic epitaxial layers 33(1) and 33(2)) and an FET (transistor 6) on the compound semiconductor substrate 10. FIG. 2B shows a cross-sectional side view of an epitaxial structure of the present embodiment. A compound semiconductor epitaxial structure 1' forms on a compound semiconductor substrate 10, wherein the compound semiconductor epitaxial structure 1' comprises a transistor epitaxial structure 20, an n-type doped epitaxial layer 31, and a first intrinsic epitaxial layer 33. The transistor epitaxial structure 20 comprises a buffer layer 201, a channel layer 206, and a Schottky barrier layer 22. The buffer layer 201 forms on the compound semiconductor substrate 10; the channel layer 206 forms on the buffer layer 201; the Schottky barrier layer 22 forms on the channel layer 206; the n-type doped epitaxial layer 31 forms on the Schottky barrier layer 22; the first intrinsic epitaxial layer 33 forms on the n-type doped epitaxial layer 31. The embodiment FIG. 2A of the present invention can be fabricated using the compound semiconductor epitaxial structure 1' shown in FIG. 2B. This invention only needs a single structure in a single growth run and a simplified process without complex cleaning procedures and epitaxial regrowths, rendering the realization of the monolithically integrated FET-Diode circuit devices with greatly reduced process steps, cost, size, and highly improved performance.

In some embodiments, the compound semiconductor substrate 10 may be GaAs or InP, for example. In some preferable embodiments, the compound semiconductor substrate 10 is GaAs; the buffer layer 201 is composed of GaAs and AlGaAs; the channel layer 206 is intrinsic InGaAs (i-InGaAs); the Schottky barrier layer 22 is intrinsic AlGaAs (i-AlGaAs) or n-type doped AlGaAs (n-AlGaAs); the n-type doped epitaxial layer 31 is n-type doped GaAs (n-GaAs); the first intrinsic epitaxial layer 33 is intrinsic GaAs (i-GaAs). In some embodiments, the transistor 6 is a pHEMT.

Figure 2C:
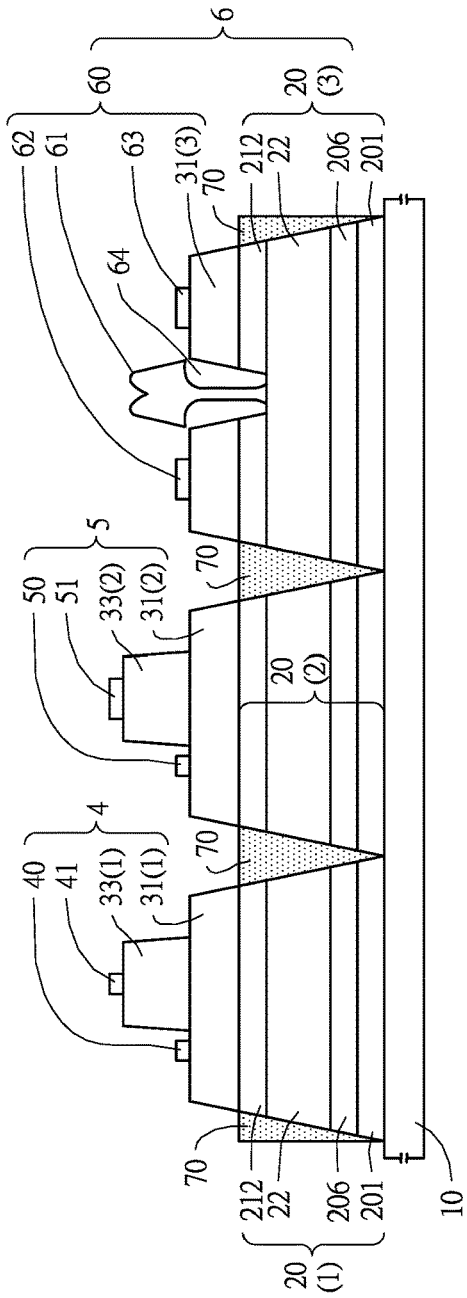

FIG. 2C illustrates an embodiment of a monolithically integrated circuit device with transistor and diodes in accordance with the present invention. The main structure of the embodiment FIG. 2C is basically the same with that of the embodiment FIG. 2A, except that the transistor epitaxial structure 20 further comprises a first cap layer 212. The first cap layer 212 forms on the Schottky barrier layer 22; the n-type doped epitaxial layer 31 (including 31(1), 31(2), and 31(3)) forms on the first cap layer 212. The bottom of the gate recess 64 is defined by the Schottky barrier layer 22; the surrounding of the gate recess 64 is defined by the first cap layer 212 and the n-type doped epitaxial layer 31(3). In some embodiments, the first cap layer 212 is n-type doped GaAs (n-GaAs). In some embodiments, the widths of the gate recess 64 defined by the first cap layer 212 and the n-type doped epitaxial layer 31(3) may be similar or different (not shown).

Figure 2D:
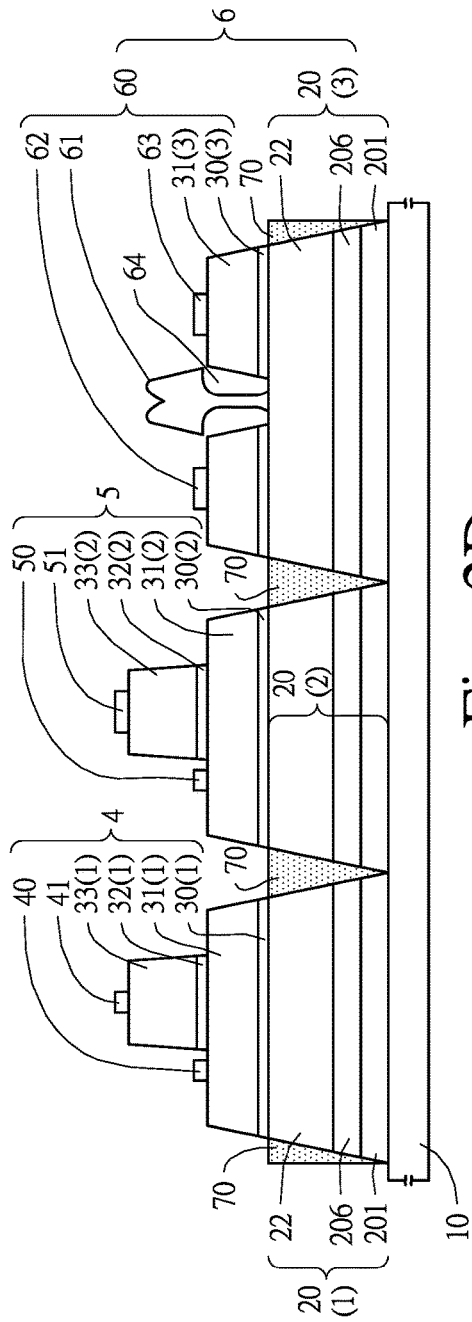

FIG. 2D illustrates an embodiment of a monolithically integrated circuit device with transistor and diodes in accordance with the present invention. The main structure of the embodiment FIG. 2D is basically the same with that of the embodiment FIG. 2A, except that the first diode 4 further comprises a first part 30(1) of a bottom etch stop layer 30 and a first part 32(1) of a first etch stop layer 32; the second diode 5 further comprises a second part 30(2) of the bottom etch stop layer 30 and a second part 32(2) of the first etch stop layer 32; and the transistor upper structure 60 further comprises a third part 30(3) of the bottom etch stop layer 30. The bottom etch stop layers 30(1), 30(2), and 30(3) form on the transistor epitaxial structures 20(1), 20(2), and 20(3), respectively. The n-type doped epitaxial layers 31(1), 31(2), and 31(3) form on the bottom etch stop layers 30(1), 30(2), and 30(3), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. The bottom of the gate recess 64 is defined by the Schottky barrier layer 22; the surrounding of the gate recess 64 is defined by the bottom etch stop layer 30(3) and the n-type doped epitaxial layer 31(3). In some embodiments, the bottom etch stop layer 30 and the first etch stop layer 32 may be AlAs, AlGaAs, or InGaP, for example.

Figure 2E:
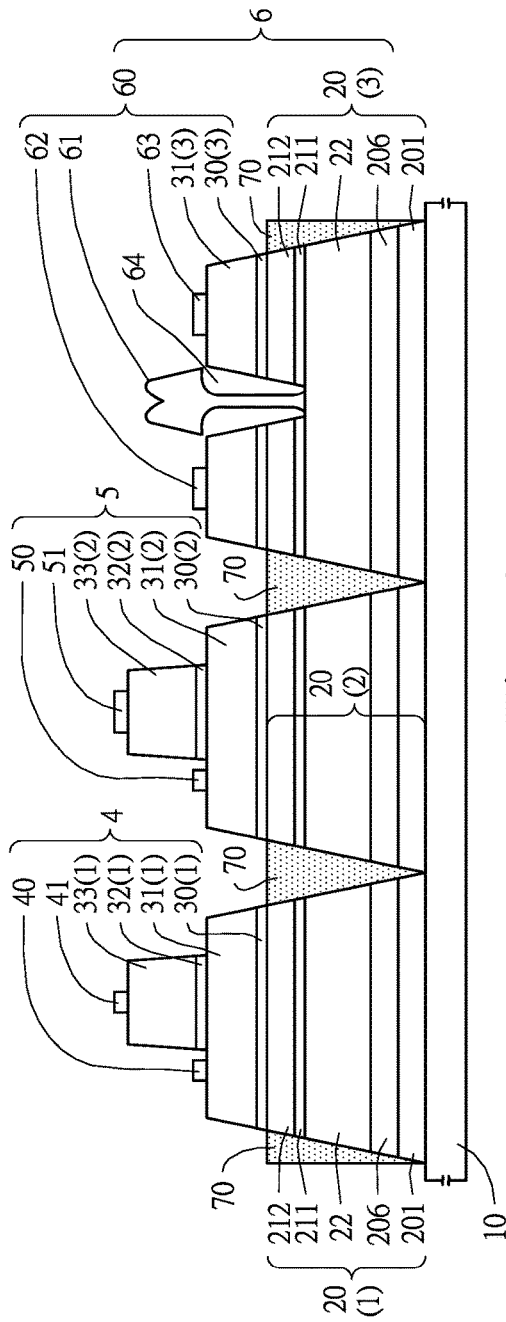

FIG. 2E illustrates an embodiment of a monolithically integrated circuit device with transistor and diodes in accordance with the present invention. The main structure of the embodiment FIG. 2E is basically the same with that of the embodiment FIG. 2D, except that the transistor epitaxial structure 20 further comprises a first cap etch stop layer 211 and a first cap layer 212. The first cap etch stop layer 211 forms on the Schottky barrier layer 22; the first cap layer 212 forms on the first cap etch stop layer 211; the bottom etch stop layer 30 (including 30(1), 30(2), and 30(3)) forms on the first cap layer 212. The bottom of the gate recess 64 is defined by the Schottky barrier layer 22; the surrounding of the gate recess 64 is defined by the first cap etch stop layer 211, the first cap layer 212, the bottom etch stop layer 30(3), and the n-type doped epitaxial layer 31(3). In some embodiments, the first cap layer 212 is n-type doped GaAs (n-GaAs). In some embodiments, the first cap etch stop layer 211 may be AlAs, AlGaAs, or InGaP, for example. In some embodiments, the widths of the gate recess 64 defined by the n-type doped epitaxial layer 31(3) and the first cap layer 212 may be similar or different (not shown). The embodiments FIGS. 2A, 2C, 2D, and 2E integrate two Schottky diodes having the same intrinsic layer thickness (first intrinsic epitaxial layers 33(1) and 33(2)) and an FET (transistor 6) on the compound semiconductor substrate 10.

Figure 2F:
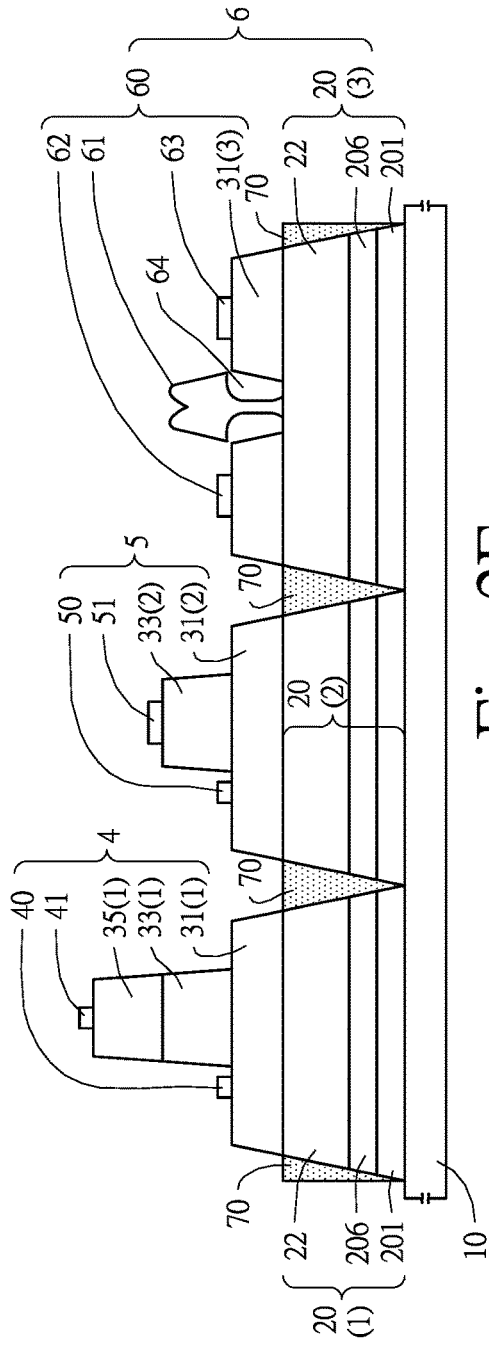

FIG. 2F illustrates an embodiment of a monolithically integrated circuit device with transistor and diodes in accordance with the present invention. The main structure of the embodiment FIG. 2F is basically the same with that of the embodiment FIG. 2A, except that the first diode 4 further comprises a first part 35(1) of a second intrinsic epitaxial layer 35. The second intrinsic epitaxial layer 35(1) forms on the first intrinsic epitaxial layer 33(1). The second electrode 41 forms on the second intrinsic epitaxial layer 35(1), forming a Schottky contact so that the first diode 4 forms a Schottky diode. In some preferable embodiments, the second intrinsic epitaxial layer 35 is intrinsic GaAs (i-GaAs). The embodiment FIG. 2F integrates a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

Figure 2G:
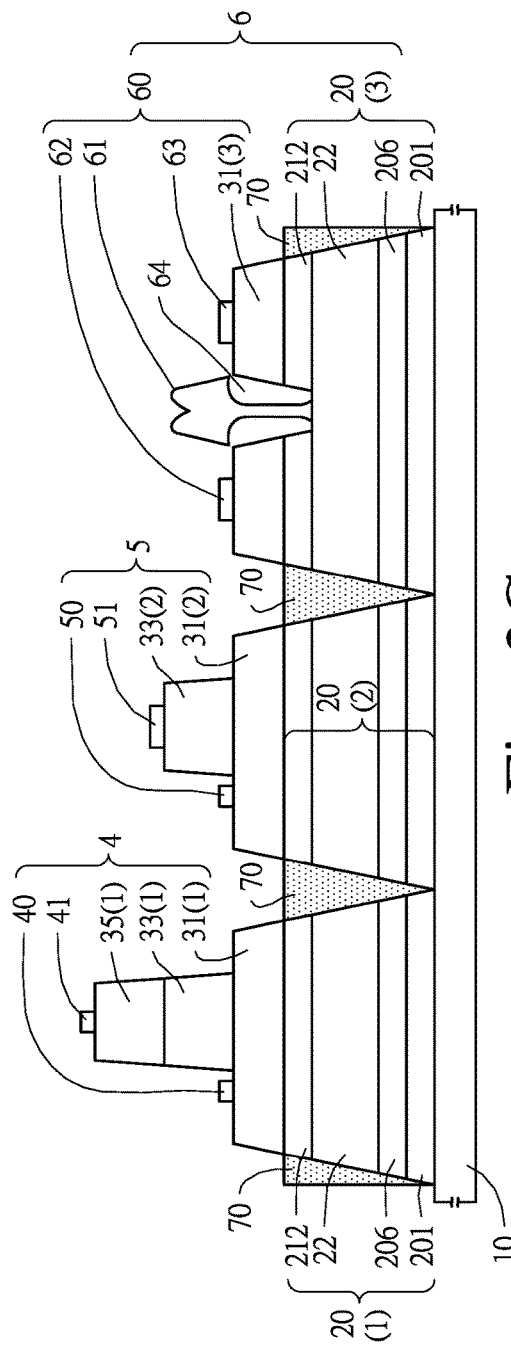

FIG. 2G illustrates an embodiment of a monolithically integrated circuit device with transistor and diodes in accordance with the present invention. The main structure of the embodiment FIG. 2G is basically the same with that of the embodiment FIG. 2F, except that the transistor epitaxial structure 20 further comprises a first cap layer 212. The first cap layer 212 forms on the Schottky barrier layer 22; the n-type doped epitaxial layer 31 (including 31(1), 31(2), and 31(3)) forms on the first cap layer 212. The bottom of the gate recess 64 is defined by the Schottky barrier layer 22; the surrounding of the gate recess 64 is defined by the first cap layer 212 and the n-type doped epitaxial layer 31(3). In some embodiments, the first cap layer 212 is n-type doped GaAs (n-GaAs). In some embodiments, the widths of the gate recess 64 defined by the first cap layer 212 and the n-type doped epitaxial layer 31(3) may be similar or different (not shown).

Figure 2H:
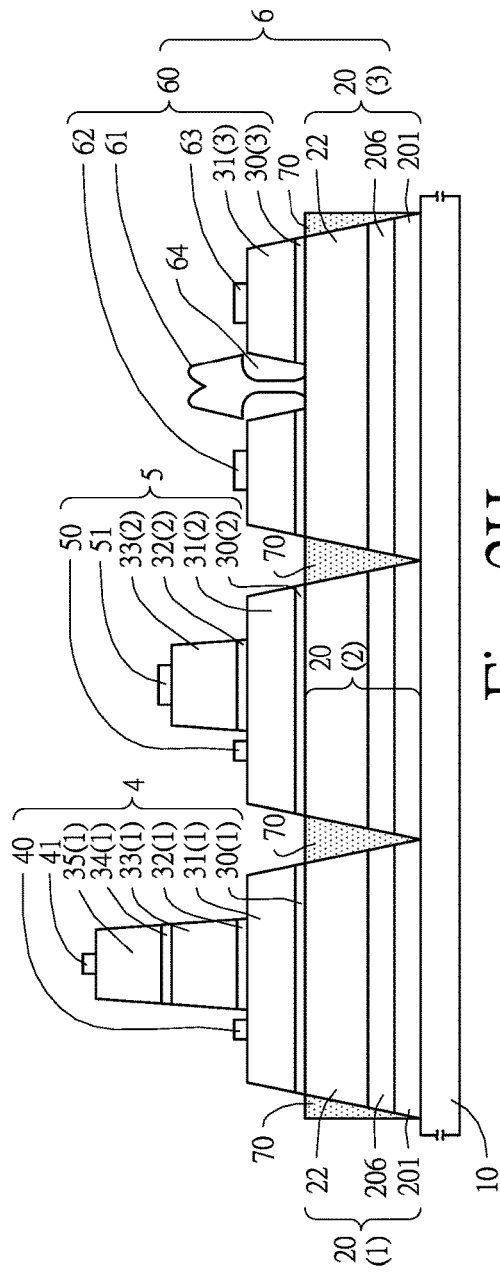

FIG. 2H illustrates an embodiment of a monolithically integrated circuit device with transistor and diodes in accordance with the present invention. The main structure of the embodiment FIG. 2H is basically the same with that of the embodiment FIG. 2F, except that the first diode 4 further comprises a first part 30(1) of the bottom etch stop layer 30, a first part 32(1) of the first etch stop layer 32, and a first part 34(1) of the second etch stop layer 34; the second diode 5 further comprises a second part 30(2) of the bottom etch stop layer 30 and a second part 32(2) of the first etch stop layer 32; and the transistor upper structure 60 further comprises a third part 30(3) of the bottom etch stop layer 30. The bottom etch stop layers 30(1), 30(2), and 30(3) form on the transistor epitaxial structures 20(1), 20(2), and 20(3), respectively. The n-type doped epitaxial layers 31(1), 31(2), and 31(3) form on the bottom etch stop layers 30(1), 30(2), and 30(3), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. The second etch stop layer 34(1) forms on the first intrinsic epitaxial layer 33(1); the second intrinsic epitaxial layer 35(1) forms on the second etch stop layer 34(1). The bottom of the gate recess 64 is defined by the Schottky barrier layer 22; the surrounding of the gate recess 64 is defined by the bottom etch stop layer 30(3) and the n-type doped epitaxial layer 31(3). In some embodiments, the bottom etch stop layer 30, the first etch stop layer 32, and the second etch stop layer 34 may be AlAs, AlGaAs, or InGaP, for example.

Figure 2I:
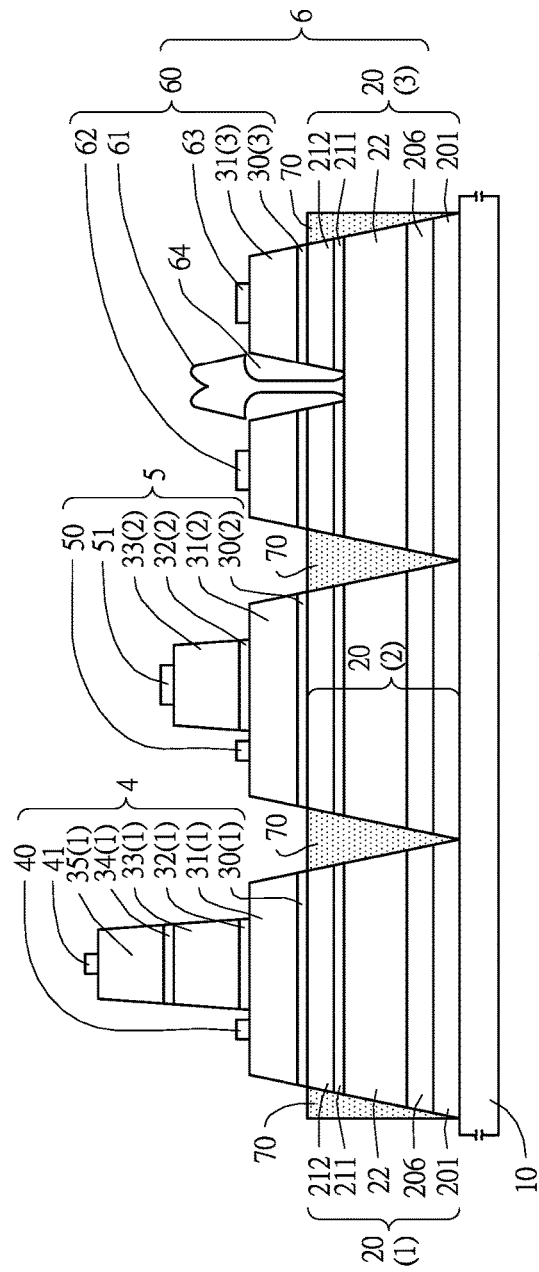

FIG. 2I illustrates an embodiment of a monolithically integrated circuit device with transistor and diodes in accordance with the present invention. The main structure of the embodiment FIG. 2I is basically the same with that of the embodiment FIG. 2H, except that the transistor epitaxial structure 20 further comprises a first cap etch stop layer 211 and a first cap layer 212. The first cap etch stop layer 211 forms on the Schottky barrier layer 22; the first cap layer 212 forms on the first cap etch stop layer 211; the bottom etch stop layer 30 (including 30(1), 30(2), and 30(3)) forms on the first cap layer 212. The bottom of the gate recess 64 is defined by the Schottky barrier layer 22; the surrounding of the gate recess 64 is defined by the first cap etch stop layer 211, the first cap layer 212, the bottom etch stop layer 30(3), and the n-type doped epitaxial layer 31(3). In some embodiments, the first cap layer 212 is n-type doped GaAs (n-GaAs). In some embodiments, the first cap etch stop layer 211 may be AlAs, AlGaAs, or InGaP, for example. In some embodiments, the widths of the gate recess 64 defined by the n-type doped epitaxial layer 31(3) and the first cap layer 212 may be similar or different (not shown). The embodiments FIGS. 2F, 2G, 2H, and 2I integrate a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

FIG. 2J illustrates an embodiment of a monolithically integrated circuit device with transistor and diodes in accordance with the present invention. The main structure of the embodiment FIG. 2J is basically the same with that of the embodiment FIG. 2A, except that the first diode 4 further comprises a first part 36(1) of a p-type doped epitaxial layer 36. The p-type doped epitaxial layer 36(1) forms on the first intrinsic epitaxial layer 33(1); the second electrode 41 forms on the p-type doped epitaxial layer 36(1) so that the first diode 4 forms a PIN diode. In some embodiments, the p-type doped epitaxial layer 36 is p-type doped GaAs (p-GaAs). The embodiment FIG. 2J integrates a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness.

FIG. 2K illustrates an embodiment of a monolithically integrated circuit device with transistor and diodes in accordance with the present invention. The main structure of the embodiment FIG. 2K is basically the same with that of the embodiment FIG. 2J, except that the transistor epitaxial structure 20 further comprises a first cap layer 212. The first cap layer 212 forms on the Schottky barrier layer 22; the n-type doped epitaxial layer 31 (including 31(1), 31(2), and 31(3)) forms on the first cap layer 212. The bottom of the gate recess 64 is defined by the Schottky barrier layer 22; the surrounding of the gate recess 64 is defined by the first cap layer 212 and the n-type doped epitaxial layer 31(3). In some embodiments, the first cap layer 212 is n-type doped GaAs (n-GaAs). In some embodiments, the widths of the gate recess 64 defined by the first cap layer 212 and the n-type doped epitaxial layer 31(3) may be similar or different (not shown).

FIG. 2L illustrates an embodiment of a monolithically integrated circuit device with transistor and diodes in accordance with the present invention. The main structure of the embodiment FIG. 2L is basically the same with that of the embodiment FIG. 2J, except that the first diode 4 further comprises a first part 30(1) of a bottom etch stop layer 30 and a first part 32(1) of a first etch stop layer 32; the second diode 5 further comprises a second part 30(2) of the bottom etch stop layer 30 and a second part 32(2) of the first etch stop layer 32; and the transistor upper structure 60 further comprises a third part 30(3) of the bottom etch stop layer 30. The bottom etch stop layers 30(1), 30(2), and 30(3) form on the transistor epitaxial structures 20(1), 20(2), and 20(3), respectively. The n-type doped epitaxial layers 31(1), 31(2), and 31(3) form on the bottom etch stop layers 30(1), 30(2), and 30(3), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. The bottom of the gate recess 64 is defined by the Schottky barrier layer 22; the surrounding of the gate recess 64 is defined by the bottom etch stop layer 30(3) and the n-type doped epitaxial layer 31(3). In some embodiments, the bottom etch stop layer 30 and the first etch stop layer 32 may be AlAs, AlGaAs, or InGaP, for example.

FIG. 2M illustrates an embodiment of a monolithically integrated circuit device with transistor and diodes in accordance with the present invention. The main structure of the embodiment FIG. 2M is basically the same with that of the embodiment FIG. 2L, except that the transistor epitaxial structure 20 further comprises a first cap etch stop layer 211 and a first cap layer 212. The first cap etch stop layer 211 forms on the Schottky barrier layer 22; the first cap layer 212 forms on the first cap etch stop layer 211; the bottom etch stop layer 30 (including 30(1), 30(2), and 30(3)) forms on the first cap layer 212. The bottom of the gate recess 64 is defined by the Schottky barrier layer 22; the surrounding of the gate recess 64 is defined by the first cap etch stop layer 211, the first cap layer 212, the bottom etch stop layer 30(3), and the n-type doped epitaxial layer 31(3). In some embodiments, the first cap layer 212 is n-type doped GaAs (n-GaAs). In some embodiments, the first cap etch stop layer 211 may be AlAs, AlGaAs, or InGaP, for example. In some embodiments, the widths of the gate recess 64 defined by the n-type doped epitaxial layer 31(3) and the first cap layer 212 may be similar or different (not shown). The embodiments FIGS. 2J, 2K, 2L, and 2M integrate a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness.

Figure 2N:
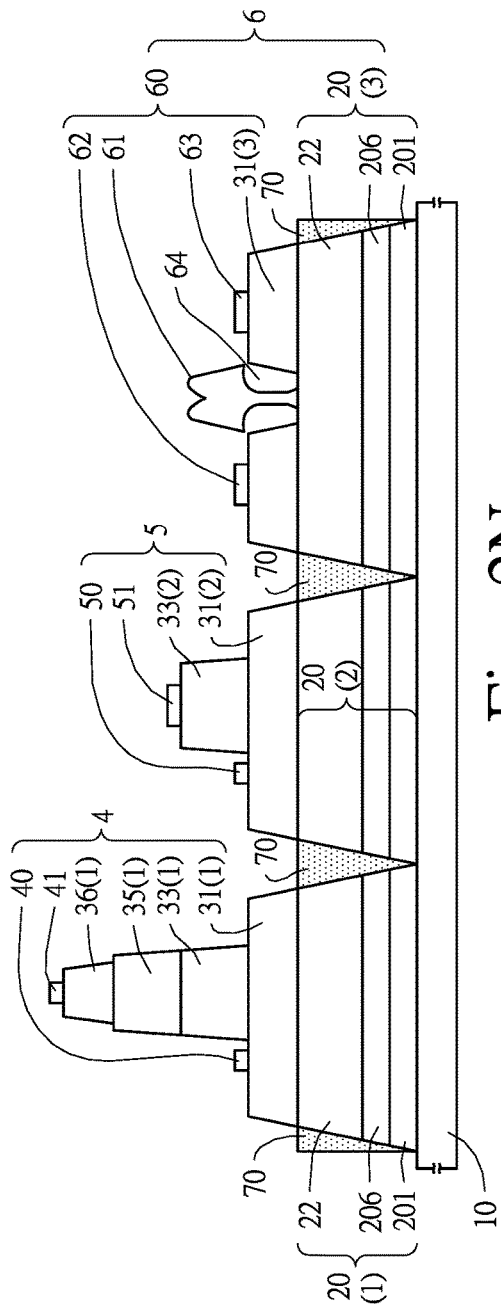

FIG. 2N illustrates an embodiment of a monolithically integrated circuit device with transistor and diodes in accordance with the present invention. The main structure of the embodiment FIG. 2N is basically the same with that of the embodiment FIG. 2J, except that the first diode 4 further comprises a first part 35(1) of a second intrinsic epitaxial layer 35. The second intrinsic epitaxial layer 35(1) forms on the first intrinsic epitaxial layer 33(1); the p-type doped epitaxial layer 36(1) forms on the second intrinsic epitaxial layer 35(1). In some preferable embodiments, the second intrinsic epitaxial layer 35 is intrinsic GaAs (i-GaAs). The embodiment FIG. 2N integrates a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

Figure 2O:
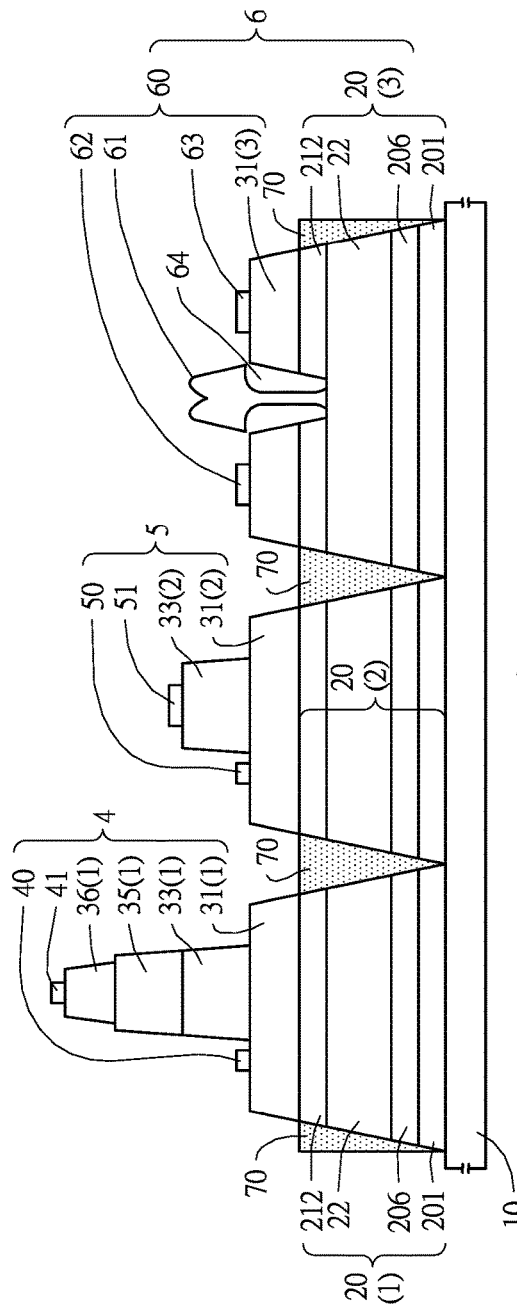

FIG. 2O illustrates an embodiment of a monolithically integrated circuit device with transistor and diodes in accordance with the present invention. The main structure of the embodiment FIG. 2O is basically the same with that of the embodiment FIG. 2N, except that the transistor epitaxial structure 20 further comprises a first cap layer 212. The first cap layer 212 forms on the Schottky barrier layer 22; the n-type doped epitaxial layer 31 (including 31(1), 31(2), and 31(3)) forms on the first cap layer 212. The bottom of the gate recess 64 is defined by the Schottky barrier layer 22; the surrounding of the gate recess 64 is defined by the first cap layer 212 and the n-type doped epitaxial layer 31(3). In some embodiments, the first cap layer 212 is n-type doped GaAs (n-GaAs). In some embodiments, the widths of the gate recess 64 defined by the first cap layer 212 and the n-type doped epitaxial layer 31(3) may be similar or different (not shown).

FIG. 2P illustrates an embodiment of a monolithically integrated circuit device with transistor and diodes in accordance with the present invention. The main structure of the embodiment FIG. 2P is basically the same with that of the embodiment FIG. 2N, except that the first diode 4 further comprises a first part 30(1) of the bottom etch stop layer 30, a first part 32(1) of the first etch stop layer 32, and a first part 34(1) of the second etch stop layer 34; the second diode 5 further comprises a second part 30(2) of the bottom etch stop layer 30 and a second part 32(2) of the first etch stop layer 32; and the transistor upper structure 60 further comprises a third part 30(3) of the bottom etch stop layer 30. The bottom etch stop layers 30(1), 30(2), and 30(3) form on the transistor epitaxial structures 20(1), 20(2), and 20(3), respectively. The n-type doped epitaxial layers 31(1), 31(2), and 31(3) form on the bottom etch stop layers 30(1), 30(2), and 30(3), respectively. The first etch stop layers 32(1) and 32(2) form on one portion of the n-type doped epitaxial layers 31(1) and 31(2), respectively. The first intrinsic epitaxial layers 33(1) and the 33(2) form on the first etch stop layers 32(1) and 32(2), respectively. The second etch stop layer 34(1) forms on the first intrinsic epitaxial layer 33(1); the second intrinsic epitaxial layer 35(1) forms on the second etch stop layer 34(1). The bottom of the gate recess 64 is defined by the Schottky barrier layer 22; the surrounding of the gate recess 64 is defined by the bottom etch stop layer 30(3) and the n-type doped epitaxial layer 31(3). In some embodiments, the bottom etch stop layer 30, the first etch stop layer 32, and the second etch stop layer 34 may be AlAs, AlGaAs, or InGaP, for example.

FIG. 2Q illustrates an embodiment of a monolithically integrated circuit device with transistor and diodes in accordance with the present invention. The main structure of the embodiment FIG. 2Q is basically the same with that of the embodiment FIG. 2P, except that the transistor epitaxial structure 20 further comprises a first cap etch stop layer 211 and a first cap layer 212. The first cap etch stop layer 211 forms on the Schottky barrier layer 22; the first cap layer 212 forms on the first cap etch stop layer 211; the bottom etch stop layer 30 (including 30(1), 30(2), and 30(3)) forms on the first cap layer 212. The bottom of the gate recess 64 is defined by the Schottky barrier layer 22; the surrounding of the gate recess 64 is defined by the first cap etch stop layer 211, the first cap layer 212, the bottom etch stop layer 30(3), and the n-type doped epitaxial layer 31(3). In some embodiments, the first cap layer 212 is n-type doped GaAs (n-GaAs). In some embodiments, the first cap etch stop layer 211 may be AlAs, AlGaAs, or InGaP, for example. In some embodiments, the widths of the gate recess 64 defined by the n-type doped epitaxial layer 31(3) and the first cap layer 212 may be similar or different (not shown). The embodiments FIGS. 2N, 2O, 2P, and 2Q integrate a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10.

Figure 2R:
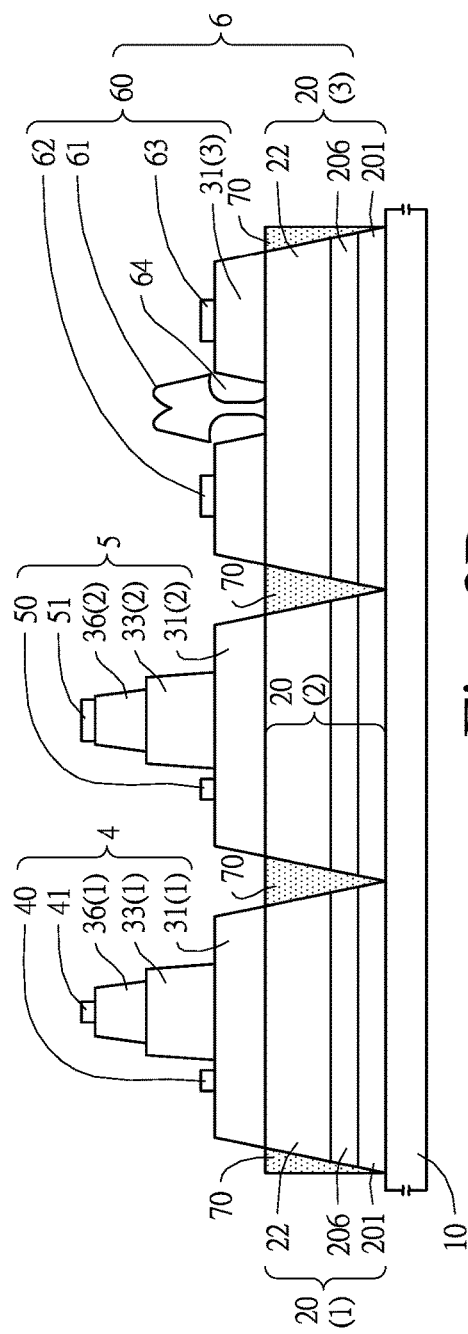

FIG. 2R illustrates an embodiment of a monolithically integrated circuit device with transistor and diodes in accordance with the present invention. The main structure of the embodiment FIG. 2R is basically the same with that of the embodiment FIG. 2J, except that the second diode 5 further comprises a second part 36(2) of the p-type doped epitaxial layer 36. The p-type doped epitaxial layer 36(2) forms on the first intrinsic epitaxial layer 33(2); the second electrode 51 forms on the p-type doped epitaxial layer 36(2) so that the second diode 5 forms a PIN diode. The embodiment FIG. 2R integrates two PIN diodes having the same intrinsic layer thickness (first intrinsic epitaxial layers 33(1) and 33(2)) and an FET (transistor 6) on the compound semiconductor substrate 10.

Figure 2S:
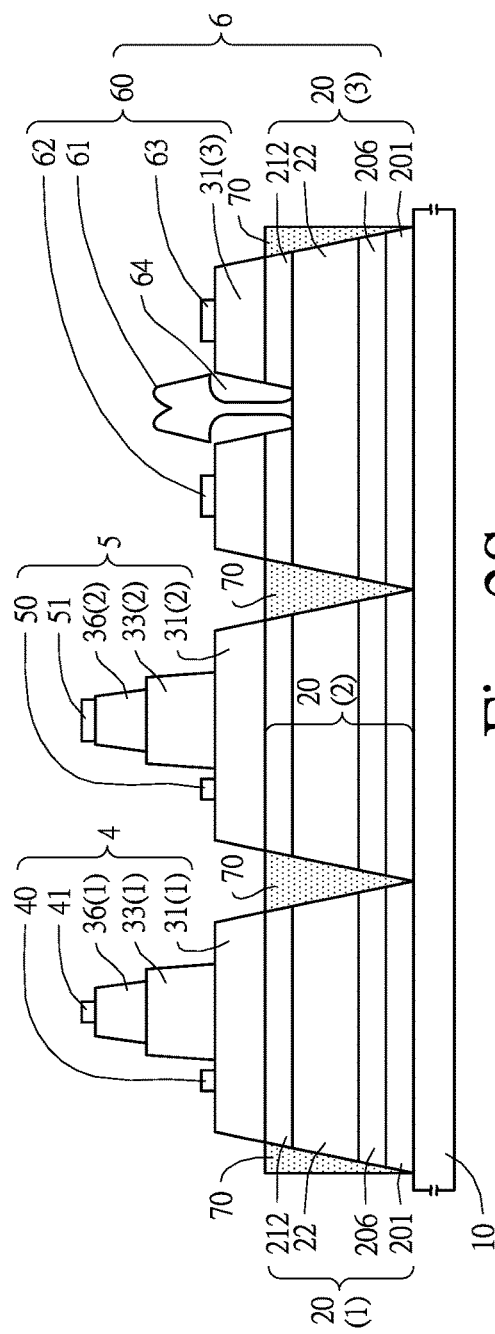

FIG. 2S illustrates an embodiment of a monolithically integrated circuit device with transistor and diodes in accordance with the present invention. The main structure of the embodiment FIG. 2S is basically the same with that of the embodiment FIG. 2R, except that the transistor epitaxial structure 20 further comprises a first cap layer 212. The first cap layer 212 forms on the Schottky barrier layer 22; the n-type doped epitaxial layer 31 (including 31(1), 31(2), and 31(3)) forms on the first cap layer 212. The bottom of the gate recess 64 is defined by the Schottky barrier layer 22; the surrounding of the gate recess 64 is defined by the first cap layer 212 and the n-type doped epitaxial layer 31(3). In some embodiments, the first cap layer 212 is n-type doped GaAs (n-GaAs). In some embodiments, the widths of the gate recess 64 defined by the first cap layer 212 and the n-type doped epitaxial layer 31(3) may be similar or different (not shown).

FIG. 2T illustrates an embodiment of a monolithically integrated circuit device with transistor and diodes in accordance with the present invention. The main structure of the embodiment FIG. 2T is basically the same with that of the embodiment FIG. 2R, except that the first diode 4 further comprises a first part 30(1) of a bottom etch stop layer 30 and a first part 32(1) of a first etch stop layer 32; the second diode 5 further comprises a second part 30(2) of the bottom etch stop layer 30 and a second part 32(2) of the first etch stop layer 32; and the transistor upper structure 60 further comprises a third part 30(3) of the bottom etch stop layer 30. The bottom etch stop layers 30(1), 30(2), and 30(3) form on the transistor epitaxial structures 20(1), 20(2), and 20(3), respectively. The n-type doped epitaxial layers 31(1), 31(2), and 31(3) form on the bottom etch stop layers 30(1), 30(2), and 30(3), respectively. The first etch stop layers 32(1) and 32(2) form on one portion of the n-type doped epitaxial layers 31(1) and 31(2), respectively. The first intrinsic epitaxial layers 33(1) and 33(2) form on the first etch stop layers 32(1) and 32(2), respectively. The bottom of the gate recess 64 is defined by the Schottky barrier layer 22; the surrounding of the gate recess 64 is defined by the bottom etch stop layer 30(3) and the n-type doped epitaxial layer 31(3). In some embodiments, the bottom etch stop layer 30 and the first etch stop layer 32 may be AlAs, AlGaAs, or InGaP, for example.

FIG. 2U illustrates an embodiment of a monolithically integrated circuit device with transistor and diodes in accordance with the present invention. The main structure of the embodiment FIG. 2U is basically the same with that of the embodiment FIG. 2T, except that the transistor epitaxial structure 20 further comprises a first cap etch stop layer 211 and a first cap layer 212. The first cap etch stop layer 211 forms on the Schottky barrier layer 22; the first cap layer 212 forms on the first cap etch stop layer 211; the bottom etch stop layer 30 (including 30(1), 30(2), and 30(3)) forms on the first cap layer 212. The bottom of the gate recess 64 is defined by the Schottky barrier layer 22; the surrounding of the gate recess 64 is defined by the first cap etch stop layer 211, the first cap layer 212, the bottom etch stop layer 30(3), and the n-type doped epitaxial layer 31(3). In some embodiments, the first cap layer 212 is n-type doped GaAs (n-GaAs). In some embodiments, the first cap etch stop layer 211 may be AlAs, AlGaAs, or InGaP, for example. In some embodiments, the widths of the gate recess 64 defined by the n-type doped epitaxial layer 31(3) and the first cap layer 212 may be similar or different (not shown). The embodiments FIGS. 2R, 2S, 2T, and 2U integrate two PIN diodes having the same intrinsic layer thickness (first intrinsic epitaxial layers 33(1) and 33(2)) and an FET (transistor 6) on the compound semiconductor substrate 10.

In the embodiments FIGS. 2D, 2L, and 2T, the first diode 4 includes the first part 30(1) of the bottom etch stop layer 30 and the first part 32(1) of the first etch stop layer 32; the second diode 5 includes the second part 30(2) of the bottom etch stop layer 30 and the second part 32(2) of the first etch stop layer 32; and the transistor upper structure 60 includes the third part 30(3) of the bottom etch stop layer 30. In some other embodiments (not shown), the main structure is similar to the structure of one of the embodiments FIGS. 2D, 2L, and 2T, except that the first diode 4 does not include the bottom etch stop layer 30(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2D, 2L, and 2T, except that the first diode 4 does not include the first etch stop layer 32(1); and the second diode 5 does not include the first etch stop layer 32(2).

In the embodiments FIGS. 2E, 2M, and 2U, the transistor epitaxial structure 20 includes the first cap etch stop layer 211; the first diode 4 includes the first part 30(1) of the bottom etch stop layer 30 and the first part 32(1) of the first etch stop layer 32; the second diode 5 includes the second part 30(2) of the bottom etch stop layer 30 and the second part 32(2) of the first etch stop layer 32; and the transistor upper structure 60 includes the third part 30(3) of the bottom etch stop layer 30. In some other embodiments (not shown), the main structure is similar to the structure of one of the embodiments FIGS. 2E, 2M, and 2U, except that the transistor epitaxial structure 20 does not include the first cap etch stop layer 211. In some other embodiments (not shown), the main structure is similar to the structure of one of the embodiments FIGS. 2E, 2M, and 2U, except that the first diode 4 does not include the bottom etch stop layer 30(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2E, 2M, and 2U, except that the first diode 4 does not include the first etch stop layer 32(1); and the second diode 5 does not include the first etch stop layer 32(2). In some other embodiments (not shown), the main structure is similar to the structure of one of the embodiments FIGS. 2E, 2M, and 2U, except that the transistor epitaxial structure 20 does not include the first cap etch stop layer 211; the first diode 4 does not include the bottom etch stop layer 30(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2E, 2M, and 2U, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 2E, 2M, and 2U, except that the first diode 4 does not include the bottom etch stop layer 30(1) and the first etch stop layer 32(1); the second diode 5 does not include the bottom etch stop layer 30(2) and the first etch stop layer 32(2); and the transistor upper structure 60 does not include the bottom etch stop layer 30(3).

In the embodiments FIGS. 2H and 2P, the first diode 4 includes the first part 30(1) of the bottom etch stop layer 30, the first part 32(1) of the first etch stop layer 32, and the first part 34(1) of the second etch stop layer 34; the second diode 5 includes the second part 30(2) of the bottom etch stop layer 30 and the second part 32(2) of the first etch stop layer 32; and the transistor upper structure 60 includes the third part 30(3) of the bottom etch stop layer 30. In some other embodiments (not shown), the main structure is similar to the structure of one of the embodiments FIGS. 2H and 2P, except that the first diode 4 does not include the bottom etch stop layer 30(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2H and 2P, except that the first diode 4 does not include the first etch stop layer 32(1); and the second diode 5 does not include the first etch stop layer 32(2). In some other embodiments (not shown), the main structure is similar to the structure of one of the embodiments FIGS. 2H and 2P, except that the first diode 4 does not include the second etch stop layer 34(1). In some other embodiments (not shown), the main structure is similar to the structure of one of the embodiments FIGS. 2H and 2P, except that the first diode 4 does not include the bottom etch stop layer 30(1) and the first etch stop layer 32(1); the second diode 5 does not include the bottom etch stop layer 30(2) and the first etch stop layer 32(2); and the transistor upper structure 60 does not include the bottom etch stop layer 30(3). In some other embodiments (not shown), the main structure is similar to the structure of one of the embodiments FIGS. 2H and 2P, except that the first diode 4 does not include the bottom etch stop layer 30(1) and the second etch stop layer 34(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2H and 2P, except that the first diode 4 does not include the first etch stop layer 32(1) and the second etch stop layer 34(1); and the second diode 5 does not include the first etch stop layer 32(2).

In the embodiments FIGS. 2I and 2Q, the transistor epitaxial structure 20 includes the first cap etch stop layer 211; the first diode 4 includes the first part 30(1) of the bottom etch stop layer 30, the first part 32(1) of the first etch stop layer 32, and the first part 34(1) of the second etch stop layer 34; the second diode 5 includes the second part 30(2) of the bottom etch stop layer 30 and the second part 32(2) of the first etch stop layer 32; and the transistor upper structure 60 includes the third part 30(3) of the bottom etch stop layer 30. In some other embodiments (not shown), the main structure is similar to the structure of one of the embodiments FIGS. 2I and 2Q, except that the transistor epitaxial structure 20 does not include the first cap etch stop layer 211. In some other embodiments (not shown), the main structure is similar to the structure of one of the embodiments of FIGS. 2I and 2Q, except that the first diode 4 does not include the bottom etch stop layer 30(1); the second diode 5 does not include the bottom etch stop layer 30(2);

and the transistor upper structure 60 does not include the bottom etch stop layer 30(3). In some other embodiments (not shown), the main structure is similar to the structure of one of the embodiments FIGS. 2I and 2Q, except that the first diode 4 does not include the first etch stop layer 32(1); and the second diode 5 does not include the first etch stop layer 32(2). In some other embodiments (not shown), the main structure is similar to the structure of one of the embodiments FIGS. 2I and 2Q, except that the first diode 4 does not include the second etch stop layer 34(1). In some other embodiments (not shown), the main structure is similar to the structure of one of the embodiments FIGS. 2I and 2Q, except that the transistor epitaxial structure 20 does not include the first cap etch stop layer 211; the first diode 4 does not include the bottom etch stop layer 30(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2I and 2Q, except that the transistor epitaxial structure 20 does not include the first cap etch stop layer 211; the first diode 4 does not include the first etch stop layer 32(1); and the second diode 5 does not include the first etch stop layer 32(2). In some other embodiments (not shown), the main structure is similar to the structure of one of the embodiments FIGS. 2I and 2Q, except that the transistor epitaxial structure 20 does not include the first cap etch stop layer 211; the first diode 4 does not include the second etch stop layer 34(1). In some other embodiments (not shown), the main structure is similar to the structure of one of the embodiments FIGS. 2I and 2Q, except that the first diode 4 does not include the bottom etch stop layer 30(1) and the first etch stop layer 32(1); the second diode 5 does not include the bottom etch stop layer 30(2) and the first etch stop layer 32(2); and the transistor upper structure 60 does not include the bottom etch stop layer 30(3). In some other embodiments (not shown), the main structure is similar to the structure of one of the embodiments FIGS. 2I and 2Q, except that the first diode 4 does not include the bottom etch stop layer 30(1) and the second etch stop layer 34(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2I and 2Q, except that the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 2I and 2Q, except that the transistor epitaxial structure 20 does not include the first cap etch stop layer 211; the first diode 4 does not include the bottom etch stop layer 30(1) and the first etch stop layer 32(1); the second diode 5 does not include the bottom etch stop layer 30(2) and the first etch stop layer 32(2); and the transistor upper structure 60 does not include the bottom etch stop layer 30(3). In some other embodiments (not shown), the main structure is similar to the structure of one of the embodiments FIGS. 2I and 2Q, except that the transistor epitaxial structure 20 does not include the first cap etch stop layer 211; the first diode 4 does not include the bottom etch stop layer 30(1) and the second etch stop layer 34(1); the second diode 5 does not include the bottom etch stop layer 30(2); and the transistor upper structure 60 does not include the bottom etch stop layer 30(3). In some other embodiments (not shown), the main structure is similar to the structure of one of the embodiments FIGS. 2I and 2Q, except that the transistor epitaxial structure 20 does not include the first cap etch stop layer 211; the first diode 4 does not include the first etch stop layer 32(1) and the second etch stop layer 34(1); and the second diode 5 does not include the first etch stop layer 32(2). In some other embodiments (not shown), the main structure is similar to the structure of one of the embodiments FIGS. 2I and 2Q, except that the first diode 4 does not include the bottom etch stop layer 30(1), the first etch stop layer 32(1), and the second etch stop layer 34(1); the second diode 5 does not include the bottom etch stop layer 30(2) and the first etch stop layer 32(2); and the transistor upper structure 60 does not include the bottom etch stop layer 30(3).

FIG. 3A illustrates an embodiment of a monolithically integrated circuit device with transistor and diodes in accordance with the present invention. The main structure of the embodiment FIG. 3A is basically the same with that of the embodiment FIG. 1Q, except that the second diode 5 further comprises a second part 34(2) of the second etch stop layer 34, a second part 35(2) of the second intrinsic epitaxial layer 35, and a second part 36(2) of the p-type doped epitaxial layer 36. The second etch stop layer 34(2) forms on the first intrinsic epitaxial layer 33(2); the second intrinsic epitaxial layer 35(2) forms on the second etch stop layer 34(2); the p-type doped epitaxial layer 36(2) forms on the second intrinsic epitaxial layer 35(2); the second electrode 51 forms on the p-type doped epitaxial layer 36(2) so that the second diode 5 forms a PIN diode. The embodiment FIG. 3A integrates two PIN diodes having the same intrinsic layer thickness (first intrinsic epitaxial layers 33(1) and 33(2), and second intrinsic epitaxial layers 35(1) and 35(2)) and an FET (transistor 6) on the compound semiconductor substrate 10. In some other embodiments of the present invention (such as the embodiments FIGS. 1N and 1O), the second diode 5 may also further comprises a second part 35(2) of the second intrinsic epitaxial layer 35 and a second part 36(2) of the p-type doped epitaxial layer 36 (not shown), wherein the second intrinsic epitaxial layer 35(2) forms on the first intrinsic epitaxial layer 33(2); the p-type doped epitaxial layer 36(2) forms on the second intrinsic epitaxial layer 35(2); the second electrode 51 forms on the p-type doped epitaxial layer 36(2) so that the second diode 5 forms a PIN diode. In some other embodiments of the present invention (such as the embodiment FIG. 1P), the second diode 5 may also further comprises a second part 34(2) of the second etch stop layer 34, a second part 35(2) of the second intrinsic epitaxial layer 35, and a second part 36(2) of the p-type doped epitaxial layer 36 (not shown), wherein the second etch stop layer 34(2) forms on the first intrinsic epitaxial layer 33(2); the second intrinsic epitaxial layer 35(2) forms on the second etch stop layer 34(2); the p-type doped epitaxial layer 36(2) forms on the second intrinsic epitaxial layer 35(2); the second electrode 51 forms on the p-type doped epitaxial layer 36(2) so that the second diode 5 forms a PIN diode.

The embodiment FIG. 3A of the present invention can be fabricated using the compound semiconductor epitaxial structure 3 shown in FIG. 3B. The epitaxial structure 3 forms on a compound semiconductor substrate 10, wherein the epitaxial structure 3 comprises a transistor epitaxial structure 20, a bottom etch stop layer 30, an n-type doped epitaxial layer 31, a first etch stop layer 32, a first intrinsic epitaxial layer 33, a second etch stop layer 34, a second intrinsic epitaxial layer 35, and a p-type doped epitaxial layer 36. The transistor epitaxial structure 20 comprises a buffer layer 201, a channel layer 206, a Schottky barrier layer 22, a first cap etch stop layer 211, a first cap layer 212, a second cap etch stop layer 213, and a second cap layer 214. The buffer layer 201 forms on the compound semiconductor substrate 10; the channel layer 206 forms on the buffer layer 201; the Schottky barrier layer 22 forms on the channel layer 206; the first cap etch stop layer 211 forms on the Schottky barrier layer 22; the first cap layer 212 forms on the first cap etch stop layer 211; the second cap etch stop layer 213 forms on the first cap layer 212; the second cap layer 214 forms on the second cap etch stop layer 213; the bottom etch stop layer 30 forms on the second cap layer 214; the n-type doped epitaxial layer 31 forms on the bottom etch stop layer 30; the first etch stop layer 32 forms on the n-type doped epitaxial layer 31; the first intrinsic epitaxial layer 33 forms on the first etch stop layer 32; the second etch stop layer 34 forms on the first intrinsic epitaxial layer 33; the second intrinsic epitaxial layer 35 forms on the second etch stop layer 34; the p-type doped epitaxial layer 36 forms on the second intrinsic epitaxial layer 35. Some other embodiments of the present invention (such as the embodiments FIGS. 1E, 1I, 1Q, and 3A) may also be fabricated using the compound semiconductor epitaxial structure 3; wherein the embodiment FIG. 1E integrates two Schottky diodes having the same intrinsic layer thickness (first intrinsic epitaxial layers 33(1) and 33(2)) and an FET (transistor 6) on the compound semiconductor substrate 10; wherein the embodiment FIG. 1I integrates a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10; wherein the embodiment FIG. 1Q integrates a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10; wherein the embodiment FIG. 3A integrates two PIN diodes having the same intrinsic layer thickness (first intrinsic epitaxial layers 33(1) and 33(2); and second intrinsic epitaxial layers 35(1) and 35(2)) and an FET (transistor 6) on the compound semiconductor substrate 10. Accordingly, this invention only needs a single structure (epitaxial structure 3) in a single growth run and a simplified process in which FETs, PIN diodes, and Schottky diodes can be fabricated on the same substrate with various combinations, rendering the realization of the monolithically integrated FET-Diode circuit devices with greatly reduced process steps and cost. The embodiments FIGS. 1A, 1F, and 1N of the present invention may be fabricated using another compound semiconductor epitaxial structure (not shown). The main structure of the epitaxial structure (not shown) is basically the same with that of the epitaxial structure 3, except that the compound semiconductor epitaxial structure (not shown) does not include the first cap etch stop layer 211, the second cap etch stop layer 213, the second cap layer 214, the bottom etch stop layer 30, the first etch stop layer 32, and the second etch stop layer 34. The embodiments FIGS. 1C, 1G, and 1O of the present invention may be fabricated using another compound semiconductor epitaxial structure (not shown). The main structure of the epitaxial structure (not shown) is basically the same with that of the epitaxial structure 3, except that the compound semiconductor epitaxial structure (not shown) does not include the first cap etch stop layer 211, the second cap etch stop layer 213, the bottom etch stop layer 30, the first etch stop layer 32, and the second etch stop layer 34. The embodiments FIGS. 1D, 1H, and 1P of the present invention may be fabricated using another compound semiconductor epitaxial structure (not shown). The main structure of the epitaxial structure (not shown) is basically the same with that of the epitaxial structure 3, except that the compound semiconductor epitaxial structure (not shown) does not include the second cap etch stop layer 213 and the second cap layer 214.

FIG. 3C shows a cross-sectional side view of an epitaxial structure of the present embodiment. A compound semiconductor epitaxial structure 3' forms on a compound semiconductor substrate 10, wherein the compound semiconductor epitaxial structure 3' comprises a transistor epitaxial structure 20, a bottom etch stop layer 30, an n-type doped epitaxial layer 31, a first etch stop layer 32, a first intrinsic epitaxial layer 33, and a p-type doped epitaxial layer 36. The transistor epitaxial structure 20 comprises a buffer layer 201, a channel layer 206, a Schottky barrier layer 22, a first cap etch stop layer 211, a first cap layer 212, a second cap etch stop layer 213, and a second cap layer 214. The buffer layer 201 forms on the compound semiconductor substrate 10; the channel layer 206 forms on the buffer layer 201; the Schottky barrier layer 22 forms on the channel layer 206; the first cap etch stop layer 211 forms on the Schottky barrier layer 22; the first cap layer 212 forms on the first cap etch stop layer 211; the second cap etch stop layer 213 forms on the first cap layer 212; the second cap layer 214 forms on the second cap etch stop layer 213; the bottom etch stop layer 30 forms on the second cap layer 214; the n-type doped epitaxial layer 31 forms on the bottom etch stop layer 30; the first etch stop layer 32 forms on the n-type doped epitaxial layer 31; the first intrinsic epitaxial layer 33 forms on the first etch stop layer 32; the p-type doped epitaxial layer 36 forms on the first intrinsic epitaxial layer 33. The embodiments FIGS. 1E, 1M and 1U of the present invention may be fabricated using the compound semiconductor epitaxial structure 3'; wherein the embodiment FIG. 1E integrates two Schottky diodes having the same intrinsic layer thickness (first intrinsic epitaxial layers 33(1) and 33(2)) and an FET (transistor 6) on the compound semiconductor substrate 10; wherein the embodiment FIG. 1M integrates a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness; wherein the embodiment FIG. 1U integrates two PIN diodes having the same intrinsic layer thickness (first intrinsic epitaxial layers 33(1) and 33(2)) and an FET (transistor 6) on the compound semiconductor substrate 10. Accordingly, this invention utilizes a single structure (epitaxial structure 3') in a single growth run and a simplified process in which FETs, PIN diodes, and Schottky diodes can be fabricated on the same substrate with various combinations, rendering the realization of the monolithically integrated FET-Diode circuit devices with greatly reduced process steps and cost. Moreover, the device size is greatly reduced and the performance is improved. The embodiments FIGS. 1A, 1J, and 1R of the present invention may be fabricated using another compound semiconductor epitaxial structure (not shown), wherein the main structure of the epitaxial structure (not shown) is basically the same with that of the epitaxial structure 3', except that the compound semiconductor epitaxial structure (not shown) does not include the first cap etch stop layer 211, the second cap etch stop layer 213, the second cap layer 214, the bottom etch stop layer 30, and the first etch stop layer 32. The embodiments FIGS. 1C, 1K, and 1S of the present invention may be fabricated using another compound semiconductor epitaxial structure (not shown), wherein the main structure of the epitaxial structure (not shown) is basically the same with that of the epitaxial structure 3', except that the compound semiconductor epitaxial structure (not shown) does not include the first cap etch stop layer 211, the second cap etch stop layer 213, the bottom etch stop layer 30, and the first etch stop layer 32. The embodiments FIGS. 1D, 1L, and 1T of the present invention may be fabricated using another compound semiconductor epitaxial structure (not shown), wherein the main structure of the epitaxial structure (not shown) is basically the same with that of the epitaxial structure 3', except that the compound semiconductor epitaxial structure (not shown) does not include the second cap etch stop layer 213 and the second cap layer 214.

FIG. 3D illustrates an embodiment of a monolithically integrated circuit device with transistor and diodes in accordance with the present invention. The main structure of the embodiment FIG. 3D is basically the same with that of the embodiment FIG. 2Q, except that the second diode 5 further comprises a second part 34(2) of the second etch stop layer 34, a second part 35(2) of the second intrinsic epitaxial layer 35, and a second part 36(2) of the p-type doped epitaxial layer 36. The second etch stop layer 34(2) forms on the first intrinsic epitaxial layer 33(2); the second intrinsic epitaxial layer 35(2) forms on the second etch stop layer 34(2); the p-type doped epitaxial layer 36(2) forms on the second intrinsic epitaxial layer 35(2); the second electrode 51 forms on the p-type doped epitaxial layer 36(2) so that the second diode 5 forms a PIN diode. The embodiment FIG. 3D integrates two PIN diodes having the same intrinsic layer thickness (first intrinsic epitaxial layers 33(1) and 33(2); and second intrinsic epitaxial layers 35(1) and 35(2)) and an FET (transistor 6) on the compound semiconductor substrate 10. In some other embodiments of the present invention (such as the embodiments of FIGS. 2N and 2O), the second diode 5 may also further comprises a second part 35(2) of the second intrinsic epitaxial layer 35 and a second part 36(2) of the p-type doped epitaxial layer 36 (not shown), wherein the second intrinsic epitaxial layer 35(2) forms on the first intrinsic epitaxial layer 33(2); the p-type doped epitaxial layer 36(2) forms on the second intrinsic epitaxial layer 35(2); the second electrode 51 forms on the p-type doped epitaxial layer 36(2) so that the second diode 5 forms a PIN diode. In some other embodiments of the present invention (such as the embodiment FIG. 2P), the second diode 5 may also further comprises a second part 34(2) of the second etch stop layer 34, a second part 35(2) of the second intrinsic epitaxial layer 35, and a second part 36(2) of the p-type doped epitaxial layer 36 (not shown), wherein the second etch stop layer 34(2) forms on the first intrinsic epitaxial layer 33(2); the second intrinsic epitaxial layer 35(2) forms on the second etch stop layer 34(2); the p-type doped epitaxial layer 36(2) forms on the second intrinsic epitaxial layer 35(2); the second electrode 51 forms on the p-type doped epitaxial layer 36(2) so that the second diode 5 forms a PIN diode.

The embodiment FIG. 3D of the present invention can be fabricated using the compound semiconductor epitaxial structure 3" shown in FIG. 3E. The epitaxial structure 3" forms on a compound semiconductor substrate 10, wherein the compound semiconductor epitaxial structure 3" comprises a transistor epitaxial structure 20, a bottom etch stop layer 30, an n-type doped epitaxial layer 31, a first etch stop layer 32, a first intrinsic epitaxial layer 33, a second etch stop layer 34, a second intrinsic epitaxial layer 35, and a p-type doped epitaxial layer 36. The transistor epitaxial structure 20 comprises a buffer layer 201, a channel layer 206, a Schottky barrier layer 22, a first cap etch stop layer 211, and a first cap layer 212. The buffer layer 201 forms on the compound semiconductor substrate 10; the channel layer 206 forms on the buffer layer 201; the Schottky barrier layer 22 forms on the channel layer 206; the first cap etch stop layer 211 forms on the Schottky barrier layer 22; the first cap layer 212 forms on the first cap etch stop layer 211; the bottom etch stop layer 30 forms on the first cap layer 212; the n-type doped epitaxial layer 31 forms on the bottom etch stop layer 30; the first etch stop layer 32 forms on the n-type doped epitaxial layer 31; the first intrinsic epitaxial layer 33 forms on the first etch stop layer 32; the second etch stop layer 34 forms on the first intrinsic epitaxial layer 33; the second intrinsic epitaxial layer 35 forms on the second etch stop layer 34; the p-type doped epitaxial layer 36 forms on the second intrinsic epitaxial layer 35. The embodiments of FIGS. 2E, 2I, 2Q, and 3D of the present invention may also be fabricated using the compound semiconductor epitaxial structure 3"; wherein the embodiment FIG. 2E integrates two Schottky diodes having the same intrinsic layer thickness (first intrinsic epitaxial layers 33(1) and 33(2)) and an FET (transistor 6) on the compound semiconductor substrate 10; wherein the embodiment FIG. 2I integrates a Schottky diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10; wherein the embodiment FIG. 2Q integrates a PIN diode having a thick intrinsic epitaxial layer (the first diode 4 having the first intrinsic epitaxial layer 33(1) and the second intrinsic epitaxial layer 35(1)), a Schottky diode having a thin intrinsic epitaxial layer (the second diode 5 having the first intrinsic epitaxial layer 33(2)), and an FET (transistor 6) on the compound semiconductor substrate 10; wherein the embodiment FIG. 3D integrates two PIN diodes having the same intrinsic layer thickness (first intrinsic epitaxial layers 33(1) and 33(2); and second intrinsic epitaxial layers 35(1) and 35(2)) and an FET (transistor 6) on the compound semiconductor substrate 10. Accordingly, this invention utilizes a single structure (epitaxial structure 3") in a single growth run and a simplified process in which FETs, PIN diodes, and Schottky diodes can be fabricated on the same substrate with various combinations, rendering the realization of the monolithically integrated FET-Diode circuit devices with greatly reduced process steps and cost. Moreover, the device size is greatly reduced and the performance is improved. The embodiments FIGS. 2A, 2F, and 2N of the present invention may be fabricated using another compound semiconductor epitaxial structure (not shown), wherein the main structure of the epitaxial structure (not shown) is basically the same with that of the epitaxial structure 3", except that the compound semiconductor epitaxial structure (not shown) does not include the first cap etch stop layer 211, the first cap layer 212, the bottom etch stop layer 30, the first etch stop layer 32, and the second etch stop layer 34. The embodiments FIGS. 2C, 2G, and 2O of the present invention may be fabricated using another compound semiconductor epitaxial structure (not shown), wherein the main structure of the epitaxial structure (not shown) is basically the same with that of the epitaxial structure 3", except that the compound semiconductor epitaxial structure (not shown) does not include the first cap etch stop layer 211, the bottom etch stop layer 30, the first etch stop layer 32, and the second etch stop layer 34. The embodiments of FIGS. 2D, 2H, and 2P of the present invention may be fabricated from a compound semiconductor epitaxial structure (not shown), wherein the main structure of the epitaxial structure (not shown) is basically the same with that of the epitaxial structure 3''', except that the compound semiconductor epitaxial structure (not shown) does not include the first cap etch stop layer 211 and the first cap layer 212.

FIG. 3F shows a cross-sectional side view of an epitaxial structure of the present embodiment. A compound semiconductor epitaxial structure 3''' forms on a compound semiconductor substrate 10, wherein the compound semiconductor epitaxial structure 3''' comprises a transistor epitaxial structure 20, a bottom etch stop layer 30, an n-type doped epitaxial layer 31, a first etch stop layer 32, a first intrinsic epitaxial layer 33, and a p-type doped epitaxial layer 36. The transistor epitaxial structure 20 comprises a buffer layer 201, a channel layer 206, a Schottky barrier layer 22, a first cap etch stop layer 211, and a first cap layer 212. The buffer layer 201 forms on the compound semiconductor substrate 10; the channel layer 206 forms on the buffer layer 201; the Schottky barrier layer 22 forms on the channel layer 206; the first cap etch stop layer 211 forms on the Schottky barrier layer 22; the first cap layer 212 forms on the first cap etch stop layer 211; the bottom etch stop layer 30 forms on the first cap layer 212; the n-type doped epitaxial layer 31 forms on the bottom etch stop layer 30; the first etch stop layer 32 forms on the n-type doped epitaxial layer 31; the first intrinsic epitaxial layer 33 forms on the first etch stop layer 32; the p-type doped epitaxial layer 36 forms on the first intrinsic epitaxial layer 33. The embodiments FIGS. 2E, 2M, and 2U of the present invention may be fabricated using the compound semiconductor epitaxial structure 3'''; wherein the embodiment FIG. 2E integrates two Schottky diodes having the same intrinsic layer thickness (first intrinsic epitaxial layers 33(1) and 33(2)) and an FET (transistor 6) on the compound semiconductor substrate 10; wherein the embodiment FIG. 2M integrates a PIN diode (the first diode 4 having the first intrinsic epitaxial layer 33(1)), a Schottky diode (the second diode 5 having the first intrinsic epitaxial layer 33(2)), and an FET (transistor 6) on the compound semiconductor substrate 10, wherein the PIN diode and the Schottky diode have the same intrinsic layer thickness; wherein the embodiment FIG. 2U integrates two PIN diodes having the same intrinsic layer thickness (first intrinsic epitaxial layers 33(1) and 33(2)) and an FET (transistor 6) on the compound semiconductor substrate 10. Accordingly, this invention utilizes a single structure (epitaxial structure 3''') in a single growth run and a simplified process in which FETs, PIN diodes, and Schottky diodes can be fabricated on the same substrate with various combinations, rendering the realization of the monolithically integrated FET-Diode circuit devices with greatly reduced process steps and cost. Moreover, the device size is greatly reduced and the performance is improved. The embodiments FIGS. 2A, 2J, and 2R of the present invention may be fabricated using another compound semiconductor epitaxial structure (not shown), wherein the main structure of the epitaxial structure (not shown) is basically the same with that of the epitaxial structure 3''', except that the compound semiconductor epitaxial structure (not shown) does not include the first cap etch stop layer 211, the first cap layer 212, the bottom etch stop layer 30, and the first etch stop layer 32. The embodiments FIGS. 2C, 2K, and 2S of the present invention may be fabricated using another compound semiconductor epitaxial structure (not shown), wherein the main structure of the epitaxial structure (not shown) is basically the same with that of the epitaxial structure 3''', except that the compound semiconductor epitaxial structure (not shown) does not include the first cap etch stop layer 211, the bottom etch stop layer 30, and the first etch stop layer 32. The embodiments FIGS. 2D, 2L, and 2T of the present invention may be fabricated using another compound semiconductor epitaxial structure (not shown), wherein the main structure of the epitaxial structure (not shown) is basically the same with that of the epitaxial structure 3''', except that the compound semiconductor epitaxial structure (not shown) does not include the first cap etch stop layer 211 and the first cap layer 212.

FIG. 4A illustrates an embodiment of a monolithically integrated circuit device with transistor and diodes in accordance with the present invention. The main structure of the embodiment FIG. 4A is basically the same with that of the embodiment FIG. 1A, except that the thickness of the first intrinsic epitaxial layer 33(1) in the first diode 4 is greater than the thickness of the first intrinsic epitaxial layer 33(2) in the second diode 5. FIG. 4B illustrates an embodiment of a monolithically integrated circuit device with transistor and diodes in accordance with the present invention. The main structure of the embodiment of FIG. 4B is basically the same with that of the embodiment of FIG. 1C, except that the thickness of the first intrinsic epitaxial layer 33(1) in the first diode 4 is greater than the thickness of the first intrinsic epitaxial layer 33(2) in the second diode 5. The embodiments 4A and 4B integrate a Schottky diode having a thick intrinsic epitaxial layer (the first diode 4), a Schottky diode having a thin intrinsic epitaxial layer (the second diode 5), and an FET (transistor 6) on the compound semiconductor substrate 10. In the embodiments 4A and 4B, the thickness of the first intrinsic epitaxial layer 33(2) can be etched further during the fabricating processes, as a result a thinner the first intrinsic epitaxial layer 33(2) compared with the first intrinsic epitaxial layer 33(1).

FIG. 4C illustrates an embodiment of a monolithically integrated circuit device with transistor and diodes in accordance with the present invention. The main structure of the embodiment FIG. 4C is basically the same with that of the embodiment FIG. 1J, except that the thickness of the first intrinsic epitaxial layer 33(1) in the first diode 4 is greater than the thickness of the first intrinsic epitaxial layer 33(2) in the second diode 5. FIG. 4D illustrates an embodiment of a monolithically integrated circuit device with transistor and diodes in accordance with the present invention. The main structure of the embodiment FIG. 4D is basically the same with that of the embodiment FIG. 1K, except that the thickness of the first intrinsic epitaxial layer 33(1) in the first diode 4 is greater than the thickness of the first intrinsic epitaxial layer 33(2) in the second diode 5. The embodiments 4C and 4D integrate a PIN diode having a thick intrinsic epitaxial layer (the first diode 4), a Schottky diode having a thin intrinsic epitaxial layer (the second diode 5), and an FET (transistor 6) on the compound semiconductor substrate 10. In the embodiments 4C and 4D, the thickness of the first intrinsic epitaxial layer 33(2) can be etched further during the fabricating processes, as a result a thinner the first intrinsic epitaxial layer 33(2) compared with the first intrinsic epitaxial layer 33(1).

FIG. 4E illustrates an embodiment of a monolithically integrated circuit device with transistor and diodes in accordance with the present invention. The main structure of the embodiment FIG. 4E is basically the same with that of the embodiment FIG. 2A, except that the thickness of the first intrinsic epitaxial layer 33(1) in the first diode 4 is greater than the thickness of the first intrinsic epitaxial layer 33(2)

in the second diode 5. FIG. 4F illustrates an embodiment of a monolithically integrated circuit device with transistor and diodes in accordance with the present invention. The main structure of the embodiment FIG. 4F is basically the same with that of the embodiment FIG. 2C, except that the thickness of the first intrinsic epitaxial layer 33(1) in the first diode 4 is greater than the thickness of the first intrinsic epitaxial layer 33(2) in the second diode 5. The embodiments 6E and 6F integrate a Schottky diode having a thick intrinsic epitaxial layer (the first diode 4), a Schottky diode having a thin intrinsic epitaxial layer (the second diode 5), and an FET (transistor 6) on the compound semiconductor substrate 10. In the embodiments 6E and 6F, the thickness of the first intrinsic epitaxial layer 33(2) can be etched further during the fabricating processes, as a result a thinner the first intrinsic epitaxial layer 33(2) compared with the first intrinsic epitaxial layer 33(1).

Figure 4G:
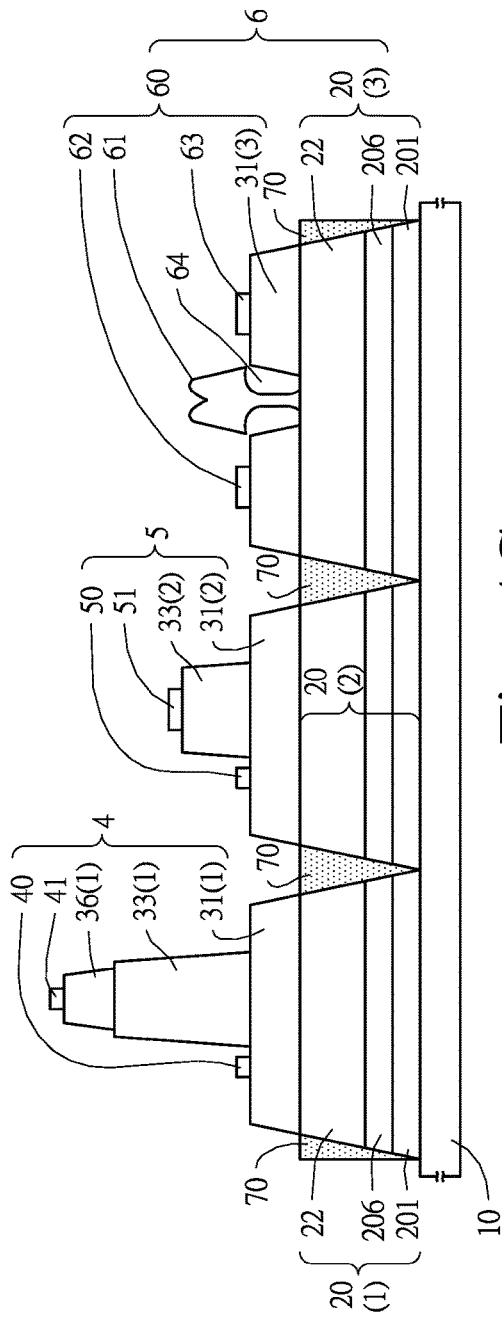
Figure 4H:
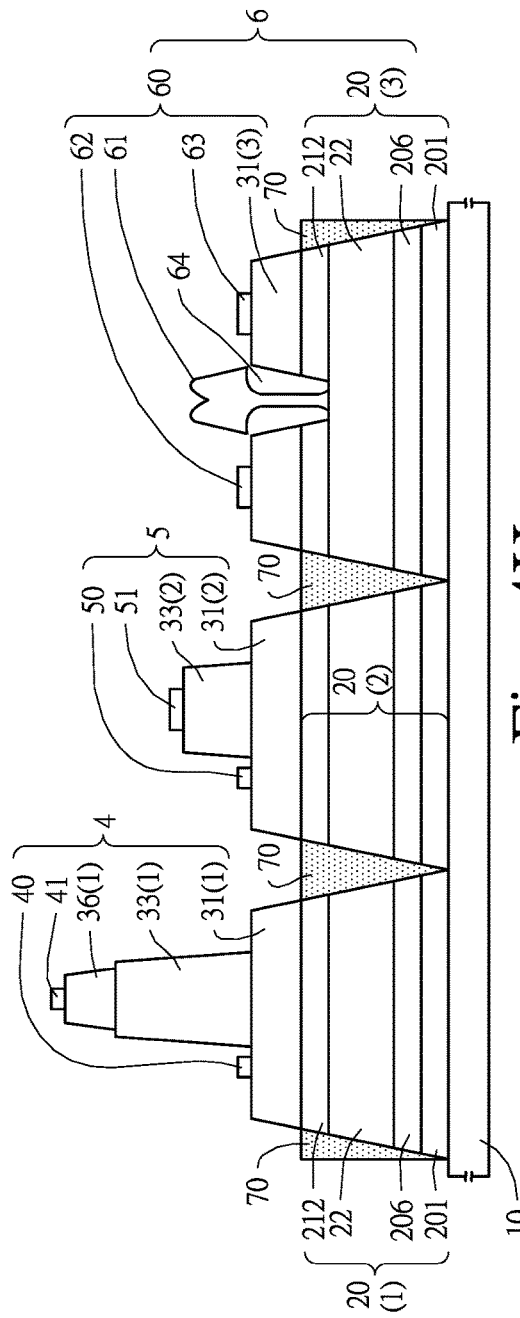
Figure 5:
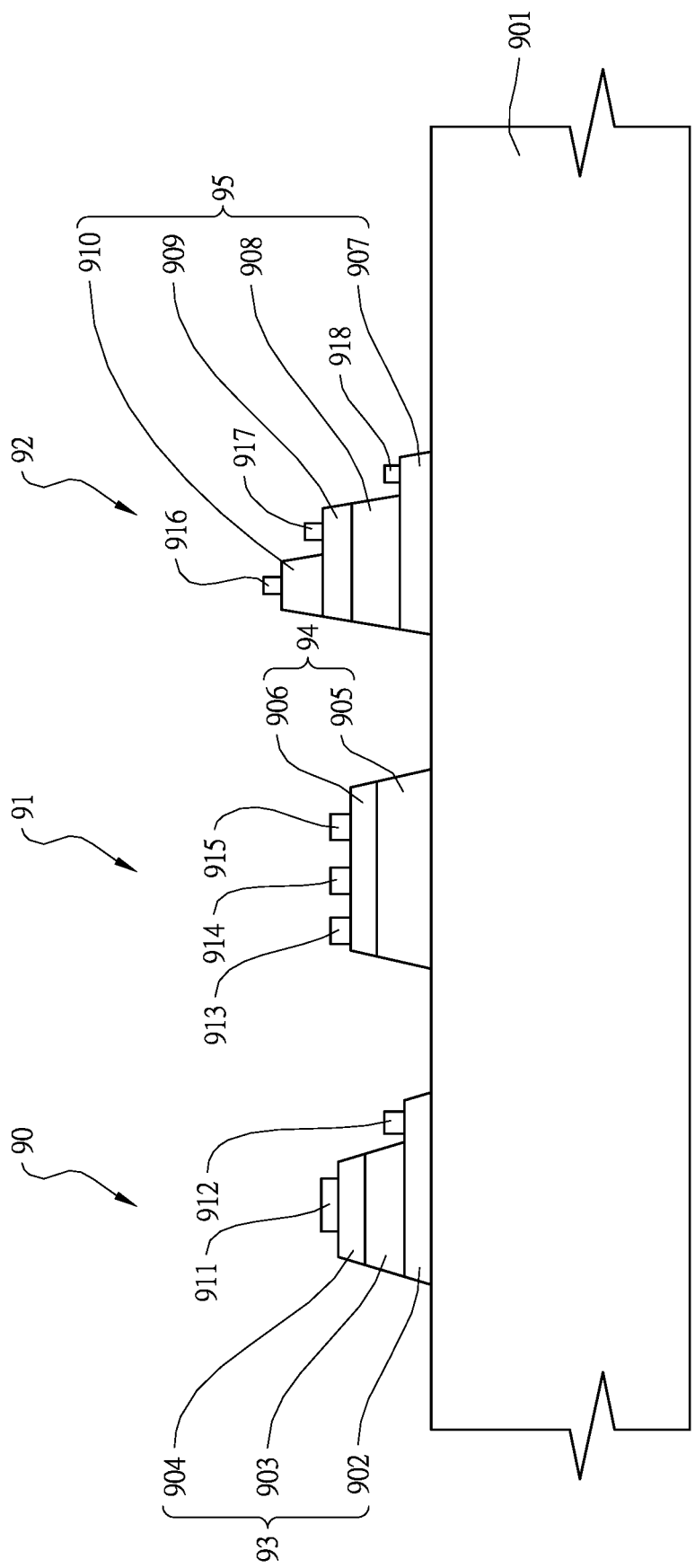
FIG. 5 is a simplified cross-sectional side view of a conventional monolithically integrated circuit device with transistors and diodes.

FIG. 4G illustrates an embodiment of a monolithically integrated circuit device with transistor and diodes in accordance with the present invention. The main structure of the embodiment FIG. 4G is basically the same with that of the embodiment FIG. 2J, except that the thickness of the first intrinsic epitaxial layer 33(1) in the first diode 4 is greater than the thickness of the first intrinsic epitaxial layer 33(2) in the second diode 5. FIG. 4H illustrates an embodiment of a monolithically integrated circuit device with transistor and diodes in accordance with the present invention. The main structure of the embodiment FIG. 4H is basically the same with that of the embodiment FIG. 2K, except that the thickness of the first intrinsic epitaxial layer 33(1) in the first diode 4 is greater than the thickness of the first intrinsic epitaxial layer 33(2) in the second diode 5. The embodiments 4G and 4H integrate a PIN diode having a thick intrinsic epitaxial layer (the first diode 4), a Schottky diode having a thin intrinsic epitaxial layer (the second diode 5), and an FET (transistor 6) on the compound semiconductor substrate 10. In the embodiments 4G and 4H, the thickness of the first intrinsic epitaxial layer 33(2) can be etched further during the fabricating processes, as a result a thinner the first intrinsic epitaxial layer 33(2) compared with the first intrinsic epitaxial layer 33(1).

As disclosed in the above description and attached drawings, the present invention can provide a compound semiconductor monolithically integrated circuit device with transistors and diodes. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A compound semiconductor monolithically integrated circuit device with transistors and diodes comprising:
    a compound semiconductor substrate;
    a transistor epitaxial structure formed on said compound semiconductor substrate, wherein said transistor epitaxial structure comprises a first part, a second part and a third part of said transistor epitaxial structure;
    a first diode formed on said first part of said transistor epitaxial structure, wherein said first diode comprises:
        a first part of an n-type doped epitaxial layer, wherein said n-type doped epitaxial layer comprises said first part of said n-type doped epitaxial layer and a second part of said n-type doped epitaxial layer, wherein said first part of said n-type doped epitaxial layer forms on said first part of said transistor epitaxial structure;
        a first part of a first intrinsic epitaxial layer, wherein said first intrinsic epitaxial layer comprises said first part of said first intrinsic epitaxial layer and a second part of said first intrinsic epitaxial layer, wherein said first part of said first intrinsic epitaxial layer forms on one portion of said first part of said n-type doped epitaxial layer;
        a first electrode of said first diode, wherein said first electrode of said first diode forms on the other portion of said first part of said n-type doped epitaxial layer; and
        a second electrode of said first diode, wherein said second electrode of said first diode forms on said first part of said first intrinsic epitaxial layer;
    a second diode formed on said second part of said transistor epitaxial structure, wherein said second diode comprises:
        said second part of said n-type doped epitaxial layer, wherein said second part of said n-type doped epitaxial layer forms on said second part of said transistor epitaxial structure;
        said second part of said first intrinsic epitaxial layer, wherein said second part of said first intrinsic epitaxial layer forms on one portion of said second part of said n-type doped epitaxial layer;
        a first electrode of said second diode, wherein said first electrode of said second diode forms on the other portion of said second part of said n-type doped epitaxial layer; and
        a second electrode of said second diode, wherein said second electrode of said second diode forms on said second part of said first intrinsic epitaxial layer; and
    a transistor upper structure formed on said third part of said transistor epitaxial structure, wherein said transistor upper structure and said third part of said transistor epitaxial structure form a transistor, wherein said transistor is an FET.

2. The compound semiconductor monolithically integrated circuit device with transistors and diodes according to claim 1, wherein said first diode forms a Schottky diode.

3. The compound semiconductor monolithically integrated circuit device with transistors and diodes according to claim 2, wherein said first diode further comprises a second intrinsic epitaxial layer, wherein said second intrinsic epitaxial layer forms on said first part of said first intrinsic epitaxial layer, and said second electrode of said first diode forms on said second intrinsic epitaxial layer.

4. The compound semiconductor monolithically integrated circuit device with transistors and diodes according to claim 3, wherein said first diode further comprises a second etch stop layer, wherein said second etch stop layer forms on said first part of said first intrinsic epitaxial layer, and said second intrinsic epitaxial layer forms on said second etch stop layer.

5. The compound semiconductor monolithically integrated circuit device with transistors and diodes according to claim 2, wherein a thickness of said first part of said first intrinsic epitaxial layer of said first diode is greater than a thickness of said second part of said first intrinsic epitaxial layer of said second diode.

6. The compound semiconductor monolithically integrated circuit device with transistors and diodes according to claim 1, wherein said first diode further comprises a first part of a p-type doped epitaxial layer, wherein said first part of said p-type doped epitaxial layer forms on said first part of said first intrinsic epitaxial layer, and said second electrode of said first diode forms on said first part of said p-type doped epitaxial layer, wherein said first diode forms a PIN diode.

7. The compound semiconductor monolithically integrated circuit device with transistors and diodes according to claim 6, wherein said second diode further comprises a second part of said p-type doped epitaxial layer, wherein said second part of said p-type doped epitaxial layer forms on said second part of said first intrinsic epitaxial layer, and said second electrode of said second diode forms on said second part of said p-type doped epitaxial layer, wherein said second diode forms a PIN diode.

8. The compound semiconductor monolithically integrated circuit device with transistors and diodes according to claim 6, wherein said first diode further comprises a second intrinsic epitaxial layer, wherein said second intrinsic epitaxial layer forms on said first part of said first intrinsic epitaxial layer, and said first part of said p-type doped epitaxial layer forms on said second intrinsic epitaxial layer.

9. The compound semiconductor monolithically integrated circuit device with transistors and diodes according to claim 8, wherein said first diode further comprises a second etch stop layer, wherein said second etch stop layer forms on said first part of said first intrinsic epitaxial layer, and said second intrinsic epitaxial layer forms on said second etch stop layer.

10. The compound semiconductor monolithically integrated circuit device with transistors and diodes according to claim 6, wherein a thickness of said first part of said first intrinsic epitaxial layer of said first diode is greater than a thickness of said second part of said first intrinsic epitaxial layer of said second diode.

11. The compound semiconductor monolithically integrated circuit device with transistors and diodes according to claim 1, wherein said second diode forms a Schottky diode.

12. The compound semiconductor monolithically integrated circuit device with transistors and diodes according to claim 11, wherein said first diode further comprises a first part of a first etch stop layer and said second diode further comprises a second part of said first etch stop layer, wherein said first part of said first etch stop layer forms on said first part of said n-type doped epitaxial layer, and said first part of said first intrinsic epitaxial layer forms on said first part of said first etch stop layer, wherein said second part of said first etch stop layer forms on said second part of said n-type doped epitaxial layer, and said second part of said first intrinsic epitaxial layer forms on said second part of said first etch stop layer.

13. The compound semiconductor monolithically integrated circuit device with transistors and diodes according to claim 11, wherein said first diode further comprises a first part of a bottom etch stop layer and said second diode further comprises a second part of said bottom etch stop layer, wherein said first part of said bottom etch stop layer forms on said first part of said transistor epitaxial structure, and said first part of said n-type doped epitaxial layer forms on said first part of said bottom etch stop layer, wherein said second part of said bottom etch stop layer forms on said second part of said transistor epitaxial structure, and said second part of said n-type doped epitaxial layer forms on said second part of said bottom etch stop layer.

14. The compound semiconductor monolithically integrated circuit device with transistors and diodes according to claim 1, wherein said first diode further comprises a first part of a first etch stop layer and said second diode further comprises a second part of said first etch stop layer, wherein said first part of said first etch stop layer forms on said first part of said n-type doped epitaxial layer, and said first part of said first intrinsic epitaxial layer forms on said first part of said first etch stop layer, wherein said second part of said first etch stop layer forms on said second part of said n-type doped epitaxial layer, and said second part of said first intrinsic epitaxial layer forms on said second part of said first etch stop layer.

15. The compound semiconductor monolithically integrated circuit device with transistors and diodes according to claim 1, wherein said first diode further comprises a first part of a bottom etch stop layer and said second diode further comprises a second part of said bottom etch stop layer, wherein said first part of said bottom etch stop layer forms on said first part of said transistor epitaxial structure, and said first part of said n-type doped epitaxial layer forms on said first part of said bottom etch stop layer, wherein said second part of said bottom etch stop layer forms on said second part of said transistor epitaxial structure, and said second part of said n-type doped epitaxial layer forms on said second part of said bottom etch stop layer.

16. The compound semiconductor monolithically integrated circuit device with transistors and diodes according to claim 1, wherein said n-type doped epitaxial layer further comprises a third part of said n-type doped epitaxial layer; wherein said transistor epitaxial structure comprises a buffer layer, a channel layer and a Schottky barrier layer; wherein said buffer layer forms on said compound semiconductor substrate, said channel layer forms on said buffer layer, said Schottky barrier layer forms on said channel layer, said transistor upper structure forms on said Schottky barrier layer; wherein said transistor upper structure comprises said third part of said n-type doped epitaxial layer, a gate electrode, a source electrode and a drain electrode; wherein said third part of said n-type doped epitaxial layer forms on said Schottky barrier layer; wherein said source electrode forms on one portion of said third part of said n-type doped epitaxial layer; while said drain electrode forms on the other portion of said third part of said n-type doped epitaxial layer; wherein said transistor further comprises a gate recess located between said source electrode and said drain electrode; wherein a bottom of said gate recess is defined by said Schottky barrier layer, a surrounding of said gate recess is defined by said third part of said n-type doped epitaxial layer; wherein said gate electrode forms on said Schottky barrier layer within said gate recess.

17. The compound semiconductor monolithically integrated circuit device with transistors and diodes according to claim 16, wherein said first diode further comprises a first part of a bottom etch stop layer, said second diode further comprises a second part of said bottom etch stop layer, and said transistor upper structure further comprises a third part of said bottom etch stop layer, wherein said first part of said bottom etch stop layer, said second part of said bottom etch stop layer, and said third part of said bottom etch stop layer form on said Schottky barrier layer, and said first part of said n-type doped epitaxial layer forms on said first part of said bottom etch stop layer, said second part of said n-type doped epitaxial layer forms on said second part of said bottom etch stop layer, said third part of said n-type doped epitaxial layer forms on said third part of said bottom etch stop layer.

18. The compound semiconductor monolithically integrated circuit device with transistors and diodes according to claim 1, wherein said n-type doped epitaxial layer further comprises a third part of said n-type doped epitaxial layer; wherein said transistor epitaxial structure comprises a buffer layer, a channel layer, a Schottky barrier layer and a first cap layer; wherein said buffer layer forms on said compound semiconductor substrate, said channel layer forms on said buffer layer, said Schottky barrier layer forms on said channel layer, said first cap layer forms on said Schottky barrier layer, said transistor upper structure forms on said first cap layer; wherein said transistor upper structure comprises said third part of said n-type doped epitaxial layer, a gate electrode, a source electrode and a drain electrode; wherein said third part of said n-type doped epitaxial layer forms on said first cap layer; wherein said source electrode forms on one portion of said third part of said n-type doped epitaxial layer; while said drain electrode forms on the other portion of said third part of said n-type doped epitaxial layer; wherein said transistor further comprises a gate recess located between said source electrode and said drain electrode; wherein a bottom of said gate recess is defined by said Schottky barrier layer, a surrounding of said gate recess is defined by said third part of said n-type doped epitaxial layer and said first cap layer; wherein said gate electrode forms on said Schottky barrier layer within said gate recess.

19. The compound semiconductor monolithically integrated circuit device with transistors and diodes according to claim 18, wherein said first diode further comprises a first part of a bottom etch stop layer, said second diode further comprises a second part of said bottom etch stop layer, and said transistor upper structure further comprises a third part of said bottom etch stop layer, wherein said first part of said bottom etch stop layer, said second part of said bottom etch stop layer, and said third part of said bottom etch stop layer form on said first cap layer, and said first part of said n-type doped epitaxial layer forms on said first part of said bottom etch stop layer, said second part of said n-type doped epitaxial layer forms on said second part of said bottom etch stop layer, said third part of said n-type doped epitaxial layer forms on said third part of said bottom etch stop layer.

20. The compound semiconductor monolithically integrated circuit device with transistors and diodes according to claim 18, wherein said transistor epitaxial structure further comprises a first cap etch stop layer, wherein said first cap etch stop layer forms on said Schottky barrier layer, and said first cap layer forms on said first cap etch stop layer.

21. The compound semiconductor monolithically integrated circuit device with transistors and diodes according to claim 1, wherein said transistor epitaxial structure comprises a buffer layer, a channel layer, a Schottky barrier layer and a first cap layer; wherein said buffer layer forms on said compound semiconductor substrate, said channel layer forms on said buffer layer, said Schottky barrier layer forms on said channel layer, said first cap layer forms on said Schottky barrier layer, said transistor upper structure forms on said first cap layer; wherein said transistor upper structure comprises a gate electrode, a source electrode and a drain electrode; wherein said source electrode forms on one portion of said first cap layer; while said drain electrode forms on the other portion of said first cap layer; wherein said transistor further comprises a gate recess located between said source electrode and said drain electrode; wherein a bottom of said gate recess is defined by said Schottky barrier layer, a surrounding of said gate recess is defined by said first cap layer; wherein said gate electrode forms on said Schottky barrier layer within said gate recess.

22. The compound semiconductor monolithically integrated circuit device with transistors and diodes according to claim 21, wherein said transistor epitaxial structure further comprises a first cap etch stop layer, wherein said first cap etch stop layer forms on said Schottky barrier layer, and said first cap layer forms on said first cap etch stop layer.

23. The compound semiconductor monolithically integrated circuit device with transistors and diodes according to claim 21, wherein said transistor epitaxial structure further comprises a second cap layer, wherein said second cap layer forms on said first cap layer; wherein said transistor upper structure forms on said second cap layer; wherein said surrounding of said gate recess is defined by said second cap layer and said first cap layer; wherein said source electrode and said drain electrode form on said second cap layer.

24. The compound semiconductor monolithically integrated circuit device with transistors and diodes according to claim 23, wherein said transistor epitaxial structure further comprises a second cap etch stop layer, wherein said second cap etch stop layer forms on said first cap layer, and said second cap layer forms on said second cap etch stop layer.

25. The compound semiconductor monolithically integrated circuit device with transistors and diodes according to claim 1, wherein said compound semiconductor substrate is GaAs or InP.

* * * * *